(12) United States Patent
Nakamura et al.

(10) Patent No.: US 7,224,240 B2
(45) Date of Patent: May 29, 2007

(54) BALANCED HIGH-FREQUENCY FILTER, ANTENNA DUPLEXER, BALANCED HIGH-FREQUENCY CIRCUIT AND COMMUNICATION APPARATUS

(75) Inventors: Hiroyuki Nakamura, Osaka (JP); Toshifumi Nakatani, Osaka (JP); Toshio Ishizaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 86 days.

(21) Appl. No.: 11/078,793

(22) Filed: Mar. 11, 2005

(65) Prior Publication Data

US 2005/0242900 A1 Nov. 3, 2005

Related U.S. Application Data

(63) Continuation-in-part of application No. 10/390,287, filed on Mar. 17, 2003, now Pat. No. 6,900,705.

(30) Foreign Application Priority Data

Mar. 15, 2002 (JP) .............................. 2002-071861
Oct. 29, 2004 (JP) .............................. 2004-315448

(51) Int. Cl.
*H03H 9/68* (2006.01)
*H03H 7/42* (2006.01)
(52) U.S. Cl. ........................................ 333/26; 333/204
(58) Field of Classification Search ................ 333/25, 333/26, 193, 195
See application file for complete search history.

(56) References Cited

U.S. PATENT DOCUMENTS

| 2,165,086 A | 7/1939 | Alford |
| 3,761,831 A | 9/1973 | Foerster |
| 5,077,543 A | 12/1991 | Carlile |
| 5,633,614 A | 5/1997 | Decramer |
| 5,809,409 A | 9/1998 | Itoh et al. |
| 5,949,299 A * | 9/1999 | Harada ........................ 333/25 |
| 6,573,802 B2 | 6/2003 | Straub |
| 6,713,940 B2 | 3/2004 | Takamine |

(Continued)

FOREIGN PATENT DOCUMENTS

DE        902 397 C      1/1954

(Continued)

OTHER PUBLICATIONS

European Search Report for EP 03 00 5837, dated Jul. 18, 2003.

(Continued)

*Primary Examiner*—Dean Takaoka
(74) *Attorney, Agent, or Firm*—RatnerPrestia

(57) ABSTRACT

With an antenna duplexer having balanced terminals, there has been a problem that the amount of leakage of common-mode signal components in the balanced terminals is large. A balanced high-frequency filter designed to solve this problem comprises a balanced high-frequency element and a phase-shifting circuit which includes a transmission line and placed between output terminals, and which is series resonance circuit having a length set to $\lambda_T/2$ ($\lambda_T$: the wavelength at a frequency in a transmission frequency band) and capable of resonating with common-mode signal components at a predetermined frequency.

34 Claims, 44 Drawing Sheets

U.S. PATENT DOCUMENTS

| | | |
|---|---|---|
| 6,788,164 B2 * | 9/2004 | Maekawa et al. ............. 333/26 |
| 2004/0077325 A1 | 4/2004 | Takamine |
| 2004/0080383 A1 | 4/2004 | Takamine |
| 2004/0180633 A1 | 9/2004 | Nakatani et al. |

FOREIGN PATENT DOCUMENTS

| | | |
|---|---|---|
| EP | 1 111 777 A | 6/2001 |
| JP | 06-268451 | 9/1994 |
| JP | 2001-144574 | 5/2001 |
| JP | 2001-308672 | 11/2001 |
| JP | 2002-368641 | 12/2002 |
| JP | 2004-112594 | 4/2004 |
| JP | 2004-166213 | 6/2004 |
| JP | 2004-215244 | 7/2004 |
| WO | WO 02/23719 A1 | 3/2002 |

OTHER PUBLICATIONS

Van B Roberts W, "A Neglected Form of Balun", QST Amateur Radio, American Radio Relay League Inc. Newington, US, vol. 53, No. 4, Apr. 1, 1969, p. 48.

Japanese Office Action for Application No. 2003-066389, dated Aug. 10, 2004.

\* cited by examiner

Fig. 3 (a) PRIOR ART
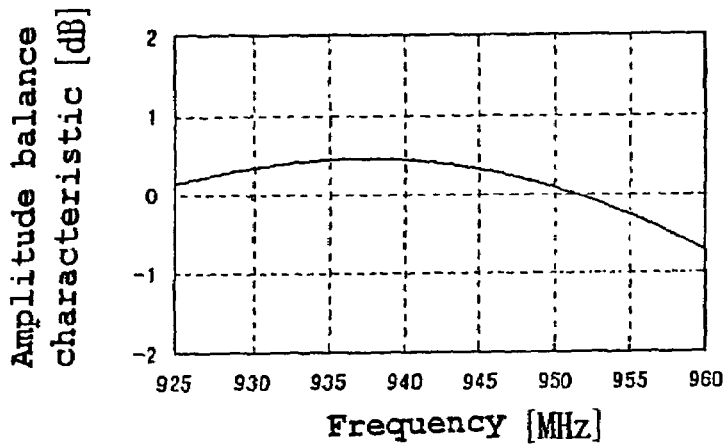
Fig. 3 (b) PRIOR ART
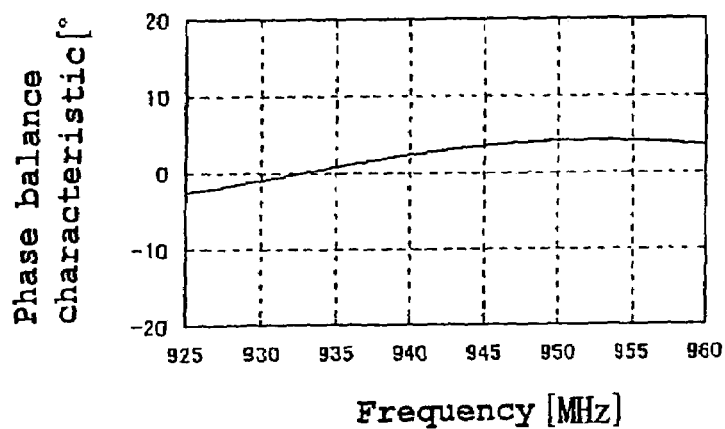
Fig. 4
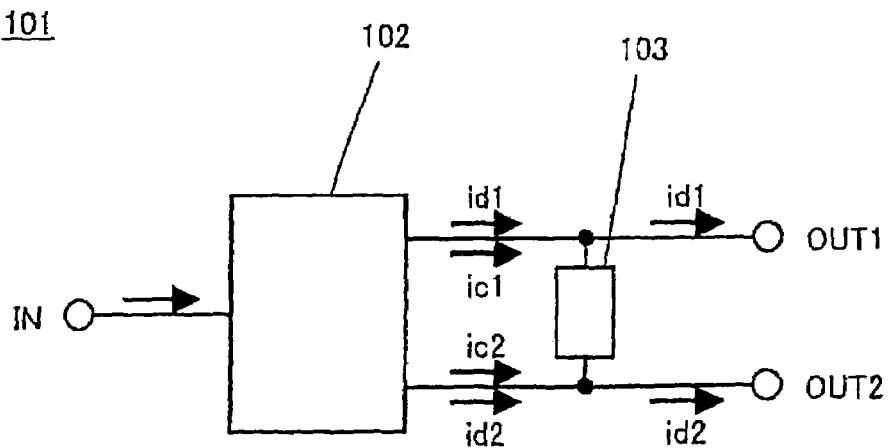

Differential-mode

Common-mode

Differential-mode

Common-mode

Differential-mode

Common-mode

Differential-mode

Common-mode

Fig. 29 (a) PRIOR ART
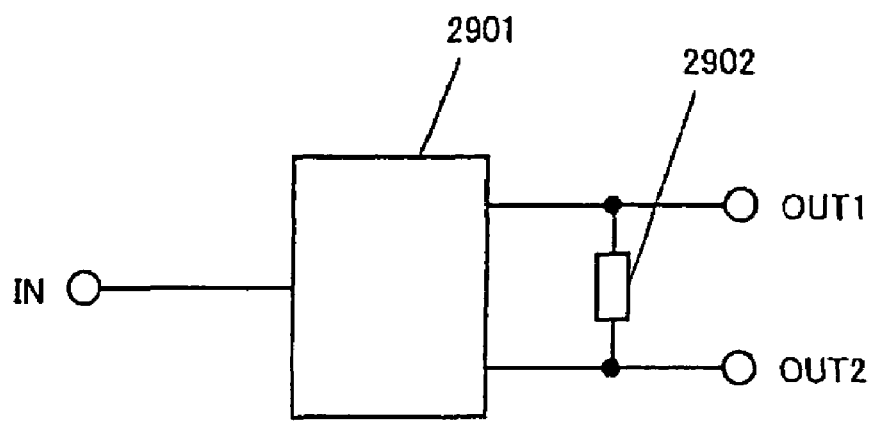
Fig. 29 (b) PRIOR ART
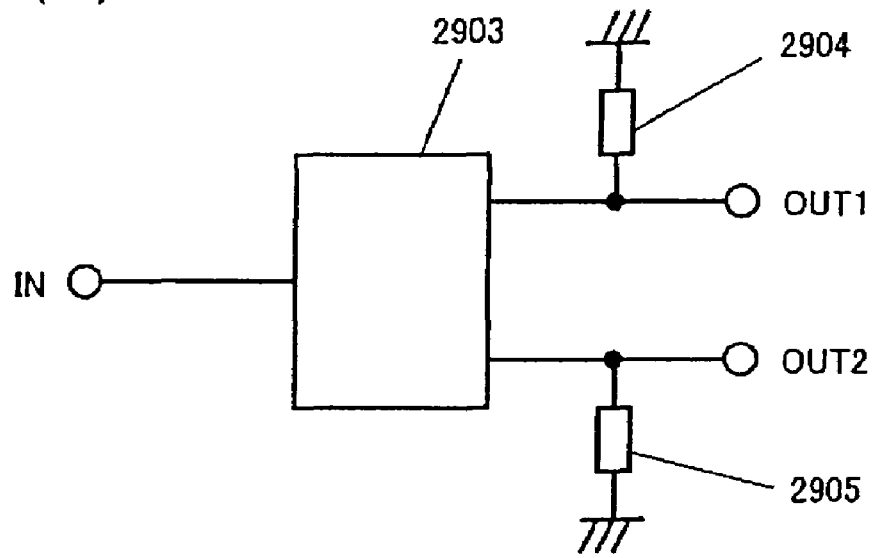

Fig. 32 (a) PRIOR ART
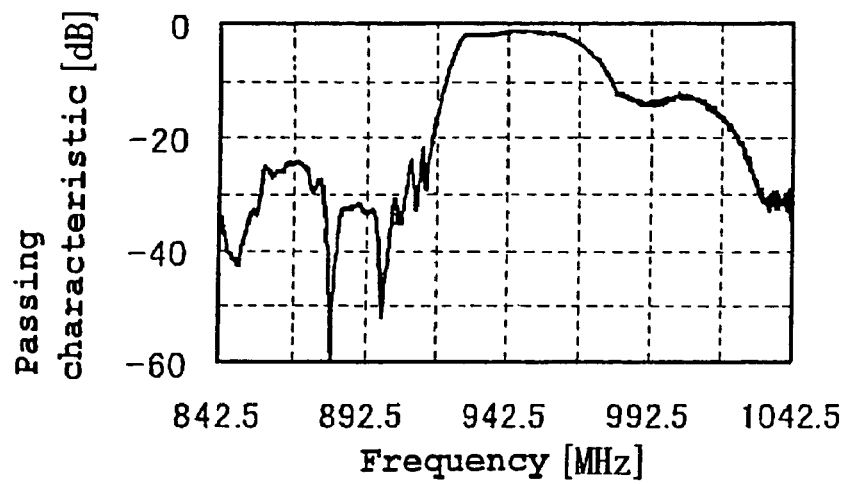
Fig. 32 (b) PRIOR ART
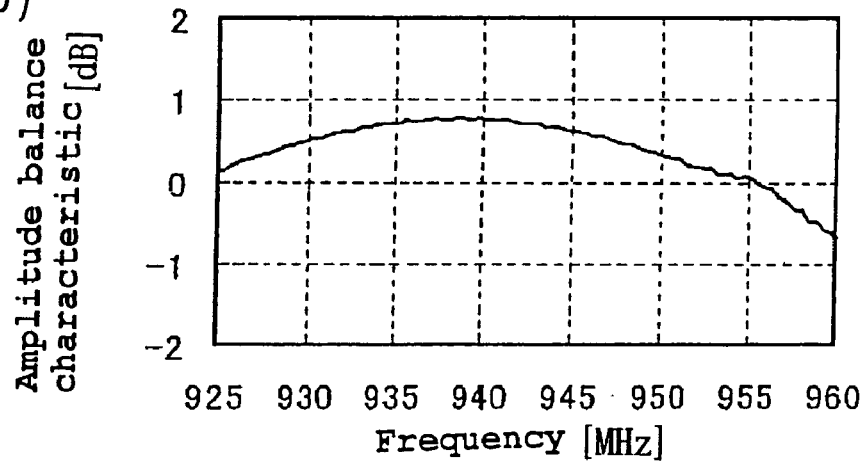
Fig. 32 (c) PRIOR ART
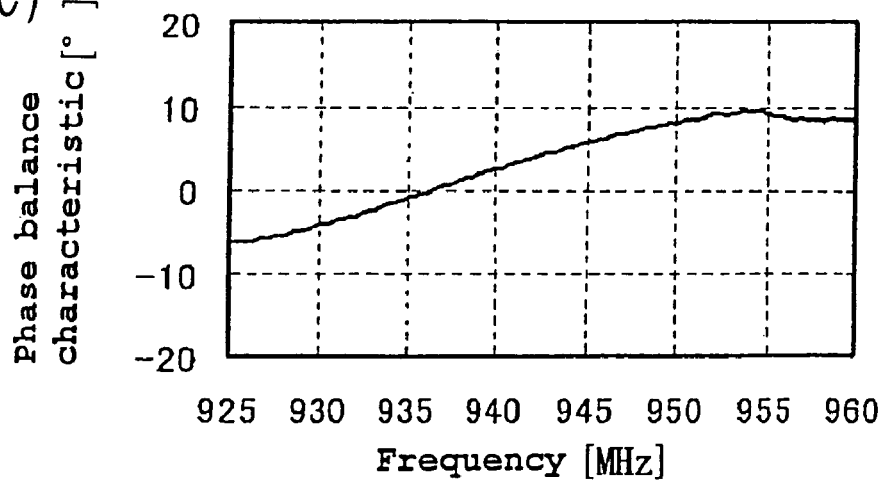

US 7,224,240 B2

BALANCED HIGH-FREQUENCY FILTER, ANTENNA DUPLEXER, BALANCED HIGH-FREQUENCY CIRCUIT AND COMMUNICATION APPARATUS

This application is a continuation-In-Part of U.S. patent application Ser. No 10/390,287, filed Mar. 17, 2003 now U.S. Pat. No. 6,900,705.

BACKGROUND OF THE INVENTION

1. Field of the Invention

The present invention relates to a balanced high-frequency filter, an antenna duplexer, a balanced high-frequency circuit and a communication apparatus.

2. Related Art of the Invention

In recent years, with the development of mobile communications, there have been expectations for improvements in performance and reductions in size of devices to be used for mobile communication. As a filter for use in a radio frequency (RF) stage, surface acoustic wave filters have been widely used. Also, in recent years, there have been expectations for filters using film bulk acoustic resonators (FBAR). Balancing of such filters and semiconductor elements used in RF stages has been pursued for the purpose of improving noise characteristics, for example, in terms of crosstalk between devices and there is a demand for improved balance characteristics.

A conventional balanced high-frequency device is described below. FIG. 28 shows a configuration of a conventional balanced high-frequency device 2801. The balanced high-frequency device 2801 is constituted by an input terminal IN serving as a unbalanced input/output terminal and output terminals OUT1 and OUT2 serving as balanced input/output terminals.

Moreover, in the case of a balanced high-frequency device, impedance matching is necessary. FIGS. 29(a) and 29(b) shows configurations of conventional balanced high-frequency devices respectively having a matching circuit. In FIG. 29(a), a balanced high-frequency device 2901 is constituted by an input terminal IN serving as an unbalanced input/output terminal and output terminals OUT1 and OUT2 serving as balanced input/output terminals. Moreover, a matching circuit 2902 is connected between the output terminals OUT1 and OUT2. Moreover, in FIG. 29(b), a balanced high-frequency device 2903 is constituted by an input terminal IN serving as an unbalanced input/output terminal and output terminals OUT1 and OUT2 serving as balanced input/output terminals. Furthermore, matching circuits 2904 and 2905 are connected between the output terminals OUT1 and OUT2 and ground planes respectively. This type of the matching circuit is used to match a balanced high-frequency device with the characteristic impedance of a balanced input/output terminal.

As an example of the above balanced high-frequency device, a conventional surface acoustic wave filter is described below. FIG. 30 shows a block diagram of an surface acoustic wave filter 3001 having a balanced input/output terminal. In FIG. 30, the surface acoustic wave filter 3001 is constituted on a piezoelectric substrate 3002 by first, second, and third inter-digital transducer electrodes (hereafter respectively referred to as IDT electrode) 3003, 3004, and 3005 and first and second reflector electrodes 3006 and 3007. One-hand electrode finger of the first IDT electrode 3003 is connected to an output terminal OUT1 and the other-hand electrode finger of the first IDT electrode 3003 is connected to an output terminal OUT2. Moreover, one-hand electrode fingers of the second and third IDT electrodes 3004 and 3005 are connected to an input terminal IN and the other-hand electrode fingers of the electrodes 3004 and 3005 are grounded. By using the above configuration, it is possible to realize an surface acoustic wave filter having an unbalanced-balanced input/output terminal. Moreover, in the case of the surface acoustic wave filter in FIG. 30, impedances of the input and output terminals are respectively designed as 50 Ω.

Moreover, a conventional surface acoustic wave filter is described below as an example of a balanced high-frequency device having a matching circuit. FIG. 31 shows a block diagram of surface acoustic wave filter 3101 having a matching circuit. In FIG. 31, the surface acoustic wave filter 3101 is constituted on a piezoelectric substrate 3102 by first, second, and third inter-digital transducer electrodes (hereafter respectively referred to as IDT electrode) 3103, 3104, and 3105 and first and second reflector electrodes 3106 and 3107. The first IDT electrode 3103 is divided into two divided IDT electrodes. One electrode finger of a first divided IDT electrode 3108 is connected to an output terminal OUT1, one electrode finger of a second divided IDT electrode 3109 is connected to an output terminal OUT2, and the other-hand electrode fingers of the first and second divided IDT electrodes are electrically connected. Moreover, one-hand electrode fingers of the second and third IDT electrodes 3104 and 3105 are connected to an input terminal IN and the other-hand electrode fingers of the electrodes 3104 and 3105 are grounded. Furthermore, an inductor 3110 is connected between output terminals as a matching circuit. By using the above configuration, it is possible to realize surface acoustic wave filter having an unbalanced-balanced input/output terminal. Furthermore, in the case of the surface acoustic wave filter in FIG. 31, impedances of input and output terminals are designed as 50 Ω for the input side and as 150 Ω for the output side. Therefore, the filter has an impedance conversion function.

FIGS. 32(a) to 32(c) show characteristic diagrams of a conventional surface acoustic wave filter of a 900-MHz band shown in FIG. 30. In FIGS. 32(a) to 32(c), FIG. 32(a) shows a passing characteristic, FIG. 32(b) shows an amplitude balance-characteristic in a pass band (from 925 up to 960 MHz), and FIG. 32(c) shows a phase balance-characteristic in a pass band. From FIG. 32, it is found that the amplitude balance-characteristic greatly deteriorates from −0.67 dB to +0.77 dB and the phase balance-characteristic greatly deteriorates from −6.3° to +9.4° in each pass band.

In this case, the amplitude balance-characteristic denotes the difference between the signal amplitude of the input terminal IN and output terminal OUT1 and the signal amplitude of the input terminal IN and output terminal OUT2. When the difference becomes zero, the balance-characteristic does not deteriorate. Moreover, the phase balance-characteristic denotes a shift of the difference between the signal phase of the input terminal IN and output terminal OUT1 and the signal phase of the input terminal IN and output terminal OUT2 from 180°. When the difference becomes zero, the balance-characteristic does not deteriorate.

With the above-described balanced high-frequency device and the surface acoustic wave filter described as an example of the balanced high-frequency device, however, there has been a problem that a deterioration in balance characteristics considered one of important electrical characteristics of the device is large.

Also, the balanced high-frequency device in the conventional art is a phase-shifting circuit used to improve the balance characteristics by considering the characteristics in the pass band, and the characteristics outside the pass band have not been taken into consideration. In a case where a balanced high-frequency element provided as the balanced high-frequency device is connected to the input side of a semiconductor device, not only the characteristics in the pass band but also the characteristics outside the pass band are important. In a case where a balanced high-frequency element is used for a receiving filter in particular, characteristics in a transmission frequency band are important as well as those in a reception frequency band. With the conventional balanced high-frequency device, however, there is a problem that the amount of leakage of common-mode signal components to the balanced output terminals is large.

SUMMARY OF THE INVENTION

In view of the above-described problems of the conventional art, an object of the present invention is to provide a balanced high-frequency filter and an antenna duplexer having reduced common-mode signal components in a transmission frequency band. Another object of the present invention is to provide a balanced high-frequency circuit and a communication apparatus using such a balanced high-frequency filter or an antenna duplexer. Still another object of the present invention is to provide a balanced high-frequency circuit in which common-mode signal components in a transmission frequency band are reduced.

In order to achieve the above object, the $1^{st}$ aspect of the present invention is a balanced high-frequency filter comprising:

a balanced high-frequency element having at least one balanced terminal; and a phase-shifting circuit, wherein the phase-shifting circuit is a series resonance circuit which is electrically connected between the balanced terminals and which resonates with common-mode signal components at a predetermined frequency;

a resonance frequency of the series resonance circuit is set in a second frequency band;

a first frequency band is a pass band of the balanced high-frequency element; and the second frequency band is an attenuation band of the balanced high-frequency element.

The $2^{nd}$ aspect of the present invention is the balanced high-frequency filter according to the $1^{st}$ aspect of the present invention, wherein the first frequency band is a reception frequency band, and the second frequency band is a transmission frequency band.

The $3^{rd}$ aspect of the present invention is the balanced high-frequency filter according to the $1^{st}$ or the $2^{nd}$ aspect of the present invention, wherein the phase-shifting circuit has a transmission line which has a length equal to about ½ of a wavelength in the second frequency band; and the phase-shifting circuit is connected between the balanced terminals.

The $4^{th}$ aspect of the present invention is the balanced high-frequency filter according to the $3^{rd}$ aspect of the present invention, wherein the phase-shifting circuit has at least two transmission lines;

one of the transmission lines has a length equal to about ½ of a wavelength in the second frequency band;

the other of the transmission lines differs in length from said one of the transmission lines; and the phase-shifting circuit is connected between the balanced terminals.

The $5^{th}$ aspect of the present invention is the balanced high-frequency filter according to the $1^{st}$ or the $2^{nd}$ aspect of the present invention, wherein the phase-shifting circuit has at least first, second and third impedance elements;

the first impedance element and the second impedance element are connected in series between the balanced terminals;

a connection point between the first impedance element and the second impedance element is grounded through the third impedance element;

the first impedance element and the third impedance element form a series resonance circuit; and the second impedance element and the third impedance element form a series resonance circuit.

The $6^{th}$ aspect of the present invention is the balanced high-frequency filter according to the $5^{th}$ aspect of the present invention, wherein each of the first and second impedance elements is a capacitor, and the third impedance element is an inductor.

The $7^{th}$ aspect of the present invention is the balanced high-frequency filter according to the $5^{th}$ aspect of the present invention, wherein each of the first and second impedance elements is an inductor, and the third impedance element is a capacitor.

The $8^{th}$ aspect of the present invention is the balanced high-frequency filter according to the $6^{th}$ or the $7^{th}$ aspect of the present invention, wherein the impedance of each of the first and second impedance elements in the first frequency band is set so that a value of the first or second impedance element normalized on a characteristic impedance value of one of the balanced terminals is equal to or larger than 3.

The $9^{th}$ aspect of the present invention is the balanced high-frequency filter according to the $1^{st}$ or the $2^{nd}$ aspect of the present invention, wherein the balanced high-frequency element is constituted by a surface acoustic wave filter.

The $10^{th}$ aspect of the present invention is the balanced high-frequency filter according to the $1^{st}$ or the $2^{nd}$ aspect of the present invention, wherein the balanced high-frequency element is constituted by a filter using an FBAR.

The $11^{th}$ aspect of the present invention is the balanced high-frequency filter according to the $1^{st}$ or the $2^{nd}$ aspect of the present invention, wherein the balanced high-frequency filter is connected to an input side of a low-noise amplifier having balanced terminals.

The $12^{th}$ aspect of the present invention is the balanced high-frequency filter according to the $1^{st}$ or the $2^{nd}$ aspect of the present invention, wherein the balanced high-frequency filter is connected to an input side of a mixer having balanced terminals.

The $13^{th}$ aspect of the present invention is an antenna duplexer comprising the balanced high-frequency filter according to the $1^{st}$ or the $2^{nd}$ aspect of the present invention.

The $14^{th}$ aspect of the present invention is an antenna duplexer according to the $13^{th}$ aspect of the present invention, wherein the balanced high-frequency filter is a receiving filter in the antenna duplexer;

the first frequency band is a reception frequency band in the antenna duplexer; and the second frequency band is a transmission frequency band in the antenna duplexer.

The $15^{th}$ aspect of the present invention is an antenna duplexer according to the $14^{th}$ aspect of the present invention, wherein the antenna duplexer is connected to an input side of a low-noise amplifier having balanced terminals.

The 16th aspect of the present invention is a balanced high-frequency circuit comprising:

a low-noise amplifier having balanced terminals;
a mixer having balanced terminals; and
a phase-shifting circuit,
wherein the phase-shifting circuit is a series resonance circuit which is electrically connected between the balanced terminals connecting the low-noise amplifier and the mixer to each other, and which resonates with common-mode signal components at a predetermined frequency;
a resonance frequency of the series resonance circuit is set in a second frequency band;
a first frequency band is the frequency band of desired waves; and
the second frequency band is the frequency band of interference waves.

The 17th aspect of the present invention is the balanced high-frequency circuit according to the 16th aspect of the present invention, wherein the first frequency band is a reception frequency band, and the second frequency band is a transmission frequency band.

The 18th aspect of the present invention is the balanced high-frequency circuit according to the 16th or the 17th aspect of the present invention, wherein the phase-shifting circuit has a transmission line which has a length equal to about ½ of a wavelength in the second frequency band; and
the phase-shifting circuit is connected between the balanced terminals.

The 19th aspect of the present invention is the balanced high-frequency circuit according to the 16th or the 17th aspect of the present invention, wherein the phase-shifting circuit has at least first, second and third impedance elements;
the first impedance element and the second impedance element are connected in series between the balanced terminals;
a connection point between the first impedance element and the second impedance element is grounded through the third impedance element;
the first impedance element and the third impedance element form a series resonance circuit; and
the second impedance element and the third impedance element form a series resonance circuit.

The 20th aspect of the present invention is the balanced high-frequency circuit according to the 19th aspect of the present invention, wherein each of the first and second impedance elements is a capacitor, and the third impedance element is an inductor.

The 21st aspect of the present invention is the balanced high-frequency circuit according to the 19th aspect of the present invention, wherein each of the first and second impedance elements is an inductor, and the third impedance element is a capacitor.

The 22nd aspect of the present invention is the balanced high-frequency circuit according to the 20th or the 21st aspect of the present invention, wherein the impedance of each of the first and second impedance elements in the first frequency band is set so that a value of the first or second impedance element normalized on a characteristic impedance value of one of the balanced terminals is equal to or larger than 3.

The 23rd aspect of the present invention is a balanced high-frequency circuit comprising:

a circuit board having balanced lines; and
a phase-shifting circuit,
wherein the phase-shifting circuit is mounted on the circuit board;
the phase-shifting circuit is a series resonance circuit which is electrically connected between the balanced terminals, and which resonates with common-mode signal components at a predetermined frequency;
a resonance frequency of the series resonance circuit is set in a second frequency band;
a first frequency band is the frequency band of desired waves; and
the second frequency band is the frequency band of interference waves.

The 24th aspect of the present invention is the balanced high-frequency circuit according to the 23rd aspect of the present invention, wherein the first frequency band is a reception frequency band, and the second frequency band is a transmission frequency band.

The 25th aspect of the present invention is the balanced high-frequency circuit according to the 23rd or the 24th aspect of the present invention, wherein the phase-shifting circuit has a transmission line, the transmission line has a length equal to about ½ of a wavelength in the first frequency band; and
the phase-shifting circuit is connected between the balanced terminals.

The 26th aspect of the present invention is the balanced high-frequency circuit according to the 23rd or the 24th aspect of the present invention, wherein the phase-shifting circuit has at least first, second and third impedance elements;
the first impedance element and the second impedance element are connected in series between the balanced terminals;
a connection point between the first impedance element and the second impedance element is grounded through the third impedance element;
the first impedance element and the third impedance element form a series resonance circuit; and
the second impedance element and the third impedance element form a series resonance circuit.

The 27th aspect of the present invention is the balanced high-frequency circuit according to the 26th aspect of the present invention, wherein each of the first and second impedance elements is a capacitor, and the third impedance element is an inductor.

The 28th aspect of the present invention is the balanced high-frequency circuit according to the 26th aspect of the present invention, wherein each of the first and second impedance elements is an inductor, and the third impedance element is a capacitor.

The 29th aspect of the present invention is the balanced high-frequency circuit according to the 27th or the 28th aspect of the present invention, wherein the impedance of each of the first and second impedance elements in the first frequency band is set so that a value of the first or second impedance element normalized on a characteristic impedance value of one of the balanced terminals is equal to or larger than 3.

The 30th aspect of the present invention is q communication apparatus using the balanced high-frequency filter according to the 1st or the 2nd aspect of the present invention.

The 31st aspect of the present invention is a communication apparatus using the antenna duplexer according to the 13th aspect of the present invention.

The 32nd aspect of the present invention is a communication apparatus using the antenna duplexer according to the 14th aspect of the present invention.

The 33$^{rd}$ aspect of the present invention is a communication apparatus using the balanced high-frequency circuit according to the 16$^{th}$ or the 17$^{th}$ aspect of the present invention.

The 34$^{th}$ aspect of the present invention is a communication apparatus using the balanced high-frequency circuit according to the 23$^{rd}$ or the 24$^{th}$ aspect of the present invention.

BRIEF DESCRIPTION OF THE DRAWINGS

FIGS. 3(a) and 3(b) are characteristic diagrams of the balance-characteristic analysis of a conventional surface acoustic wave filter, in which FIG. 3(a) is an amplitude balance-characteristic diagram and FIG. 3(b) is a phase balance-characteristic diagram.

FIG. 4 is an illustration for explaining operations of the balanced high-frequency device in the embodiment 1 of the present invention.

FIG. 29(a) and 29(b) are block diagrams including a matching circuit of a conventional balanced high-frequency device, in which FIG. 29(a) is a block diagram when the matching circuit is constituted by one impedance element and FIG. 29(b) is a block diagram when the matching circuit is constituted by two impedance elements.

FIG. 32(*a*) is a passing characteristic diagram of a conventional surface acoustic wave filter, FIG. 32(*b*) is an amplitude characteristic diagram of a conventional surface acoustic wave filter, and FIG. 32(*c*) is a phase balance-characteristic diagram of a conventional surface acoustic wave filter.

FIG. 34(*b*) is a diagram showing a characteristic of common-mode signal components in a conventional balanced high-frequency device.

FIG. 35(*b*) is a diagram showing an amplitude balance characteristic of the balanced high-frequency filter in embodiment 12 of the present invention.

FIG. 35(*c*) is a diagram showing a phase balance characteristic of the balanced high-frequency filter in embodiment 12 of the present invention.

FIG. 38(*b*) is a diagram showing the configuration of different connections in the balanced high-frequency filter in embodiment 12 of the present invention.

FIG. 40(*b*) is a diagram showing a characteristic of common-mode signal components in a conventional balanced high-frequency device.

FIG. 41(*b*) is a diagram showing an amplitude balance characteristic of the balanced high-frequency filter in embodiment 13 of the present invention.

FIG. 41(*c*) is a diagram showing a phase balance characteristic of the balanced high-frequency filter in embodiment 13 of the present invention.

FIG. 43(*b*) is a diagram showing the relationship between loss and a normalized impedance in the case of use of the phase-shifting circuit shown in FIG. 42.

FIG. 46(*b*) is a diagram showing another configuration of balanced high-frequency circuit in embodiment 15 of the present invention.

DESCRIPTION OF SYMBOLS

Figure 1:
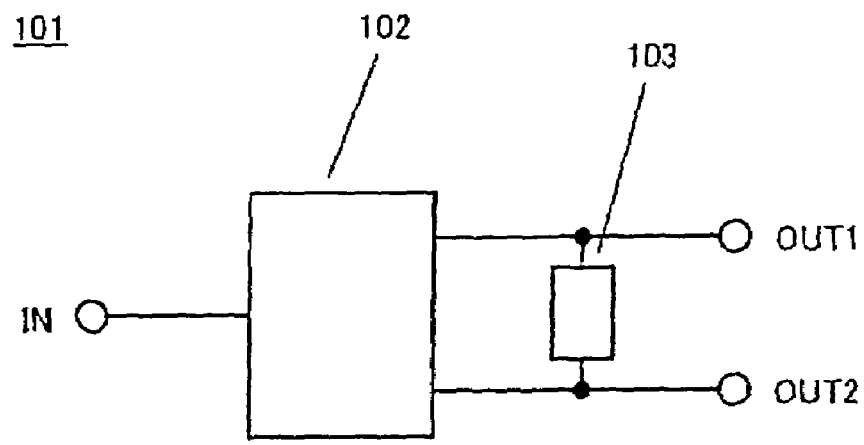
FIG. 1 is a block diagram of a balanced high-frequency device in the embodiment 1 of the present invention.

101 Balanced high-frequency device
102 Balanced device
103 Phase circuit
201 Surface acoustic wave filter
202 Ideal surface acoustic wave filter
203, 204 Capacity component
501 Balanced high-frequency device
502 Balanced device
503, 504 Phase circuit
601 Balanced high-frequency device
602 Balanced device
603 Phase circuit
604 Transmission line
801 Balanced high-frequency device
802 Balanced device
803 Phase circuit
804, 805, 806 Impedance element
901 Phase circuit
902, 903 Capacitor
904 Inductor
905 Virtual ground point
1001 Phase circuit
1002, 1003 Capacitor
1004 Capacitor
1005 Virtual ground point
1101 Balanced high-frequency device
1102 Balanced device
1103 Phase circuit
1104, 1105, 1106 Impedance element
1201 Phase circuit
1202, 1203 Inductor
1204 Capacitor
1205 Connection point
1301 Phase circuit
1302, 1303 Capacitor
1304 Inductor
1305 Connection point
1401 Balanced high-frequency device
1402 Surface acoustic wave filter
1403 Phase circuit
1404 Piezoelectric substrate
1405 First IDT electrode
1406 Second IDT electrode
1407 Third IDT electrode
1408 First reflector electrode
1409 Second reflector electrode 1601, 1801, 2001 Maximum value of amplitude balance-characteristic deterioration of conventional surface acoustic wave filter
1602, 1802, 2002 Minimum value of amplitude balance-characteristic deterioration of conventional surface acoustic wave filter
1603, 1803, 2003 Maximum value of phase balance-characteristic deterioration of conventional surface acoustic wave filter
1604, 1804, 2004 Minimum value of phase balance-characteristic deterioration of conventional surface acoustic wave filter
2101, 2102 Region showing vicinity of band pass frequency
2201 Phase circuit
2202 Capacitor
2301 Balanced high-frequency device
2302 Phase circuit
2304, 2305 Capacitor
2306 Inductor
2307 Inductor serving as matching circuit
2308 Virtual ground point
2309 Combined inductor
2401 Balanced high-frequency device
2402 Surface acoustic wave filter
2403 Phase circuit
2404 Piezoelectric substrate
2405 First IDT electrode
2406 Second IDT electrode
2407 Third IDT electrode
2408 First reflector electrode
2409 Second reflector electrode
2410 First divided IDT electrode
2411 Second divided IDT electrode
2501 Balanced high-frequency device
2502 Surface acoustic wave filter
2503 Phase circuit
2504 Piezoelectric substrate
2505 First IDT electrode
2506 Second IDT electrode
2507 Third IDT electrode
2508 First reflector electrode
2509 Second reflector electrode
2601 Balanced high-frequency device
2602 Semiconductor device
2603 Phase circuit
2604a, 2604b, 2605a, 2605b Bipolar transistor 2606a, 2606b Inductor
2607 DC-cut capacitor
2608 Bypass capacitor
2609a, 2609b DC-cut capacitor
2610, 2611 Bias circuit
2612a, 2612b Choke inductor
2701 Balanced high-frequency circuit
2702 Transmitting amplifier
2703 Transmitting filter
2704 Switch
2705 Antenna
2706 Receiving filter
2707 Receiving amplifier
2708, 2709 Balanced transmission line
2801, 2901 Balanced high-frequency device
2902, 2904, 2905 Matching circuit
2903 Balanced high-frequency device
3001 Surface acoustic wave filter
3002 Piezoelectric substrate
3003 First IDT electrode
3004 Second IDT electrode
3005 Third IDT electrode
3006 First reflector electrode
3007 Second reflector electrode
3101 Surface acoustic wave filter
3102 Piezoelectric substrate
3103 First IDT electrode
3104 Second IDT electrode
3105 Third IDT electrode
3106 First reflector electrode
3107 Second reflector electrode
3108 First divided IDT electrode
3109 Second divided IDT electrode
3110 Inductor
5101 Balanced high-frequency filter (device)
5102 Balanced high-frequency element
5103 Phase-shifting circuit
5104 Transmission line
5401 FBAR
5402 Substrate
5403 Lower electrode
5404 Piezoelectric thin film
5405 Upper electrode
5406 Cavity
5501 Balanced high-frequency filter
5502 Balanced high-frequency element
5503 Phase-shifting circuit
5504 Transmission line
5505 Transmission line
5601 Low noise amplifier
5602 Mixer
5701 Balanced high-frequency filter
5702 Balanced high-frequency element
5703 Phase-shifting circuit
5704, 5705 Capacitor
5706 Inductor
5707 Connection point
6001 Phase-shifting circuit
6002, 903 Inductor
6004 Capacitor
6005 Connection point
6201 Antenna duplexer
6202 Transmitting filter
6203 Receiving filter
6204 Phase-shifting circuit
6401 Balanced high-frequency circuit
6402 Low-noise amplifier
6403 Mixer
6404 Phase-shifting circuit
6501 Balanced high-frequency circuit
6502 Circuit board
6503 Transmitting amplifier
6504 Transmitting filter
6504 Switch
6506 Receiving filter
6507 Low-noise amplifier
6508 Mixer
6509 Phase-shifting circuit
6601 Balanced high-frequency circuit
6602 Antenna duplexer
6603 Transmitting filter
6604 Receiving filter

PREFERRED EMBODIMENTS OF THE INVENTION

Embodiments of the present invention are described below by referring to the accompanying drawings.

(Embodiment 1)

A balanced high-frequency device of embodiment 1 of the present invention is described below by referring to the accompanying drawings. FIG. 1 shows a configuration of a balanced high-frequency device 101 of the embodiment 1 of the present invention. In FIG. 1, the balanced high-frequency device 101 is constituted by a balanced device 102 and a phase circuit 103. Moreover, in the case of a balanced device 102, the input-side terminal is an input terminal IN serving as an unbalanced input/output terminal and the output-side terminals are output terminals OUT1 and OUT2 serving as balanced input/output terminals. Furthermore, a phase circuit 103 is connected between the output terminals. By using the above configuration, it is possible to realize a balanced high-frequency device having an unbalanced-balanced input/output terminal.

Figure 2:
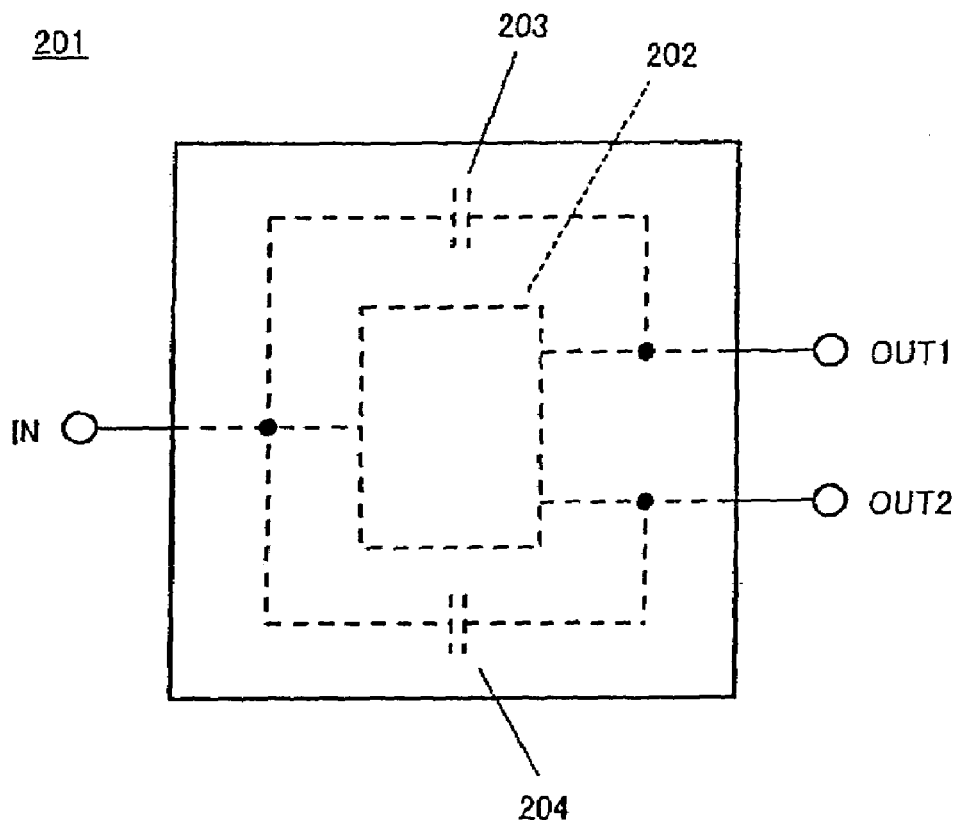
FIG. 2 is an illustration for explaining the analysis of a balance-characteristic deterioration cause of a conventional surface acoustic wave filter.

First, a balance-characteristic deterioration cause of the balanced high-frequency device is studied by using surface acoustic wave filter. The conventional surface acoustic wave filter 201 shown in FIG. 30 has a problem that a balance-characteristic deteriorates. In this case, the balance-characteristic is analyzed by the configuration shown in FIG. 2. In FIG. 2, the surface acoustic wave filter 201 is constituted by an ideal surface acoustic wave filter 202 whose balance-characteristic is not deteriorated and capacitive components 203 and 204. Combination by the parasitic component of the surface acoustic wave filter 201 is assumed by connecting the capacitive components 203 and 204 between the input side and output side of the ideal surface acoustic wave filter 202.

FIGS. 3(a) and 3(b) show filter characteristics when setting these capacitive components 203 and 204 to substantially 0.1 pF in which FIG. 3(a) shows an amplitude balance-characteristic in a pass band and FIG. 3(b) shows a phase balance-characteristic in a pass band. A result of analyzing the balance-characteristic in FIG. 3 very well coincides with the measured characteristic of the conventional surface acoustic wave filter shown in FIG. 32 as a trend of balance-characteristic deterioration. Therefore, combination of the input terminal and output terminal of a balanced device is considered as a main factor of balance-characteristic deterioration.

Operations of the balanced high-frequency device of the embodiment 1 of the present invention are described below by referring to the accompanying drawings. FIG. 4 shows the outline of operations of the balanced high-frequency device 101 of the embodiment 1 of the present invention. Combination due to a parasitic component between an input terminal and an output terminal is estimated as a main factor of deterioration of the balance-characteristic of the balanced high-frequency device 101. It is considered that the above mentioned can be explained by showing a signal component flowing through balanced input and output terminals by an common-mode signal component and a differential-mode signal component. Here, common-mode signal component means common-mode signal component, and differential-mode signal component means opposite-phase signal component. That is, a signal component i input from the input terminal IN is differentially output as differential-mode signal components id1 and id2 by the balanced device 102. However, the combination by a parasitic component is not made differential by the output terminal OUT1 or OUT2 but it is superimposed as common-mode signal components ic1 and ic2 and the common-mode signal components ic1 and ic2 cause the balance-characteristic to deteriorate.

Therefore, in the case of an embodiment of the present invention, it is possible to reduce the common-mode components ic1 and ic2 when the phase circuit 103 operates as a resonant circuit at a predetermined frequency to make impedances of the common-mode signal components ic1 and ic2 when viewing the output-terminal side from the balanced device 102 lower than impedances of the differential-mode signal components id1 and id2 when viewing the output-terminal side from the balanced device 102.

As described above, the balanced high-frequency device 101 of the present invention realizes a balanced high-frequency device excellent in balance-characteristic by reducing the common-mode signal components ic1 and ic2 by the phase circuit 103.

In the case of this embodiment, it is described that the input-side terminal is an input terminal IN serving as an unbalanced input/output terminal, the output-side terminals are output terminals OUT1 and OUT2 serving as balanced input/output terminals, and the phase circuit 103 is connected between the output terminals. However, this embodiment is not restricted to the above case. It is also allowed that the input-side terminal is an input terminal serving as a balanced input/output terminal, the output-side terminal is an output terminal serving as an unbalanced input/output terminal, and the phase circuit 103 is connected between input terminals.

(Embodiment 2)

Figure 5:
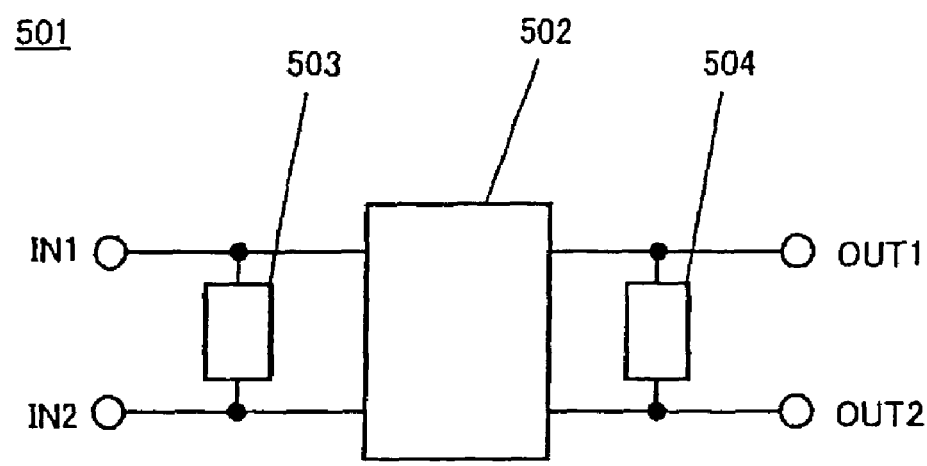
FIG. 5 is a block diagram of the balanced high-frequency device in the embodiment 2 of the present invention.

A balanced high-frequency device of embodiment 2 of the present invention is described below by referring to the accompanying drawings. FIG. 5 shows a configuration of a balanced high-frequency device 501 of the embodiment 2 of the present invention. In FIG. 5, the balanced high-frequency device 501 is constituted by a balanced device 502 and phase circuits 503 and 504. Moreover, in the case of the balanced device 502, the input-side terminal is an input terminal IN serving as a balanced input/output terminal and the output-side terminals are output terminals OUT1 and OUT2 serving as balanced input/output terminals. By using the above configuration, it is possible to realize a balanced high-frequency device having balanced-unbalanced input and output terminals.

Also in the case of the balanced high-frequency device 501 of the present invention, it is possible to realize a balanced high-frequency device excellent in balance-characteristic because the phase circuit 503 operates as a resonant circuit at a predetermined frequency and makes impedances of common-mode signal components ic1 and ic2 when viewing the input-terminal side from the balanced device 502 lower than those of differential-mode signal components id1 and id2 when viewing the input-terminal side from the balanced device 502 and the phase circuit 504 operates as a resonant circuit at a predetermined frequency and makes impedances of the common-mode signal components ic1 and ic2 when viewing the output-terminal side from the balanced device 502 lower than those of the differential-mode signal components id1 and id2 when viewing the output-terminal side from the balanced device 502 and thereby, reduces the common-mode signal components ic1 and ic2.

(Embodiment 3)

Figure 6:
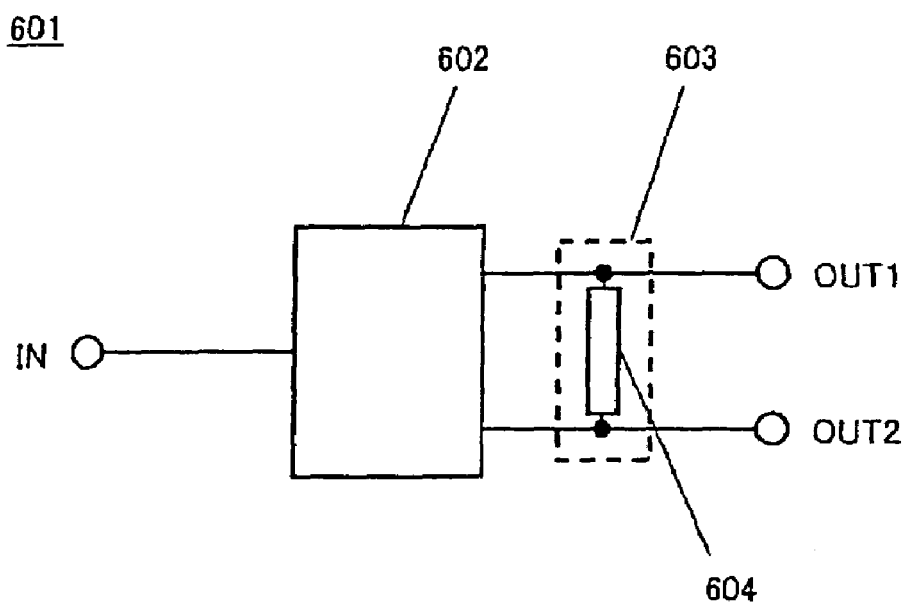
FIG. 6 is a block diagram of the balanced high-frequency device in the embodiment 3 of the present invention.

A balanced high-frequency device of embodiment 3 of the present invention is described below by referring to the accompanying drawings. A more specific circuit configuration is shown below as a phase circuit. FIG. 6 shows a configuration of a balanced high-frequency device 601 of the embodiment 2 of the present invention. In FIG. 6, the balanced high-frequency device 601 is constituted by a balanced device 602 and a phase circuit 603. Moreover, in the case of the balanced device 602, the input-side terminal is an input terminal IN serving as an unbalanced input/output terminal and output-side terminals are output terminals OUT1 and OUT2 serving as balanced input/output terminals. Furthermore, the phase circuit 603 is constituted by a transmission line 604 and set between output terminals. The transmission line 604 has a length of λ/2 (in this case, λ denotes a wavelength) which corresponds to a phase shift of 180°. Furthermore, in this case, λ is equal to a frequency in a pass band or nearby the pass band. By using the above configuration, it is possible to realize a balanced high-frequency device having an unbalanced-balanced input/output terminal.

Figure 7:
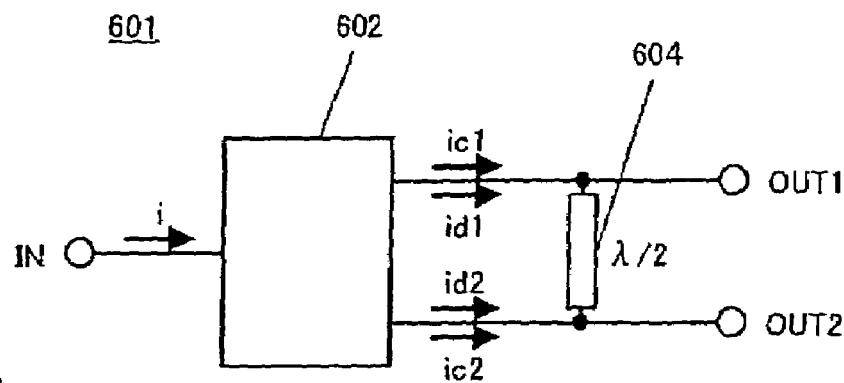
FIGS. 7(a) to 7(c) are illustrations for explaining operations of the balanced high-frequency device in the embodiment 3 of the present invention.
Figure 7:
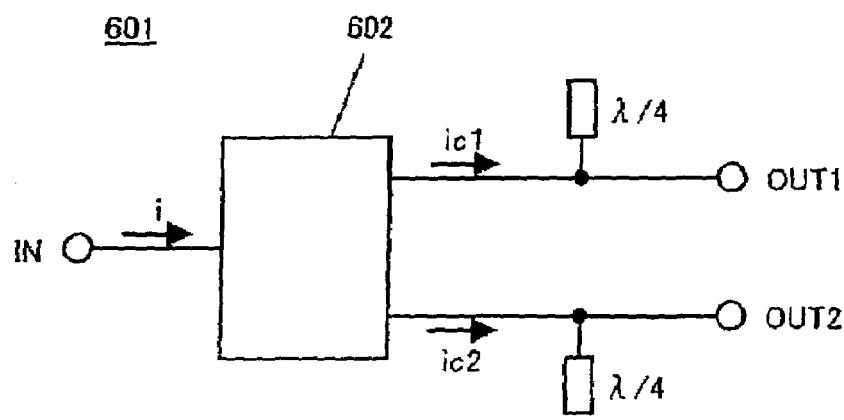
Figure 7:
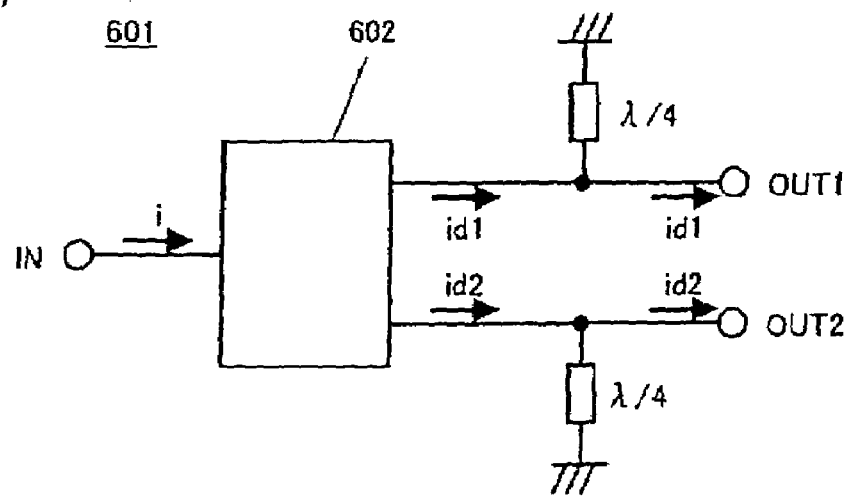

Operations of the balanced high-frequency device 601 are described by referring to the accompanying drawings. As shown in FIG. 7(a), when a signal component i is input to the balanced device 602 from the input terminal IN, common-mode signal components ic1 and ic2 and differential-mode signal components id1 and id2 are output from the balanced device. A transmission line 604 set between output terminals performs operations different from each other for the common-mode signal components ic1 and ic2 and differential-mode signal components id1 and id2. That is, as shown in FIG. 7(b), for the common-mode signal components ic1 and ic2, a configuration is realized in which a opened λ/4 line is connected to the output terminals OUT1 and OUT2 respectively and operates as a series resonant circuit, impedances of the output terminals to a ground plane almost becomes short, and the common-mode signal component ic1 or ic2 is not propagated to the output terminal OUT1 or OUT2.

Moreover, for the differential-mode signal components id1 and id2, a configuration is realized in which shorted λ/4 line is connected to the output terminals OUT1 and OUT2 respectively because a virtual setting plane is formed at the middle point of the transmission line 604, operates as a parallel resonant circuit, and impedances of the output terminals to ground planes almost become open, and thereby the differential-mode signal components id1 and id2 are propagated to the output terminals OUT1 and OUT2.

As described above, the balanced high-frequency device of the embodiment 3 of the present invention makes it possible to reduce common-mode signal components by using the transmission line 604 as a phase circuit and thus, it is possible to realize a balanced high-frequency device excellent in balance-characteristic.

In the case of this embodiment, the phase circuit is constituted by the transmission line. However, the configuration of the phase circuit is not restricted to the above configuration. By using a configuration operating as a phase circuit, the same advantage as the present invention can be obtained.

Moreover, it is allowed that a phase circuit is formed on a circuit substrate by using a transmission line and a chip component or integrated on a substrate with a balanced device mounted or in a package. Furthermore, it is allowed to form a part of the phase circuit in a laminated device constituted by forming electrode patterns on a plurality of dielectric layers and laminating the dielectric layers. Furthermore, by constituting the laminated device so as to have another circuit function and integrating the laminated device with a balanced high-frequency device of the present invention as a composite device, it is possible to realize a multifunctional compact balanced high-frequency device.

In the case of this embodiment, an input terminal is described as the unbalanced type and an output terminal is described as the balanced type. However, it is allowed that an input terminal is the balanced type and an output terminal is the unbalanced type. Moreover, it is allowed that both input terminal and output terminal are the balanced type.

(Embodiment 4)

Figure 8:
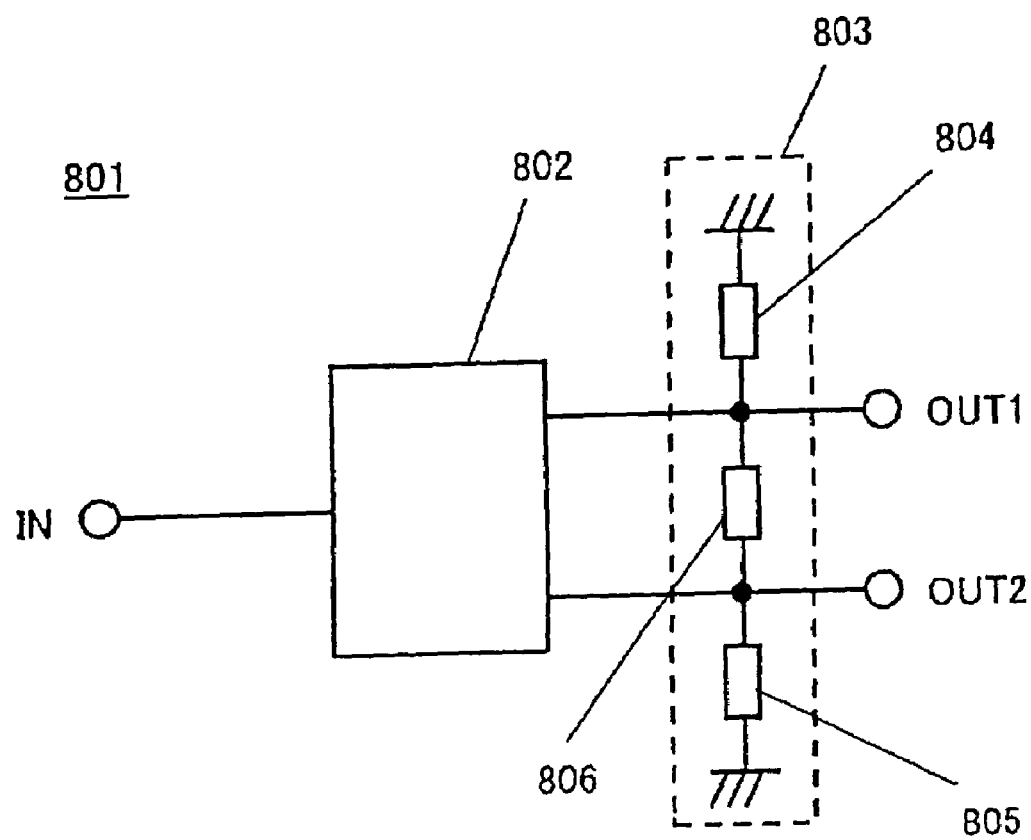
FIG. 8 is a block diagram of the balanced high-frequency device in the embodiment 4 of the present invention.

A balanced high-frequency device of embodiment 4 of the present invention is described below by referring to the accompanying drawings. A more specific circuit configuration is shown below as a phase circuit. FIG. 8 shows a configuration of a balanced high-frequency device of the embodiment 4 of the present invention. In FIG. 8, the balanced high-frequency device 801 is constituted by a balanced device 802 and a phase circuit 803. In the case of the balanced device 802, the input-side terminal is an input terminal IN serving as an unbalanced input/output terminal and output-side terminals are output terminals OUT1 and OUT2 serving as balanced input/output terminals.

The phase circuit 803 is constituted by impedance elements 804, 805, and 806. In this case, the output terminals OUT1 and OUT2 are grounded through impedance elements 804 and 805, the impedance element 806 is connected between the output terminals, and the phase circuit 803 is also connected between the output terminals. In this case, the impedance elements 804 and 805 substantially have the same impedance and the imaginary part of the impedance of the impedance element 806 is reverse to that of the impedances of the impedance elements 804 and 805 in polarity. By using the above configuration, a balanced high-frequency device having unbalanced-balanced input and output terminals can be obtained.

Figure 9:
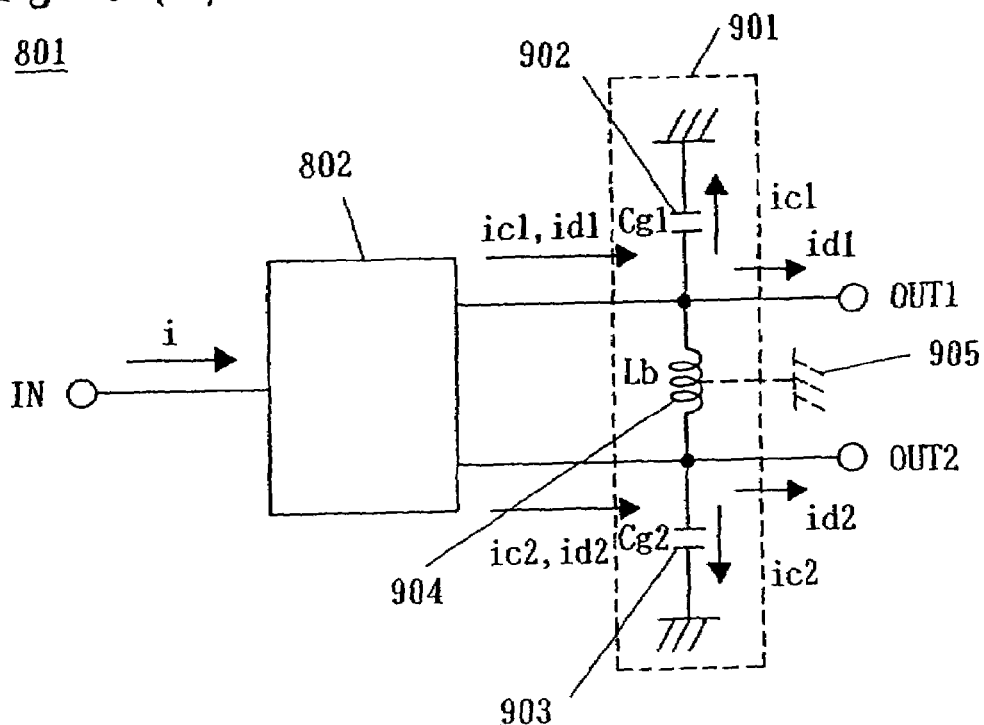
FIG. 9(a) is an illustration for explaining operations of the balanced high-frequency device in the embodiment 4 of the present invention.
FIG. 9(b) is an illustration showing an equivalent circuit of a phase circuit on differential-mode signal components in the embodiment 4 of the present invention.
FIG. 9(c) is an illustration showing an equivalent circuit of a phase circuit on common-mode signal components in the embodiment 4 of the present invention.
Figure 9:
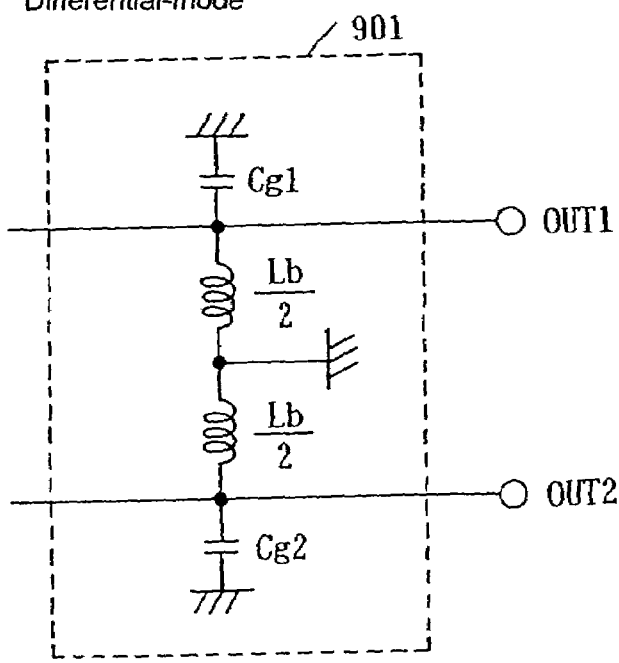
Figure 9:
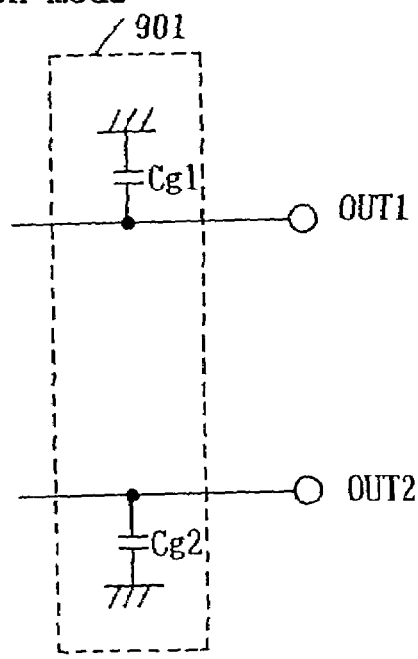

Then, operations of the balanced high-frequency device of the embodiment 4 of the present invention are described below by using a specific impedance element. FIGS. 9(a) and 9(b) are illustrations for explaining operations of the balanced high-frequency device of the embodiment 4 of the present invention. As shown in FIG. 9(a), a phase circuit 901 is constituted by capacitors 902 and 903 and an inductor 904. As shown in FIG. 9(a), when a signal component i is input to the balanced device 802 from the input terminal IN, common-mode signal components ic1 and ic2 and differential-mode signal components id1 and id2 are output from the balanced device. In this case, the inductor 904 connected between output terminals forms a virtual ground point 905 on the differential-mode signal components id1 and id2.

FIG. 9(b) shows the equivalent circuit of the phase circuit 901 on the differential-mode signal components id1 and id2. Because the inductor 904 forms the virtual ground point 905 on the differential-mode signal components id1 and id2, the capacitor 902 and a part of the inductor 904 form a parallel resonant circuit to a ground plane at the output terminal OUT1 and the capacitor 903 and a part of the inductor 904 form a parallel resonant circuit to a ground plane at the output terminal OUT2. By designing parallel resonant frequencies of the parallel resonant circuits so as to be kept in a pass band or nearby the pass band, impedances of the differential-mode signal components id1 and id2 at a predetermined frequency to a ground plane approach infinity and transferred to the output terminals without being shorted to a ground plane. That is, on the differential-mode signal components, operations substantially same as those shown in FIG. 7(c) are executed. FIG. 9(c) shows the equivalent circuit of the phase circuit 901 on the common-mode signal components ic1 and ic2. OUT1 and OUT2 have almost equal potentials on the common-mode signal components, the inductance 904 does not form a virtual ground point on the common-mode signal components ic1 and ic2, and OUT1 and OUT2 are substantially open. In this case, a part of the inductor 904 denotes a range up to the virtual ground point 905 {refer to FIG. 9(b)}.

Thus, by designing impedances of the capacitors 902 and 903 serving as impedance elements arranged between the balanced input/output terminals OUT1 and OUT2 and ground planes to sufficiently small values, the common-mode signal components ic1 and ic2 are shorted to ground planes and therefore, they are not transferred to the balanced input/output terminals.

Figure 10:
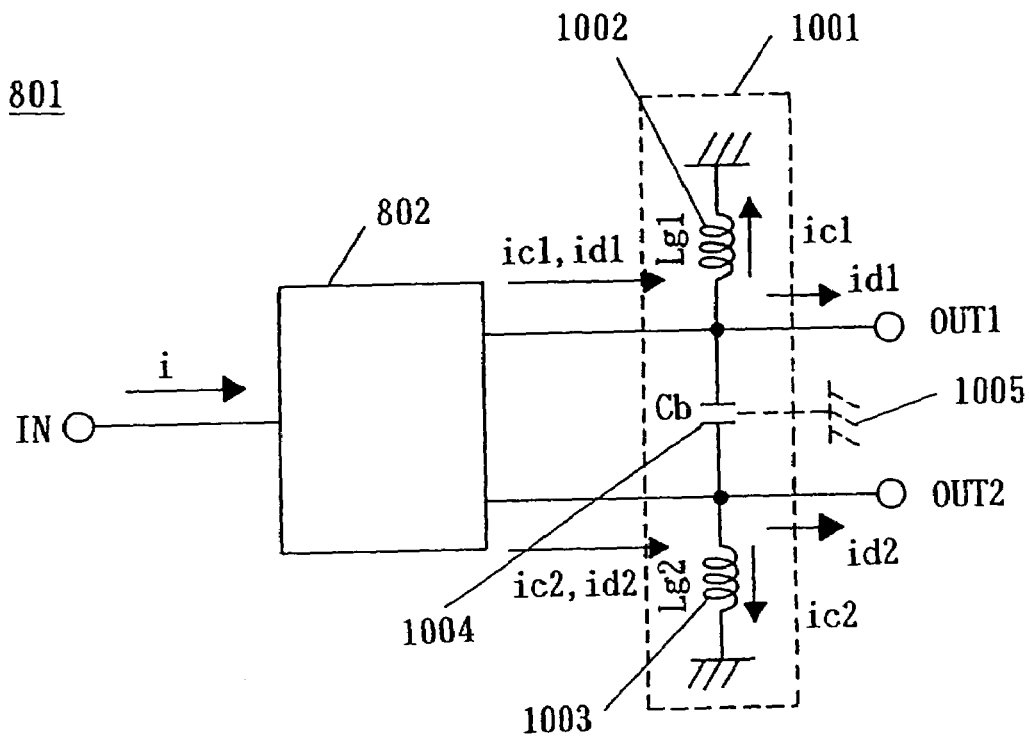
FIG. 10(a) is an illustration for explaining operations of the balanced high-frequency device in the embodiment 4 of the present invention.
FIG. 10(b) is an illustration showing an equivalent circuit of a phase circuit on differential-mode signal components in the embodiment 4 of the present invention.
FIG. 10(c) is an illustration showing an equivalent circuit of a phase circuit on common-mode signal components in the embodiment 4 of the present invention.
Figure 10:
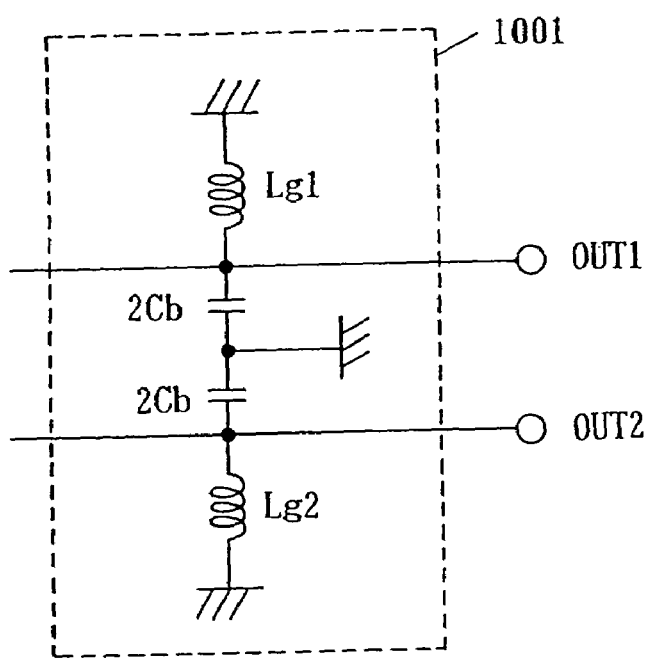
Figure 10:
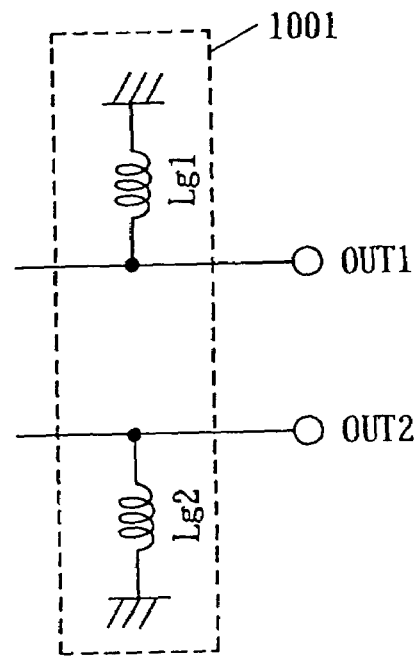

Moreover, it is allowed that the phase circuit of the embodiment 4 of the present invention has the configuration shown in FIG. 10. FIGS. 10(a) to 10(c) are illustrations for explaining operations of the balanced high-frequency device of the embodiment 4 of the present invention. As shown in FIG. 10(a), a phase circuit 1001 is constituted by inductors 1002 and 1003 and a capacitor 1004. As shown in FIG. 10(a), when a signal component i is input to a balanced device 802 from an input terminal IN, common-mode signal components ic1 and ic2 and differential-mode signal components id1 and id2 are output from the balanced device. In this case, the capacitor 1004 connected between output terminals forms a virtual ground point 1005 on differential-mode signal components id1 and id2.

FIG. 10(b) shows the equivalent circuit of the phase circuit 1001 on the differential-mode signal components id1 and id2. As shown in FIG. 10(b), because the capacitor 1004 forms a virtual ground point 1005 on the differential-mode signal components id1 and id2, the inductor 1002 and a part of the capacitor 1004 form a parallel resonant circuit to a ground plane at the output terminal OUT1 and the inductor 1003 and a part of the capacitor 1004 form a parallel resonant circuit to a ground plane at the output terminal OUT2. Therefore, by designing parallel resonant frequencies of the parallel resonant circuits so that they are kept in a pass band or nearby the pass band, impedances of the differential-mode signal components id1 and id2 at desired frequencies to a ground plane approach infinity and the components are transferred to the output terminals without being shorted to ground planes. That is, operations substantially same as those shown in FIG. 7(c) are executed on the differential-mode signal components id1 and id2. FIG. 10(c) shows the equivalent circuit of the phase circuit 1001 on the common-mode signal components ic1 and ic2. OUT1 and OUT2 have almost equal potential on the common-mode signal components, the capacitor 1004 does not form a virtual ground point on the common-mode signal component ic1 or ic2, and OUT1 and OUT2 substantially become open. In this case, a part of the capacitor 1004 denotes a range up to the virtual ground point (refer to FIG. 10(b)).

Therefore, by designing impedances of the inductors 1002 and 1003 serving as impedance elements arranged between the balanced input/output terminals OUT1 and OUT2 and ground planes to sufficiently small values, the common-mode signal components ic1 and ic2 are shorted to ground planes and therefore, they are not transferred to the balanced input terminals.

As described above, in the case of the balanced high-frequency device of the embodiment 4 of the present invention, it is possible to reduce common-mode signal components by using three impedance elements as phase circuits and thus, realize a balanced high-frequency device excellent in balance-characteristic.

In the case of this embodiment, the numbers of and configurations of inductors and capacitors serving as impedance elements constituting a phase circuit are not restricted to the above case. Moreover, though device values of the impedance elements 804 and 805 are substantially equal to each other, it is not always necessary that they are equal to each other. They are optimally selected in accordance with a circuit configuration. By using a configuration operating as a phase circuit, the same advantage as the present invention can be obtained.

Moreover, it is allowed that a phase circuit is formed on a circuit substrate by using a transmission line and a chip component or integrated on a substrate with a balanced device mounted or in a package. Furthermore, it is allowed to form a part of the phase circuit in a laminated device constituted by forming electrode patterns on a plurality of dielectric layers and laminating the dielectric layers. Furthermore, by constituting the laminated device so as to have another circuit function and integrating the laminated device with a balanced high-frequency device of the present invention as a composite device, it is possible to realize a multifunctional compact balanced high-frequency device.

Furthermore, in the case of this embodiment, it is described that an input terminal is the unbalanced type and an output terminal is the balanced type. However, it is allowed that the input terminal is the balanced type and the output terminal is the unbalanced type. Furthermore, it is allowed that both the input terminal and output terminal are the balanced type.

(Embodiment 5)

Figure 11:
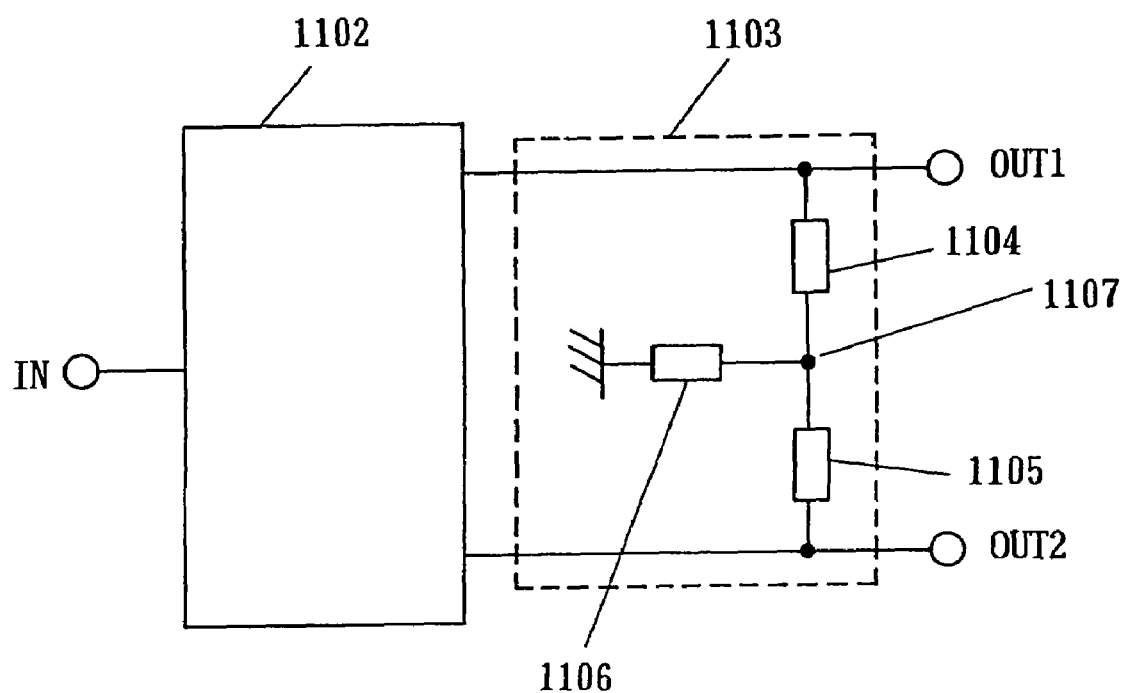
FIG. 11 is a block diagram of the balanced high-frequency device in the embodiment 5 of the present invention.

A balanced high-frequency device of embodiment 5 of the present invention is described below by referring to the accompanying drawings. A more specific circuit configuration is shown below as a phase circuit. FIG. 11 shows a configuration of a balanced high-frequency device 1101 of the embodiment 5 of the present invention. In FIG. 11, the balanced high-frequency device 1101 is constituted by a balanced device 1102 and a phase circuit 1103. Moreover, in the case of the balanced device 1102, the input-side terminal is an input terminal IN serving as an unbalanced input/output terminal and output-side terminals are output terminals OUT1 and OUT2 serving as balanced terminals.

The phase circuit 1103 is constituted by impedance elements 1104, 1105, and 1106. The impedance elements 1104 and 1105 are connected between the output terminals in series and the middle point 1107 between the impedance elements 1104 and 1105 is grounded through the impedance element 1106 and the phase circuit 1103 is connected between the output terminals. In this case, the imaginary part of the impedance of the impedance element 1106 is opposite to imaginary parts of impedances of the impedance elements 1104 and 1105 in polarity. Moreover, the impedance elements 1104 and 1105 have the substantially same value. By using the above configuration, it is possible to obtain a balanced high-frequency device having an unbalanced-balanced input/output terminal.

Figure 12:
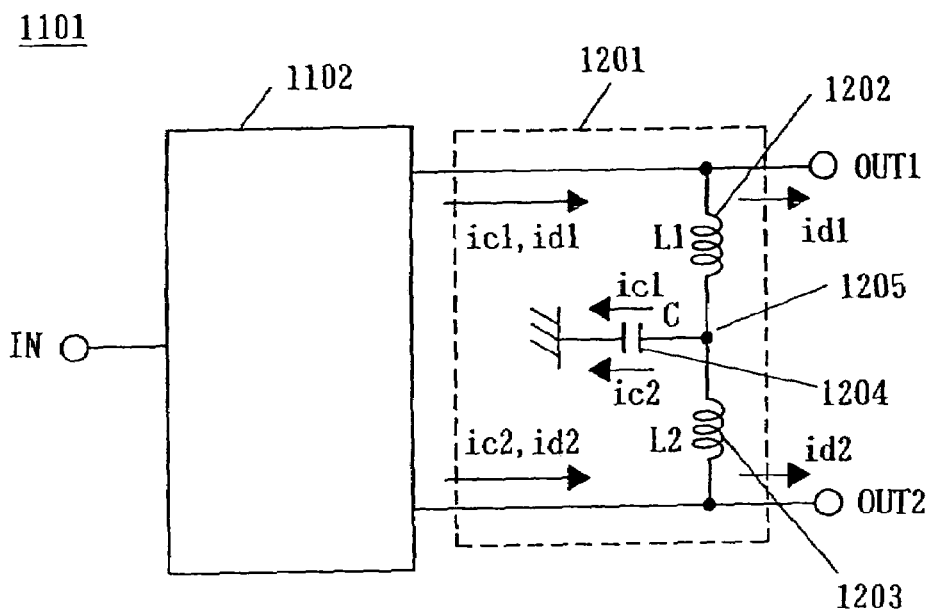
FIG. 12(a) is an illustration for explaining operations of the balanced high-frequency device in the embodiment 5 of the present invention.
FIG. 12(b) is an illustration showing an equivalent circuit of a phase circuit on differential-mode signal components in the embodiment 5 of the present invention.
FIG. 12(c) is an illustration showing an equivalent circuit of a phase circuit on common-mode signal components in the embodiment 5 of the present invention.
Figure 12:
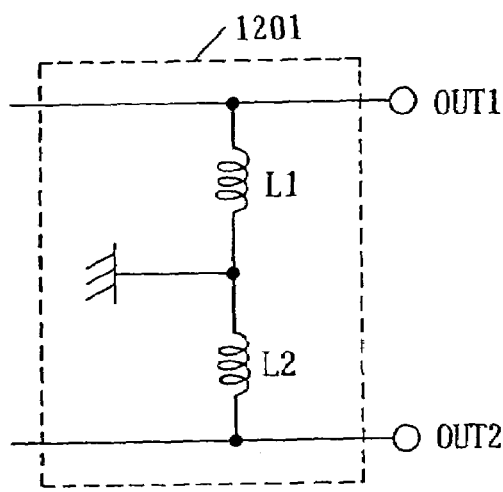
Figure 12:
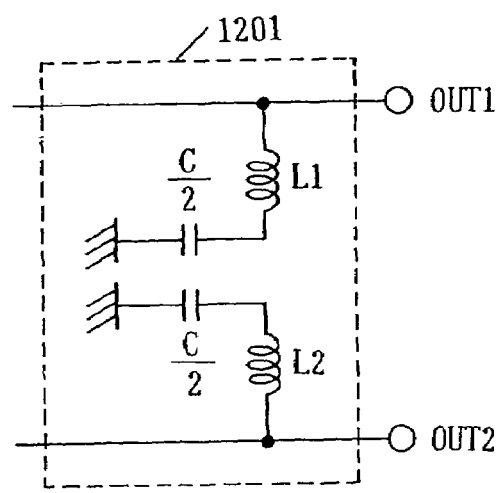

Then, operations of a balanced high-frequency device of the present invention are described below by using a specific impedance element. FIGS. 12(a) to 12(c) are illustrations for explaining operations of the balanced high-frequency device of the present invention. As shown in FIG. 12(a), a phase circuit 1201 is constituted by inductors 1202 and 1203 and a capacitor 1204. As shown in FIG. 12(a), when a signal component i is input from an input terminal IN to the balanced device 1102, common-mode signal components ic1 and ic2 and differential-mode signal components id1 and id2 are output from the balanced device 1102. FIG. 12(b) shows the equivalent circuit of the phase circuit 1201 on the differential-mode signal components. As shown in FIG. 12(b), the connection point 1205 between the inductors 1202 and 1203 serves as a virtual ground point on the differential-mode signal components id1 and id2. Therefore, by sufficiently increasing values of the inductors 1202 and 1203, it is possible to increase an impedance to a ground plane and the differential-mode signal components id1 and id2 are transferred to output terminals OUT1 and OUT2.

Moreover, FIG. 12(c) shows the equivalent circuit of the phase circuit 1201 on common-mode signal components. As shown in FIG. 12(c), the connection point 1205 between the inductors 1202 and 1203 does not serve as a virtual ground point on the common-mode signal components ic1 and ic2. Therefore, by designing the inductor 1202 and a part of the capacitor 1204 and the inductor 1203 and a part of the capacitor 1204 so that they form a series resonant circuit at a predetermined frequency, common-mode signal components are shorted to ground planes and therefore, they are not transferred to the output terminal OUT1 or OUT2. In this case, a part of the capacitor 1204 denotes one hand equivalently becoming parallel connection (refer to FIG. 12(c)).

Figure 13:
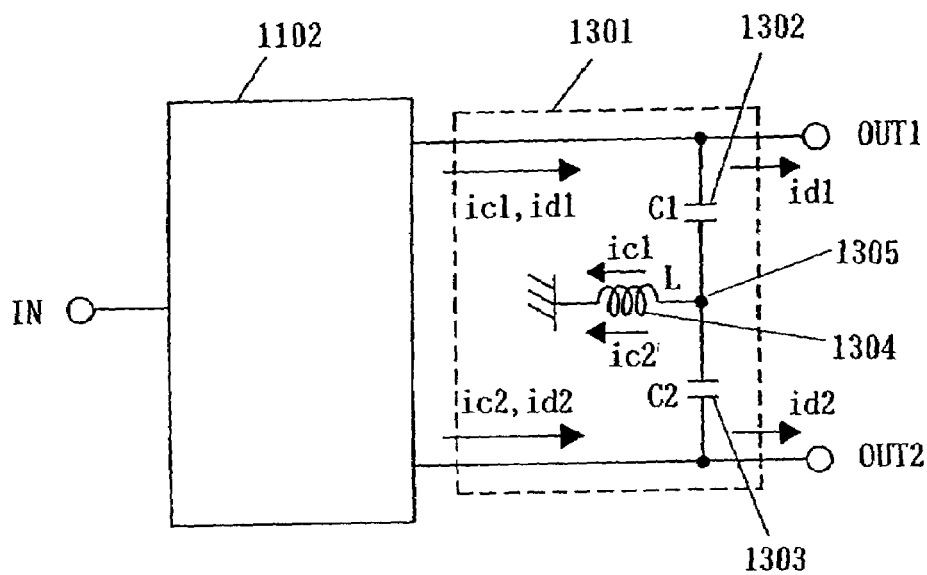
FIG. 13(a) is an illustration for explaining operations of the balanced high-frequency device in the embodiment 5 of the present invention.
FIG. 13(b) is an illustration showing an equivalent circuit of a phase circuit on differential mode signal components in the embodiment 5 of the present invention.
FIG. 13(c) is an illustration showing an equivalent circuit of a phase circuit on common-mode signal components in the embodiment 5 of the present invention.
Figure 13:
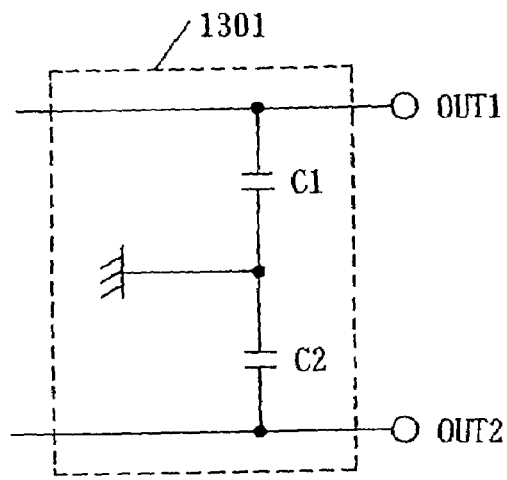
Figure 13:
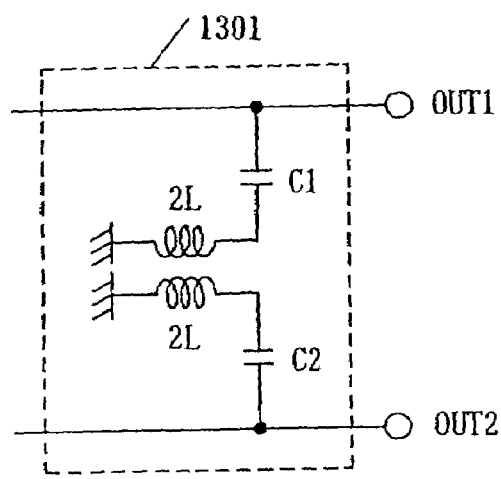

Furthermore, it is allowed that a phase circuit of the present invention has the configuration shown in FIGS. 13(a) to 13(c). FIGS. 13(a) to 13(c) are illustrations for explaining operations of the balanced high-frequency device of the present invention. As shown in FIG. 13(a), a phase circuit 1301 is constituted by capacitors 1302 and 1303 and an inductor 1304. As shown in FIG. 13(a), when a signal component i is input from an input terminal IN to the balanced device 1102, common-mode signal components ic1 and ic2 and differential-mode signal components id1 and id2 are output from the balanced device 1102. FIG. 13(b) shows the equivalent circuit of the phase circuit 1301 on the differential-mode signal components id1 and id2. As shown in FIG. 13(b), the connection point 1305 between the capacitors 1302 and 1303 serves as a virtual ground point on the differential-mode signal components id1 and id2. Therefore, by sufficiently decreasing values of the capacitors 1302 and 1303, it is possible to increase an impedance to a ground plane and the differential-mode signal components are transferred to the output terminals OUT1 and OUT2.

FIG. 13(c) shows the equivalent circuit of the phase circuit 1301 on the common-mode signal components ic1 and ic2. As shown in FIG. 13(c), the connection point 1305 between the capacitors 1302 and 1303 does not serve as a virtual ground point on the common-mode signal components ic1 and ic2. Therefore, by designing the capacity 1302 and a part of the inductor 1304 and the capacitor 1303 and a part of the inductor 1304 so that they respectively form a series resonant circuit at a predetermined frequency, common-mode signal components are shorted to ground planes and therefore, they are not transferred to the output terminal OUT1 or OUT2. In this case, a part of the inductor 1304 denotes one hand equivalently becoming parallel connection (refer to FIG. 13(c)).

As described above, the balanced high-frequency device of the embodiment 5 of the present invention can reduce common-mode signal components by using three impedance elements as phase circuits and therefore, it is possible to realize a balanced high-frequency device excellent in balance-characteristic.

Moreover, in the case of this embodiment, the numbers of and configurations of inductors and capacitors serving as impedance element constituting a phase circuit are not restricted to the above case. Furthermore, though devices values of the impedance elements 1104 and 1105 are substantially equal to each other, it is not always necessary that the values are equal to each other but the values are optimally selected in accordance with a circuit configuration. Therefore, by using a configuration operating as a phase circuit, the same advantage as the present invention can be obtained.

Furthermore, it is allowed that a phase circuit is formed on a circuit substrate by using a transmission line and a chip component or formed on a substrate with a balanced device mounted or in a substrate. Furthermore, it is allowed to form a part of the phase circuit in a laminated device constituted by forming electrode patterns on a plurality of dielectric layers and laminating the dielectric layers. Furthermore, by constituting the laminated device so as to have another circuit function and integrating the laminated device with a balanced high-frequency device of the present invention as a composite device, it is possible to realize a multifunctional compact balanced high-frequency device.

In the case of this embodiment, it is described that an input terminal is the unbalanced type and an output terminal is the balanced type. However, it is also allowed that the input terminal is the balanced type and the output terminal is the unbalanced type. Furthermore, it is allowed that both the input terminal and output terminal are the balanced type.

(Embodiment 6)

Figure 14:
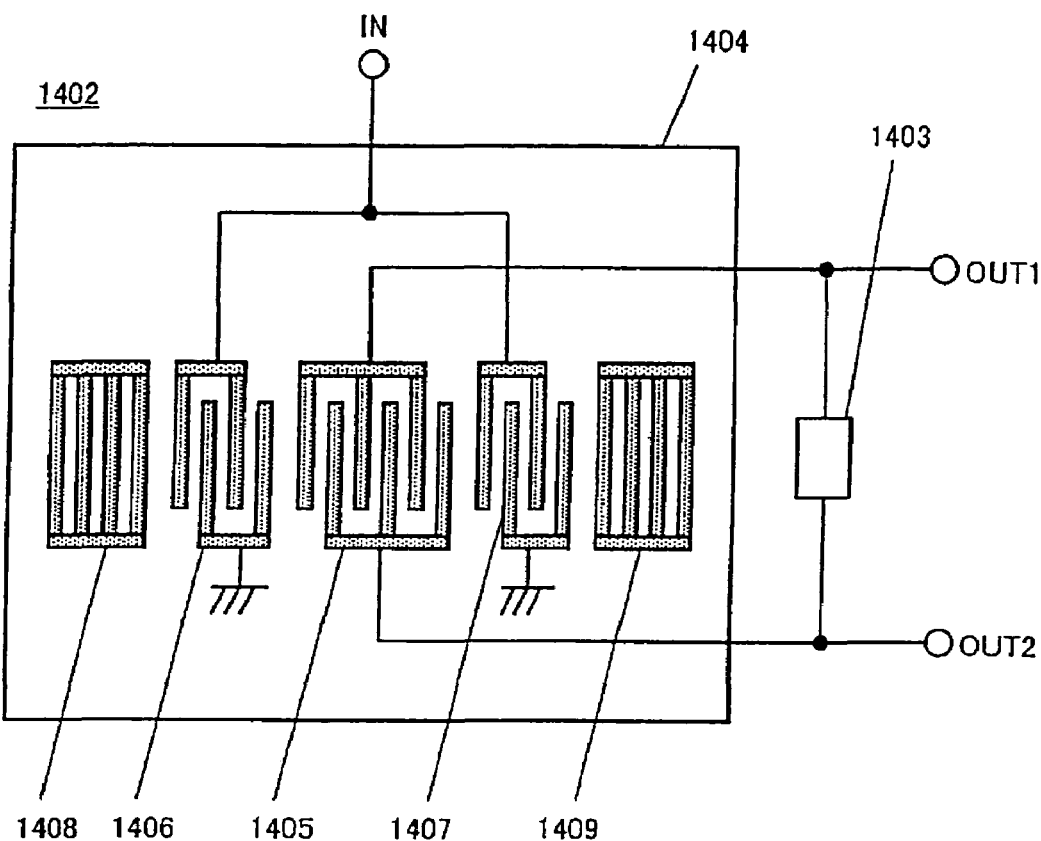
FIG. 14 is a block diagram of the balanced high-frequency device in the embodiment 6 of the present invention.

Then, a balanced high-frequency device of embodiment 6 of the present invention is described below by referring to the accompanying drawings. A specific configuration of the balanced high-frequency device is described below on a case of using surface acoustic wave filter as balanced device. FIG. 14 shows a configuration of a balanced device of the present invention. In FIG. 14, a balanced high-frequency device 1401 is constituted by a surface acoustic wave filter 1402 and a phase circuit 1403 respectively serving as a balanced device. Moreover, in the case of the surface acoustic wave filter 1402, the input-side terminal is an input terminal IN serving as an unbalanced input/output terminal and output-side terminals are output terminals OUT1 and OUT2 serving as balanced input/output terminals. Moreover, the phase circuit 1403 is connected between the output terminals.

The surface acoustic wave filter 1402 is constituted on a piezoelectric substrate 1404 by first, second, and third inter-digital transducer electrodes (hereafter respectively referred to as IDT electrode) 1405, 1406, and 1407 and first and second reflector electrodes 1408 and 1409. One-hand electrode finger of the first IDT electrode 1405 is connected to the output terminal OUT1 and the other-hand electrode finger of the first IDT electrode 1405 is connected to the output terminal OUT2. Moreover, one-hand electrode fingers of the second and third IDT electrodes 1406 and 1407 are connected to the input terminal IN and the other-hand electrode fingers of them are grounded. By using the above configuration, it is possible to obtain a balanced high-frequency device having an unbalanced-balanced input/output terminal.

Figure 15:
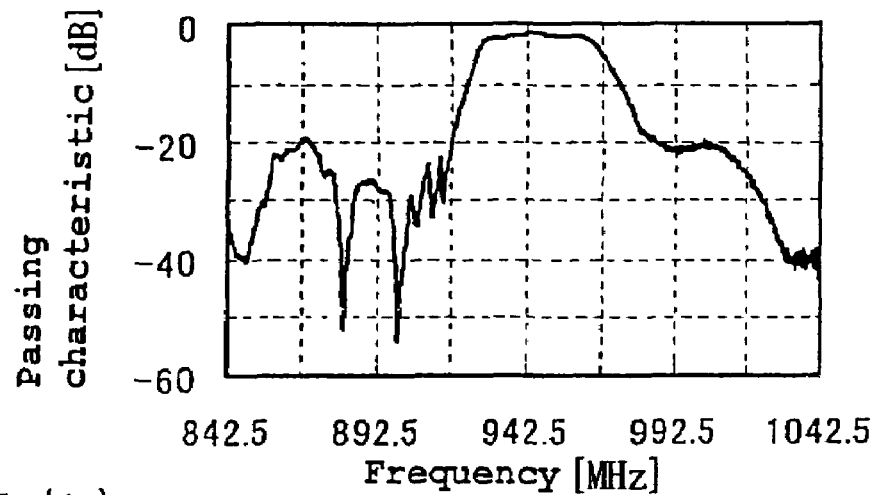
FIG. 15(a) is a passing characteristic diagram of a balanced high-frequency device when using the phase circuit 603.
FIG. 15(b) is an amplitude balance-characteristic diagram of a balanced high-frequency device when using the phase circuit 603.
FIG. 15(c) is a phase balance-characteristic diagram of a balanced high-frequency device when using the phase circuit 603.
Figure 15:
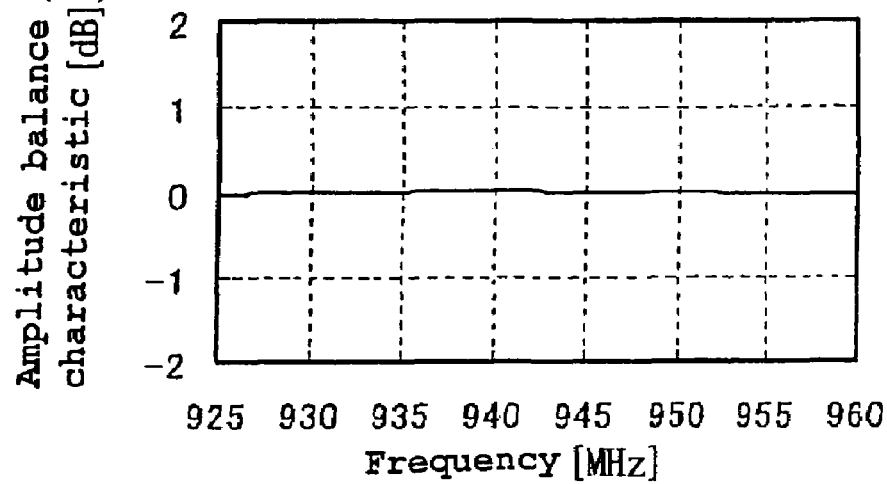
Figure 15:
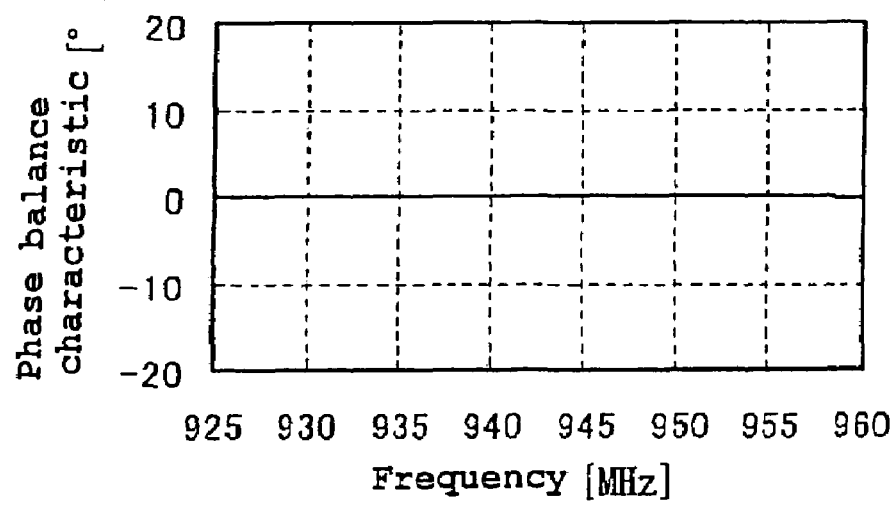
Figure 31:
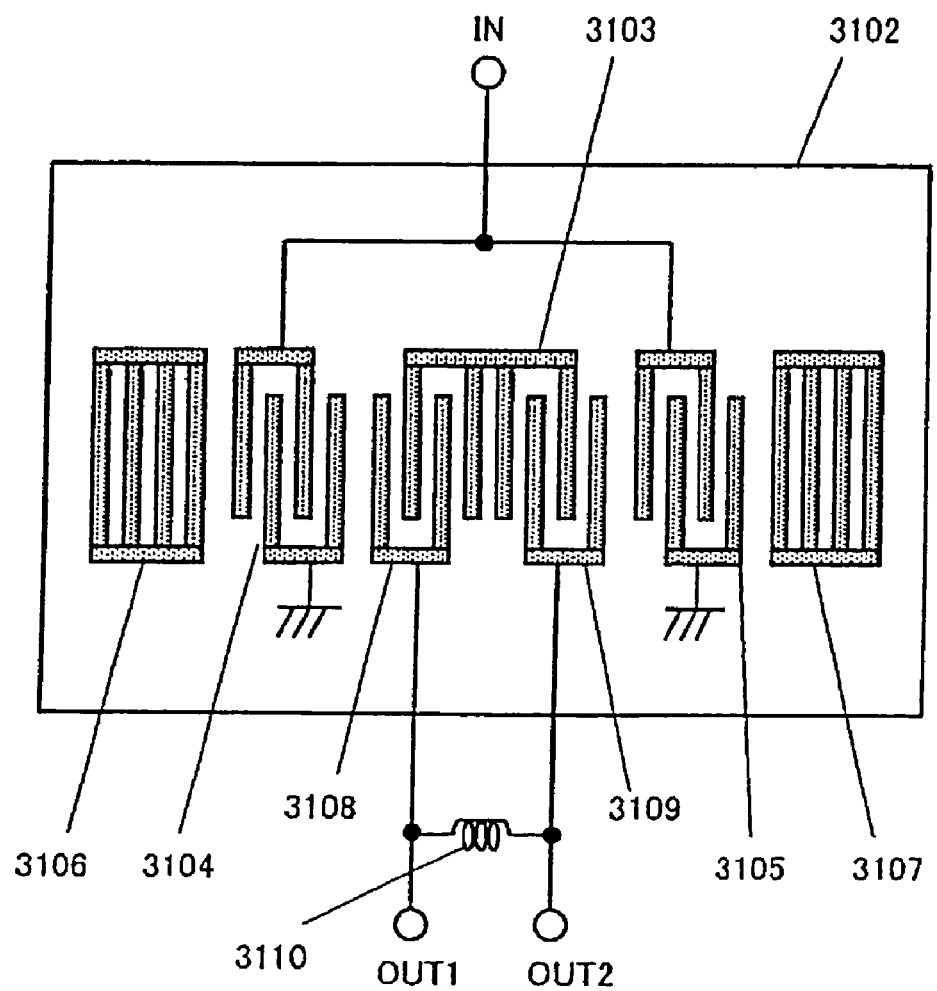
FIG. 31 is a block diagram including a matching circuit of a conventional surface acoustic wave filter.

Then, specific characteristics of the balanced high-frequency device of this embodiment are described below. FIGS. 15(a) to 15(c) show characteristics of the balanced high-frequency device 1401 when using the phase circuit 603 shown in FIG. 6 as the phase circuit 1403. In this case, the transmission line 604 constituting the phase circuit 603 has substantially a length of λ/2 which corresponds to a phase shift of 180°. FIG. 15(a) shows a passing characteristic, FIG. 15(b) shows amplitude balance-characteristic of a pass band, and FIG. 15(c) shows a phase balance-characteristic of a pass band. The balance-characteristics in FIGS. 15(b) and 15(c) are greatly improved compared to conventional characteristics shown in FIG. 31 and are almost close to an ideal characteristic. Moreover, in the case of the passing characteristic, the attenuation at the high pass-band side is improved by approx. 5 dB.

Figure 16:
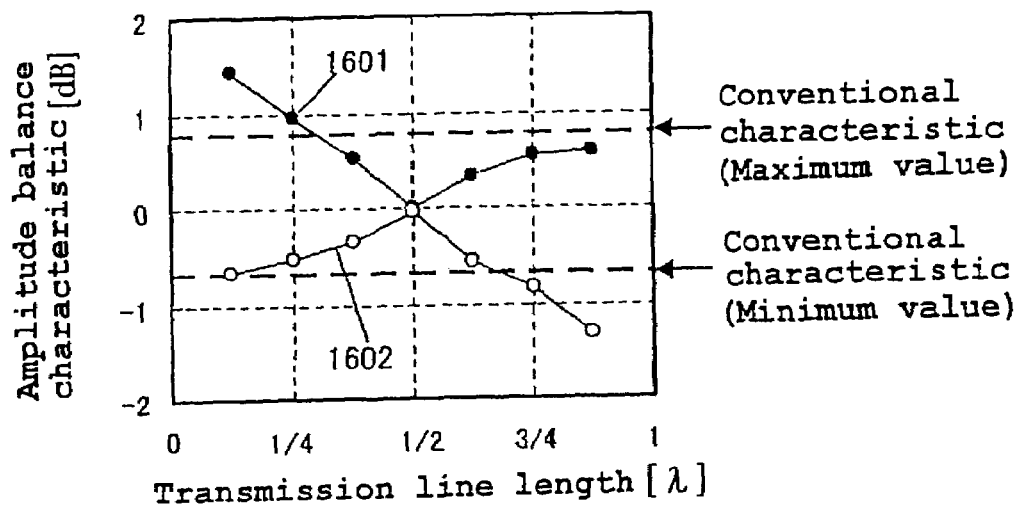
FIG. 16(a) is an amplitude balance-characteristic diagram of a balanced high-frequency device when using the phase circuit 603 and FIG. 16(b) is a phase balance-characteristic diagram of a balanced high-frequency device when using the phase circuit 603.
Figure 16:
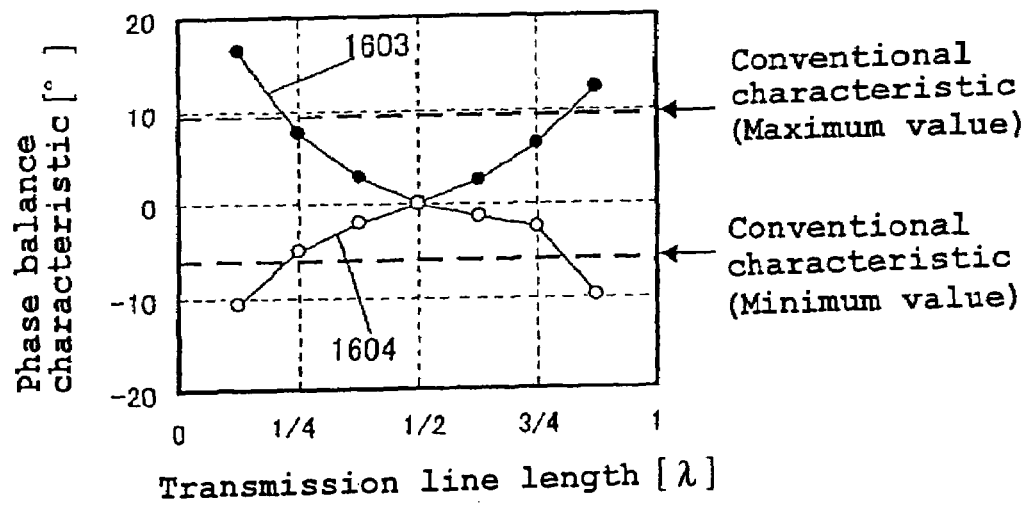

Then, a case of changing the length of the transmission line 604 is evaluated. FIGS. 16(*a*) and 16(*b*) show balance-characteristics when changing the length of the transmission line 604. FIG. 16(*a*) shows amplitude balance-characteristics and FIG. 16(*b*) shows phase balance-characteristics. Moreover, symbols 1601 and 1602 denote the maximum value and minimum value of deteriorations in the amplitude balance-characteristic in a pass band of the surface acoustic wave filter of this embodiment. Symbols 1603 and 1604 denote the maximum value and minimum value of deteriorations in the phase balance-characteristics in the bass band of the surface acoustic wave filter of this embodiment. Furthermore, broken lines show the maximum value and minimum value of deteriorations in the balance-characteristics of a conventional surface acoustic wave filter. From FIGS. 16(*a*) and 16(*b*), it is found that the balance-characteristics are improved when the transmission line length ranges substantially between $\lambda/4$ and $3\lambda/4$. Moreover, it is found that a more preferable balance-characteristic is obtained when the amplitude balance-characteristic ranges between substantially −5 dB and +5 dB and the phase balance-characteristic ranges between substantially −0.5° and +0.5° by keeping a phase angle in substantially the range between $3\lambda/8$ and $5\lambda/8$.

Figure 17:
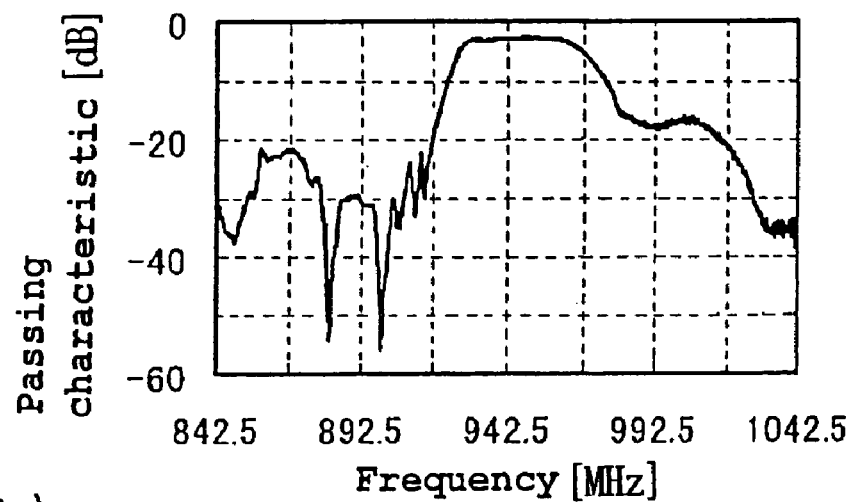
FIG. 17(a) is a passing characteristic diagram of a balanced high-frequency device when using the phase circuit 901.
FIG. 17(b) is an amplitude balance-characteristic diagram of a balanced high-frequency device when using the phase circuit 901.
FIG. 17(c) is a phase balance-characteristic diagram of a balanced high-frequency device when using the phase circuit 901.
Figure 17:
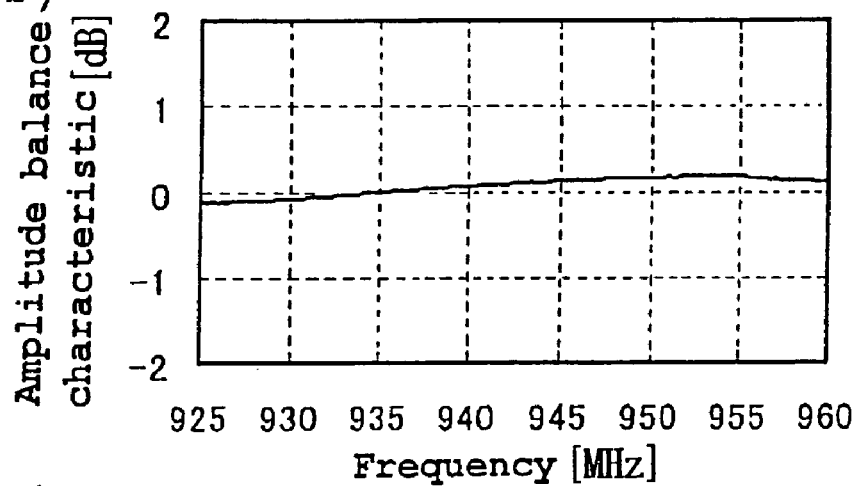
Figure 17:
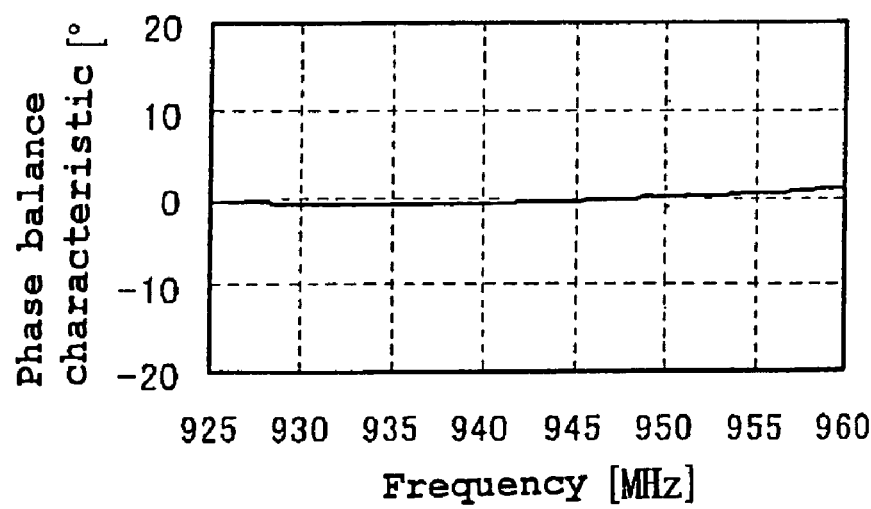

Then, characteristics when using a phase circuit of another configuration are shown. FIGS. 17(*a*) to 17(*c*) show characteristics of the balanced high-frequency device 1401 when using the phase circuit 901 shown in FIG. 9 as the phase circuit 1403. In this case, capacitances Cg1 and Cg2 of the capacitors 902 and 903 are substantially equal to each other so that impedances of the capacitors 902 and 903 respectively become 3 Ω at the frequency in a pass band. Moreover, the inductance Lb of the inductor 904 is designed so that parallel resonant frequencies between Cg1 and Lb/2 and between Cg2 and Lb/2 are kept in a pass band.

FIG. 17(*a*) shows a passing characteristic, FIG. 17(*b*) shows an amplitude balance-characteristic of a pass band, and FIG. 17(*c*) shows a phase balance-characteristic of a pass band. The balance-characteristics are greatly improved compared to those shown in FIG. 31 and are almost close to an ideal state. Moreover, in the case of the passing characteristics, the attenuation at the high pass-band side is improved by approx. 5 dB.

Figure 18:
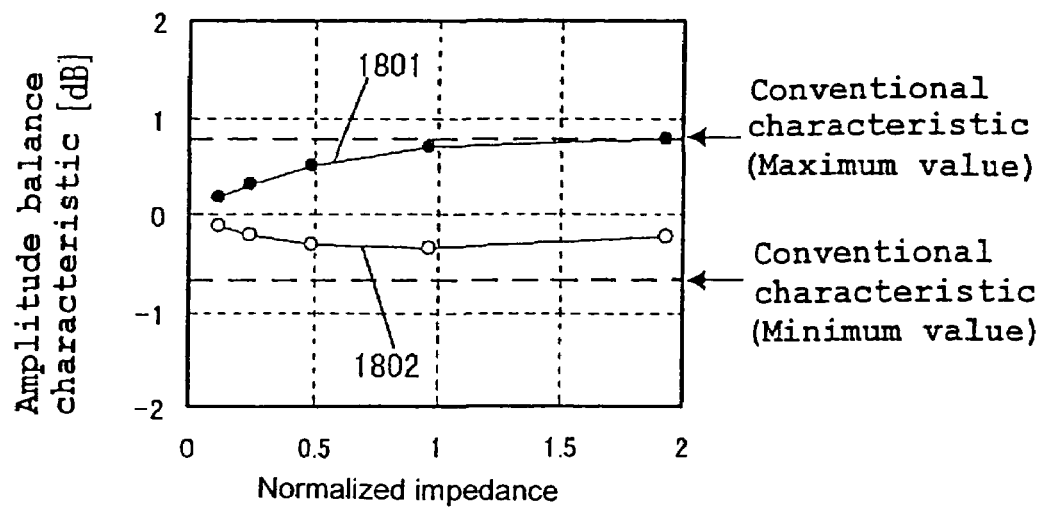
FIG. 18(a) is an amplitude balance-characteristic diagram of a balanced high-frequency device when using the phase circuit 901 and FIG. 18(b) is a phase balance-characteristic diagram of a balanced high-frequency device when using the phase circuit 901.
Figure 18:
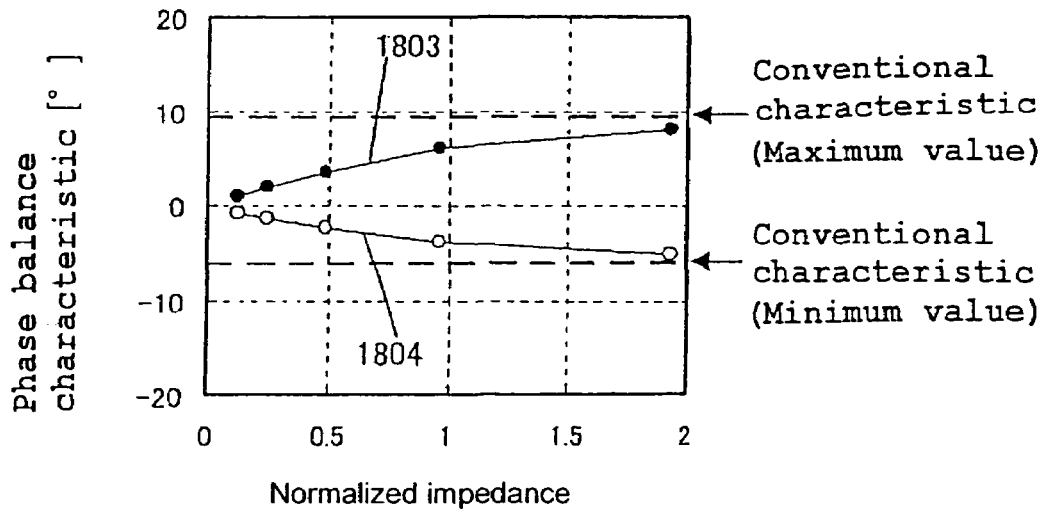

Then, a case in which impedances of the capacitors 902 and 903 are changed is evaluated. FIGS. 18(*a*) and 18(*b*) show balance-characteristics to normalized impedances obtained by dividing impedances of the capacitors 902 and 903 by the characteristic impedance of a terminal. In this case, because the characteristic impedance of a balanced output terminal is equal to substantially 50 Ω, it is assumed that the characteristic impedance of each terminal is equal to substantially 25 Ω. FIG. 18(*a*) shows amplitude balance-characteristics and FIG. 18(*b*) shows phase balance-characteristics. Moreover, symbols 1801 and 1802 denote the maximum value and minimum value of deteriorations in the amplitude balance-characteristics in the pass band of the surface acoustic wave filter of this embodiment and 1803 and 1804 denote the maximum value and minimum value of deteriorations in the phase balance-characteristics in the pass band of the surface acoustic wave filter of this embodiment. From FIGS. 18(*a*) and 18(*b*), it is found that the balance-characteristics are improved when normalized impedances are equal to or less than 2.

Figure 19:
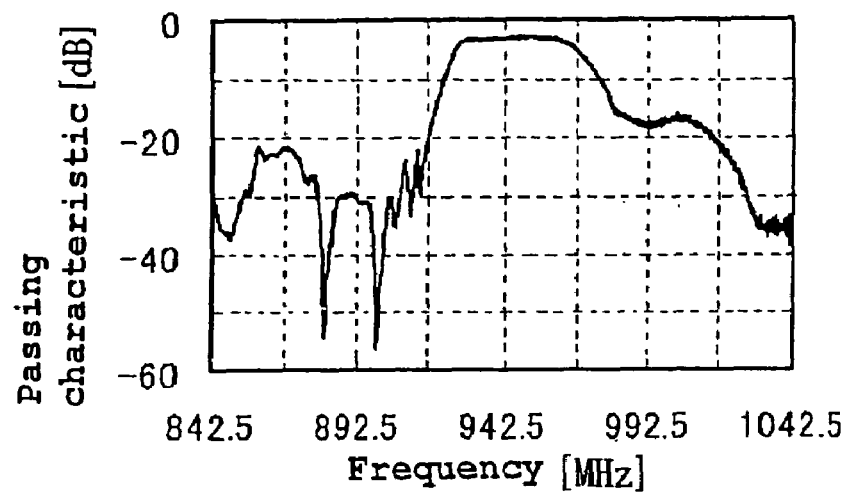
FIG. 19(a) is a passing characteristic diagram of a balanced high-frequency device when using the phase circuit 1001.
FIG. 19(b) is an amplitude balance-characteristic diagram of a balanced high-frequency device when using the phase circuit 1001.
FIG. 19(c) is a phase balance-characteristic diagram of a balanced high-frequency device when using the phase circuit 1001.
Figure 19:
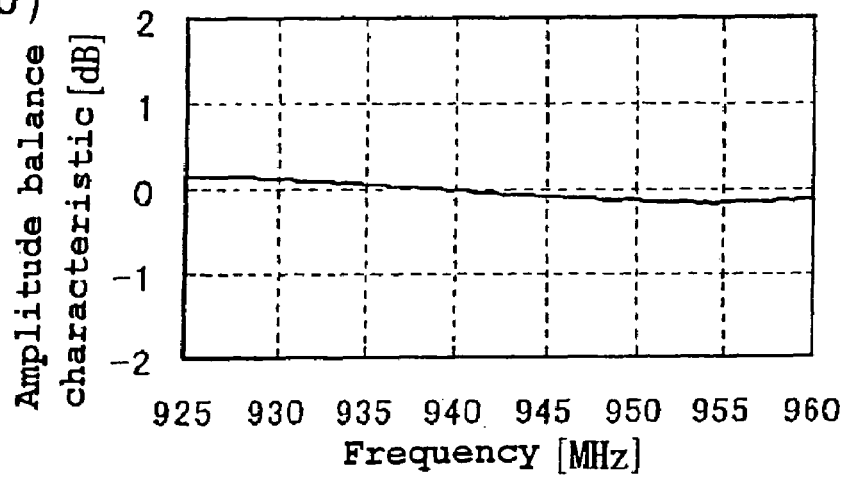
Figure 19:
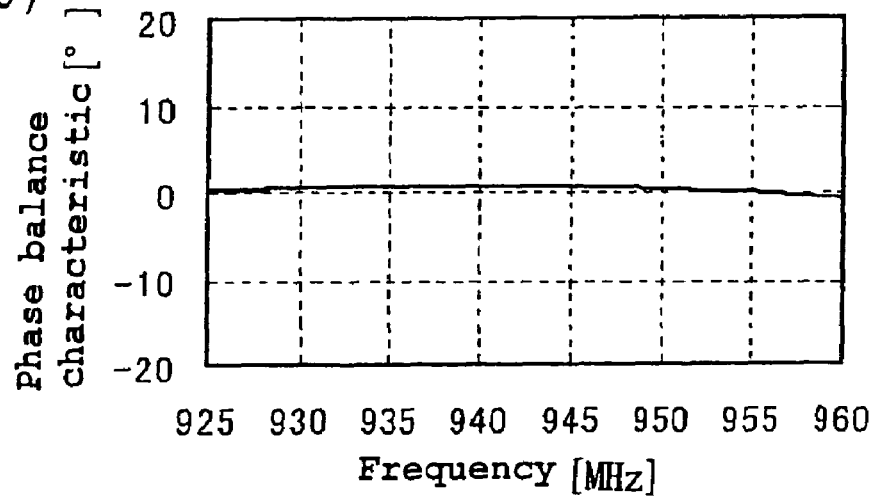

Then, characteristics when using a phase circuit of another configuration are described below. FIGS. 19(*a*) to 19(*c*) show characteristics of the balanced high-frequency device 1401 when using the phase circuit 1001 shown in FIG. 10 as the phase circuit 1403. In this case, inductance values Lg1 and Lg2 of the inductors 1002 and 1003 are substantially equal to each other and the inductors 1002 and 1003 are designed so that impedances of the inductors are respectively equal to substantially 3 Ω at the frequency in a pass band. Moreover, the capacitance Cb of the capacitor 1004 is designed so that parallel resonant frequencies between Lg1 and 2Cb and between Lg2 and 2Cb are kept in a pass band.

FIG. 19(*a*) shows a passing characteristic, FIG. 19(*b*) shows an amplitude balance-characteristic of a pass band, and FIG. 19(*c*) shows a phase balance-characteristic of a pass band. The balance-characteristics are greatly improved compared to conventional characteristics shown in FIG. 31 and are almost close to an ideal state. Moreover, in the case of the passing characteristic, the attenuation at the high pass band side is improved by approx. 5 dB.

Figure 20:
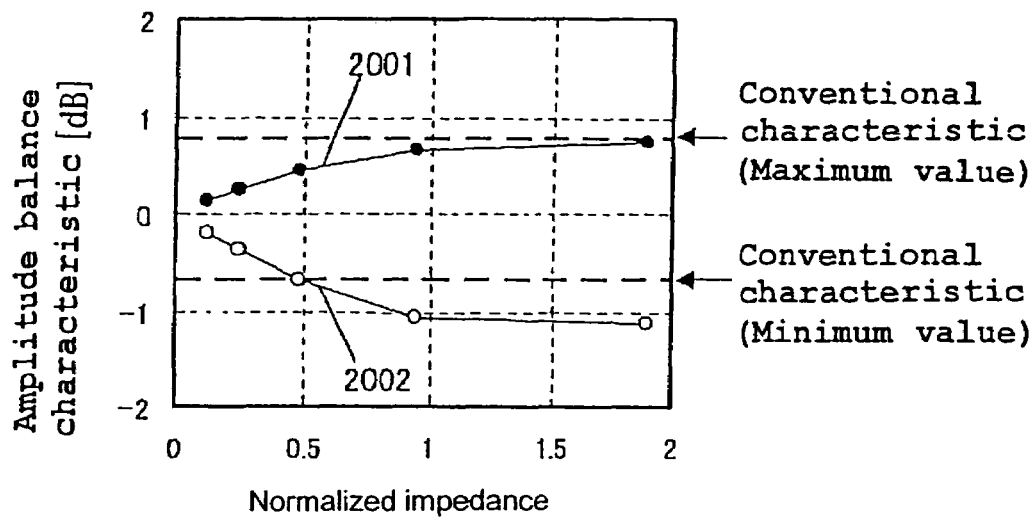
FIG. 20(a) is an amplitude balance-characteristic diagram of a balanced high-frequency device when using the phase circuit 1001 and FIG. 20(b) is a phase balance-characteristic diagram of a balanced high-frequency device when using the phase circuit 1001.
Figure 20:
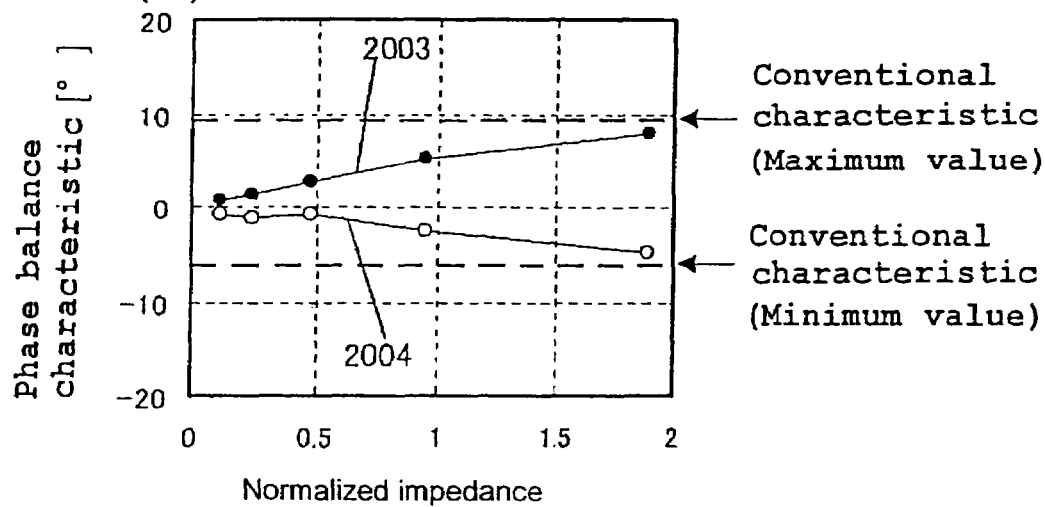

Then, a case is evaluated in which impedances of the inductors 1002 and 1003 are changed. FIGS. 20(*a*) and 20(*b*) show balance-characteristics to normalized impedances obtained by dividing the impedances of the inductors 1002 and 1003 by the characteristic impedance of a terminal. In this case, because the characteristic impedance of a balanced output terminal is substantially equal to 50 Ω, the characteristic impedance of each terminal is set to substantially 25 Ω. FIG. 20(*a*) shows amplitude balance-characteristics and FIG. 20(*b*) shows phase balance-characteristics. Moreover, symbols 2001 and 2002 denote the maximum value and minimum value of deteriorations in the amplitude balance-characteristics in the pass band of the surface acoustic wave filter of this embodiment and 2003 and 2004 denote the maximum value and minimum value of deteriorations in the phase balance-characteristics in the bass band of the surface acoustic wave filter of this embodiment.

From FIG. 20, it is found that the phase balance-characteristics are improved when the normalized impedance is substantially 2 or less. Moreover, the amplitude balance-characteristics are improved when the normalized impedance is substantially 0.5 or less. Therefore, it is preferable to keep the normalized impedance at substantially 2 or less. More preferably, by preferably keeping the normalized impedance at substantially 0.5 or less, it is possible to improve the balance-characteristics.

As described above, in the case of the balanced high-frequency device 1401 of the embodiment 6 of the present invention, it is possible to reduce common-mode components by using three impedance elements as phase circuits and thereby realize a balanced high-frequency device excellent in balance-characteristic.

Figure 21:
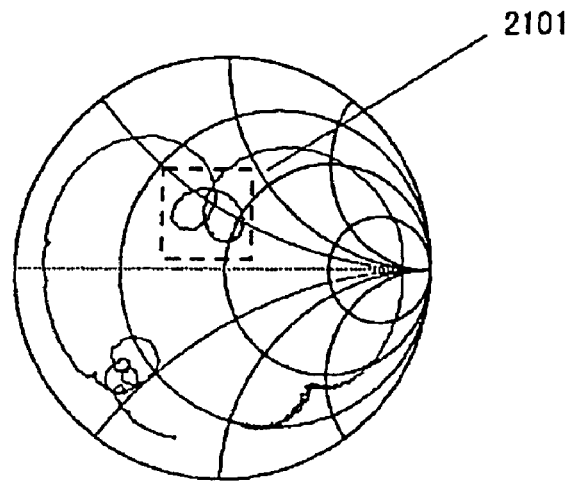
FIG. 21(a) is an impedance characteristic diagram when using the phase circuit 601 and FIG. 21(b) is an impedance characteristic diagram when using the phase circuit 2201.
Figure 21:
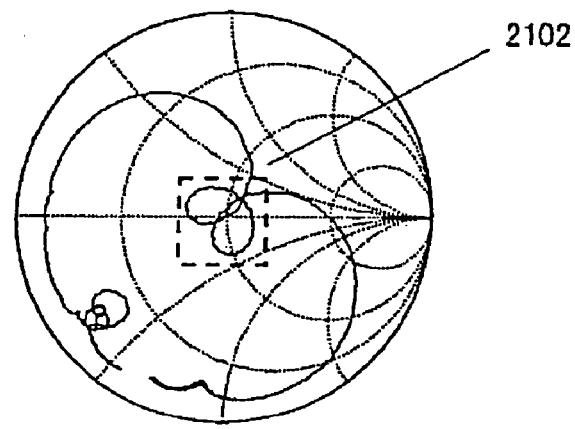
Figure 22:
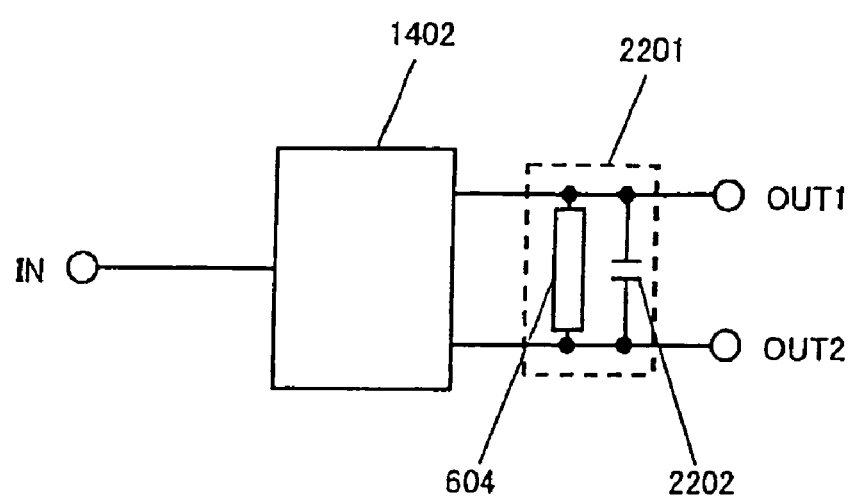
FIG. 22 is a block diagram in which a matching circuit is included in a phase circuit.

Moreover, though this embodiment is described by using a transmission line as a phase circuit, it is preferable that the transmission line substantially has a length of $\lambda/2$. This is because the phase circuit more frequently operates as an inductor or capacitor as the transmission-line length is shifted from $\lambda/2$ and the impedance of the pass-band frequency 2102 when viewing a balanced device from the output-terminal side is shifted from a matching state. For example, when the length of a transmission line is equal to $3\lambda/8$, the impedance of the passing band 2101 becomes inductive as shown in FIG. 21(*a*). In this case, as shown in FIG. 22, it is only necessary to connect the transmission line 604 as a phase circuit and a capacitor 2202 serving as a matching circuit between output terminals of a phase circuit 2201 in parallel. As shown in FIG. 21(b), by using the above configuration, the impedance of a pass-band vicinity 2102 when viewing a balanced device from the output-terminal side becomes the center of Smith chart and it is possible to realize impedance matching. Thus, it is allowed to constitute a phase circuit so as to include a matching circuit for performing impedance matching.

Moreover, the fact that the length of a transmission line is equal to $3\lambda/8$ is equivalent to the fact that the phase angle is $135°$ and approaches $180°$ by adding the above matching circuit and the length of the transmission line substantially approaches $\lambda/2$. Therefore, by adding the matching circuit, it is possible to decrease the length of the transmission line and downsize the configuration.

In the case of this embodiment, the phase circuit is constituted by using the transmission line or three impedance elements. However, the configuration of a phase circuit is not restricted to the above case. Moreover, the numbers of and configurations of inductors and capacitors serving as impedance elements are not restricted to the above case. By using a configuration operating as a phase circuit, the same advantage as the present invention can be obtained.

Moreover, it is allowed to form a phase circuit on a circuit substrate by using a transmission line and a chip component. It is also allowed to constitute a phase circuit on a substrate with a balanced device mounted or in a package. Moreover, it is allowed to form a part of a phase circuit in a laminated device constituted by forming electrode patterns on a plurality of dielectric layers and laminating the dielectric layers. Furthermore, by constituting the laminated device so as to have another circuit function and integrating a balanced high-frequency device of the present invention with the laminated device as a composite device, it is possible to realize a multifunctional compact balanced high-frequency device.

Though it is described that an input terminal is the unbalanced type and an output terminal is the balanced type in the case of this embodiment, it is allowed that the input terminal is the balanced type and the output terminal is the unbalanced type or both the input terminal and output terminal are the balanced type.

(Embodiment 7)

Figure 23:
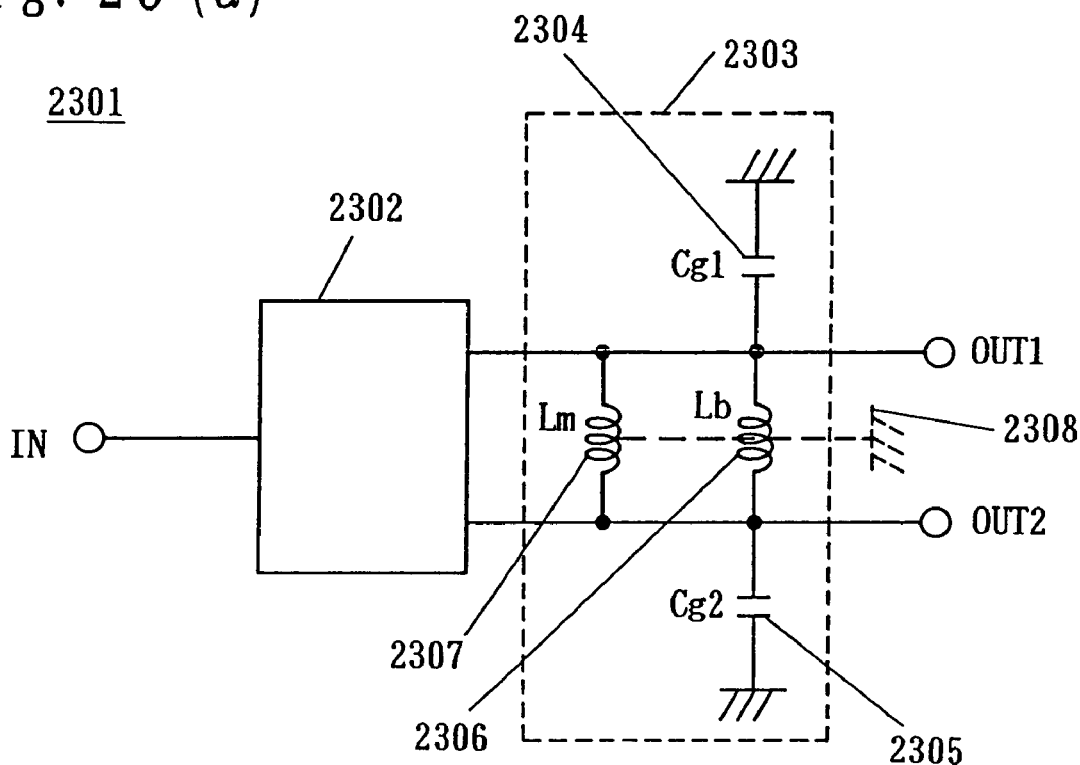
FIG. 23(a) is a block diagram of a balanced high-frequency device in the embodiment 7 of the present invention and FIG. 23(b) is a block diagram of a balanced high-frequency device having a phase circuit including a matching circuit.
Figure 23:
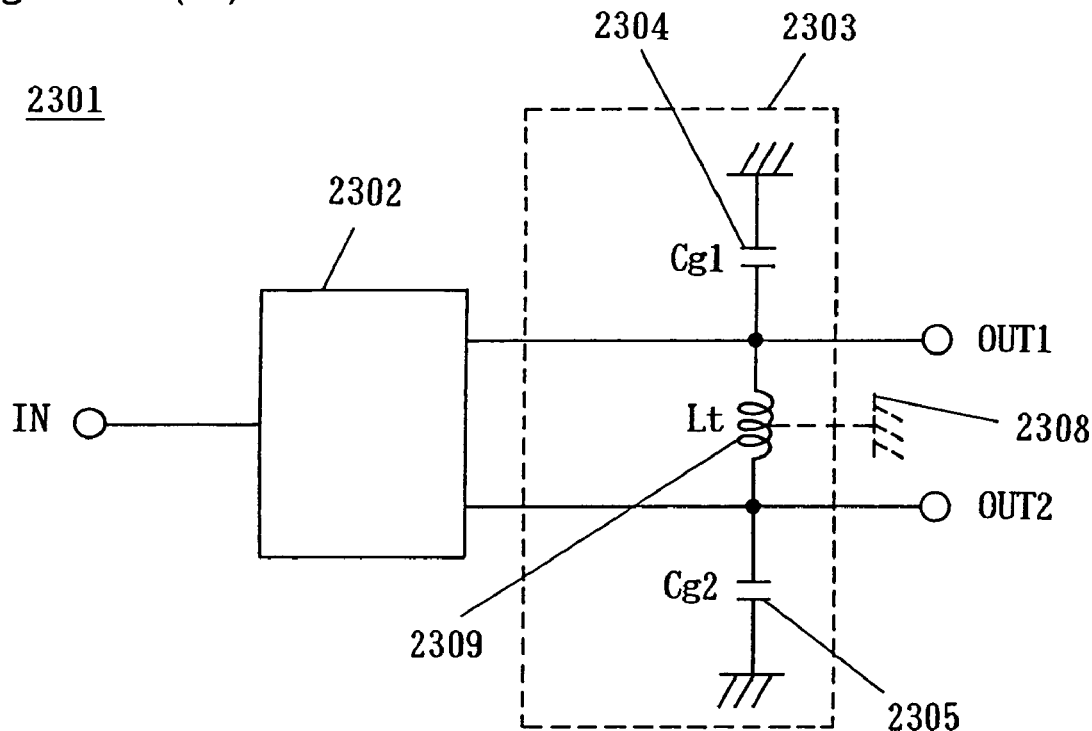

A balanced high-frequency device of embodiment 7 of the present invention is described below by referring to the accompanying drawings. A specific configuration when a matching circuit is included in a phase circuit is described below. FIG. 23(a) shows a configuration of the balanced high-frequency device of the embodiment 7 of the present invention. In FIG. 23(a), a balanced high-frequency device 2301 is constituted by a balanced device 2302 and a phase circuit 2303. Moreover, in the balanced device 2302, the input-side terminal is an input terminal IN serving as an unbalanced input/output terminal and output-side terminals are output terminals OUT1 and OUT2 serving as balanced input/output terminals. Moreover, the phase circuit 2303 is connected between the output terminals.

The phase circuit 2303 is constituted by capacitors 2304 and 2305 and an inductor 2306 serving as impedance elements and an inductor 2307 serving as a matching circuit. In this case, the output terminals OUT1 and OUT2 are grounded through the capacitors 2304 and 2305 respectively, the inductor 2306 is connected between the output terminals, and the phase circuit 2303 is connected between the output terminals. Moreover, the inductor 2307 serving as a matching circuit is included in the phase circuit 2303.

The inductor 2306 forms a virtual ground point 2308 on a differential-mode signal component. Therefore, the capacitor 2304 and a part of the inductor 2306 form a parallel resonant circuit to a ground plane at the output terminal OUT1 and the capacitor 2304 and a part of the inductor 2306 form a parallel resonant circuit to a ground plane at the output terminal OUT2. By designing parallel resonant frequencies of the parallel resonant circuits so that they are kept in a passing band or nearby the passing band, the impedance of a differential-mode signal component at a predetermined frequency approaches infinity to a ground plane and transferred to an output terminal without being shorted to the ground plane. That is, operations substantially same as those shown in FIG. 7(c) are executed on the differential-mode signal component.

Moreover, the inductor 2306 does not form a virtual ground point on common-mode signal component. Therefore, by designing impedances of the capacitors 2304 and 2305 serving as impedance elements arranged between the balanced input/output terminals OUT1 and OUT2 and ground planes to sufficiently small values, the common-mode signal component is shorted to a ground plane and thereby, it is not transferred to a balanced input/output terminal.

As described above, in the case of the phase circuit 2303 of this embodiment, a resonant circuit at a predetermined frequency is constituted by the capacitors 2304 and 2305 and the inductor 2306 and the inductor 2307 serving as a matching circuit is included. Also in this case, common-mode signal components are reduced and it is possible to realize a balanced high-frequency device having excellent balance-characteristics.

Moreover, it is possible to incorporate the inductor 2307 into the inductor 2306. That is, it is enough to use a combined inductance 2309 of the inductors 2306 and 2307. In this case, because the inductors 2306 and 2307 are connected in parallel, the expression $Lt=(Lb \times Lm)/(Lb+Lm)$ is effectuated when assuming inductances of the inductors 2306 and 2307 and combined inductor 2309 as Lb, Lm, and Lt respectively. Thus, it is possible to decrease values of the inductances. Moreover, it is possible to decrease the number of devices and downsize a circuit configuration.

In this case, however, the meaning of a predetermined frequency differs. That is, when assuming capacitances of the capacitors 2304 and 2305 as Cg1 and Cg2, parallel resonant frequencies f1 and f2 of differential-mode signal components at each output terminal in a matching state formed by the capacitors 2304 and 2305 and inductor 2306 become $f1=1/\{2\pi \times \sqrt{(Lb/2)} \times \sqrt{(Cg1)}\}$ and $f2=1/\{2\pi \times \sqrt{(Lb/2)} \times \sqrt{(Cg2)}\}$. In this case, by including the inductor 2307 serving a matching circuit, the whole parallel resonant frequencies f1t and f2t become $f1t=1/\{2\pi \sqrt{(Lt/2)} \times \sqrt{(Cg1)}\}$ and $f2t=1/\{2\pi \times \sqrt{(Lt/2)} \times \sqrt{(Cg2)}\}$ and thus, they are apparently shifted from predetermined frequencies.

That is, the whole parallel resonant frequency of the phase circuit 2303 is shifted from a pass band or the vicinity of the pass band by a value equivalent to the inductor Lm. However, the effect that common-mode signal component can be reduced is the same when the capacitor 2304 and a part of the inductor 2306 form a parallel resonant circuit to a ground plane at the output terminal OUT1 and the capacitor 2305 and a part of the inductor 2306 form a parallel resonant circuit to a ground plane in a matching state and the impedance to ground planes of the capacitors 2304 and 2305 are sufficiently small. In this case, a part of the inductor 2306 denotes a range up to a virtual ground plane.

However, the circuit configuration of this embodiment is not restricted to the above case. As long as operations of a matching circuit and operations of a resonant circuit are substantially the same as the case of the present invention, it is possible to realize a balanced high-frequency device having excellent balance-characteristics similarly to the case of the present invention.

Moreover, though values Cg1 and Cg2 of capacitors serving as impedance elements are assumed to be substantially the same and values Lg1 and Lg2 of inductors serving as impedance elements are assumed to be substantially the same, it is not always necessary that these values are the same but they are optimally selected in accordance with a circuit configuration.

(Embodiment 8)

Figure 24:
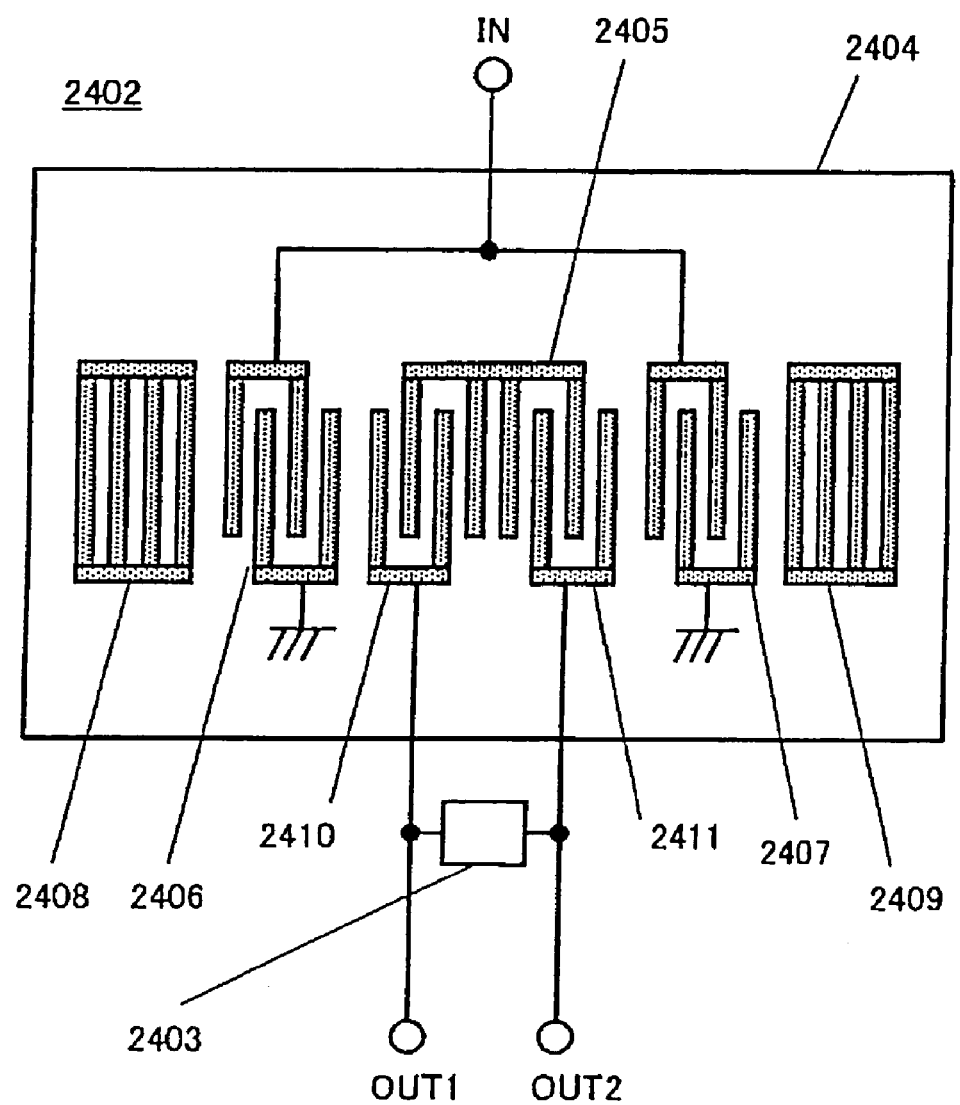
FIG. 24 is a block diagram of a balanced high-frequency device in the embodiment 8 of the present invention.

A balanced high-frequency device of embodiment 8 of the present invention is described below by referring to the accompanying drawings. Specific characteristics of the balanced high-frequency device are described below on a case of using an surface acoustic wave filter as a balanced device. FIG. 24 shows a configuration of a balanced high-frequency device 2401 of the present invention. In FIG. 24, the balanced high-frequency device 2401 is constituted by surface acoustic wave filter 2402 serving as a balanced device and a phase circuit 2403. Moreover, in the case of the surface acoustic wave filter 2402, the input-side terminal is an input terminal IN serving as an unbalanced input/output terminal and output-side terminals are output terminals OUT1 and OUT2 serving as balanced input/output terminals. Moreover, the phase circuit 2403 is connected between the output terminals.

The surface acoustic wave filter 2402 is formed on a piezoelectric substrate 2404 by first, second, and third inter-digital transducer electrodes (hereafter respectively referred to as IDT electrode) 2405, 2406, and 2407 and first and second reflector electrodes 2408 and 2409. The first IDT electrode 2405 is divided into two divided IDT electrodes and one-hand electrode fingers of the first and second divided IDT electrodes 2410 and 2411 are connected to the output terminals OUT1 and OUT2. The other-hand electrode fingers of the first and second divided IDT electrodes 2410 and 2411 are electrically connected and virtually grounded. Moreover, one-hand electrode fingers of the second and third IDT electrodes 2406 and 2407 are connected to the input terminal IN and the other-hand electrode fingers of them are grounded. By using the above configuration, it is possible to obtain a balanced high-frequency device having an unbalance-balanced input/output terminal.

Also in the case of the balanced high-frequency device 2401 of the embodiment 8 of the present invention, it is possible to reduce common-mode signal components by using the phase circuit 2403 and realize a balanced high-frequency device excellent in balance-characteristic.

In the case of this embodiment, it is also allowed to constitute a phase circuit by using a transmission line or three impedance elements. Moreover, a configuration of the phase circuit is not restricted to the above one. By using a configuration operating as a phase circuit, the same advantage as the present invention can be obtained. Moreover, the numbers of and configurations of inductors and capacitors serving as impedance elements are not restricted to the above mentioned. By using a configuration operating as a phase circuit, the same advantage as the present invention is obtained.

Moreover, it is allowed to form a phase circuit on a circuit substrate by using a transmission line and a chip component or form the phase circuit on a substrate with a balanced device mounted or in a package. Furthermore, it is allowed to form a part of the phase circuit in a laminated device constituted by forming electrode patterns on a plurality of dielectric layers and laminating the dielectric layers. Furthermore, by constituting the laminated device so as to have another circuit function and integrating the laminated device with a balanced high-frequency device of the present invention as a composite device, it is possible to realize a multifunctional compact balanced high-frequency device.

Though it is described that an input terminal is the unbalanced type and an output terminal is the balanced type in the case of this embodiment, it is allowed that the input terminal is the balanced type and the output terminal is the unbalanced type. Moreover, it is allowed that both the input and output terminals are the balanced type.

(Embodiment 9)

Figure 25:
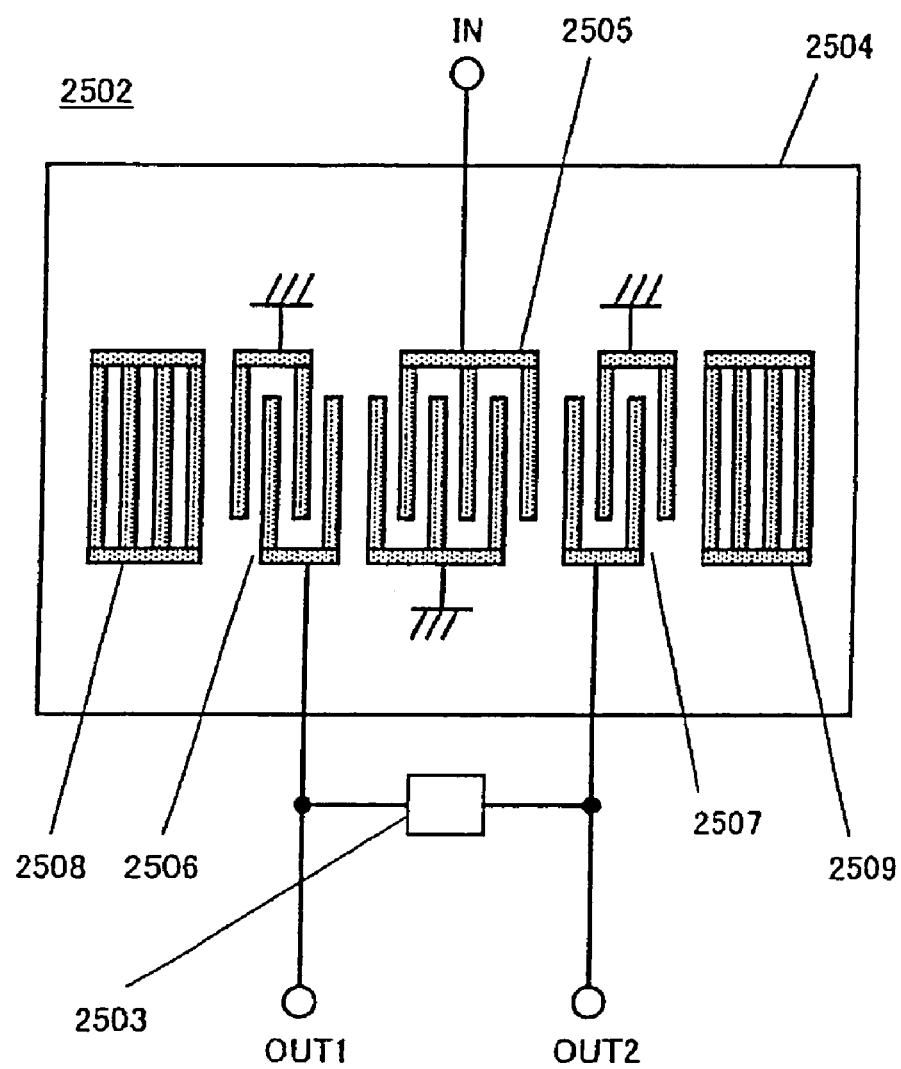
FIG. 25 is a block diagram of a balanced high-frequency device in the embodiment 9 of the present invention.

A balanced high-frequency device of embodiment 9 of the present invention is described below by referring to the accompanying drawings. Specific characteristics of the balanced high-frequency device are described below on a case of using surface acoustic wave filter as a balanced device. FIG. 25 shows a configuration of a balanced high-frequency device 2501 of the embodiment 9 of the present invention. In FIG. 25, the balanced high-frequency device 2501 is constituted by an surface acoustic wave filter 2502 serving as a balanced device and a phase circuit 2503. Moreover, in the case of the surface acoustic wave filter 2502, the input-side terminal is an input terminal IN serving as an unbalanced input/output terminal and output-side terminals are output terminals OUT1 and OUT2 serving as balanced terminals. Furthermore, the phase circuit 2503 is connected between the output terminals.

The surface acoustic wave filter 2502 is formed on a piezoelectric substrate 2504 by first, second, and third inter-digital transducer electrodes (hereafter respectively referred to as IDT electrode) 2505, 2506, and 2507 and first and second reflector electrodes 2508 and 2509. One-hand electrode finger of the first IDT electrode is connected to the input terminal IN and the other-hand electrode finger of it is grounded. One-hand electrode fingers of the second and third IDT electrodes 2506 and 2507 are connected to the output terminals OUT1 and OUT2 and the other-hand electrode fingers of them are grounded. By using the above configuration, a balanced high-frequency device having an unbalanced-balanced input/output terminal is obtained.

Also in the case of the balanced high-frequency device 2501 of the present invention, it is possible to reduce common-mode signal components by using the phase circuit 2503 and therefore, realize a balanced high-frequency device excellent in balance-characteristic.

In the case of this embodiment, a phase circuit is provided by using a transmission line or three impedance elements. Moreover, a configuration of the phase circuit is not restricted to the above case. By using a configuration operating as a phase circuit, the same advantage as the present invention is obtained. Furthermore, the numbers of and configurations of inductors and capacitors serving as impedance elements are not restricted to the above case. By using a configuration operating as a phase circuit, the same advantage as the present invention is obtained.

Furthermore, a phase circuit may be formed on a circuit substrate by using a transmission line or a chip component or integrate the phase circuit on a substrate with a balanced device mounted or in a package. Furthermore, a part of the phase circuit may be formed in a laminated device constituted by forming electrode patterns on a plurality of dielectric layers and laminating the dielectric layers. Furthermore, by forming the laminated device so as to have another circuit function and integrating a balanced high-frequency device of the present invention with the laminated device as a composite device, it is possible to realize a multifunctional compact balanced high-frequency device.

Though it is described that an input terminal is the unbalanced type and an output terminal is the balanced type in the case of this embodiment, the input terminal may be the balanced type and the output terminal the unbalanced type. Moreover, both the input and output terminals may be the balanced type.

(Embodiment 10)

Figure 26:
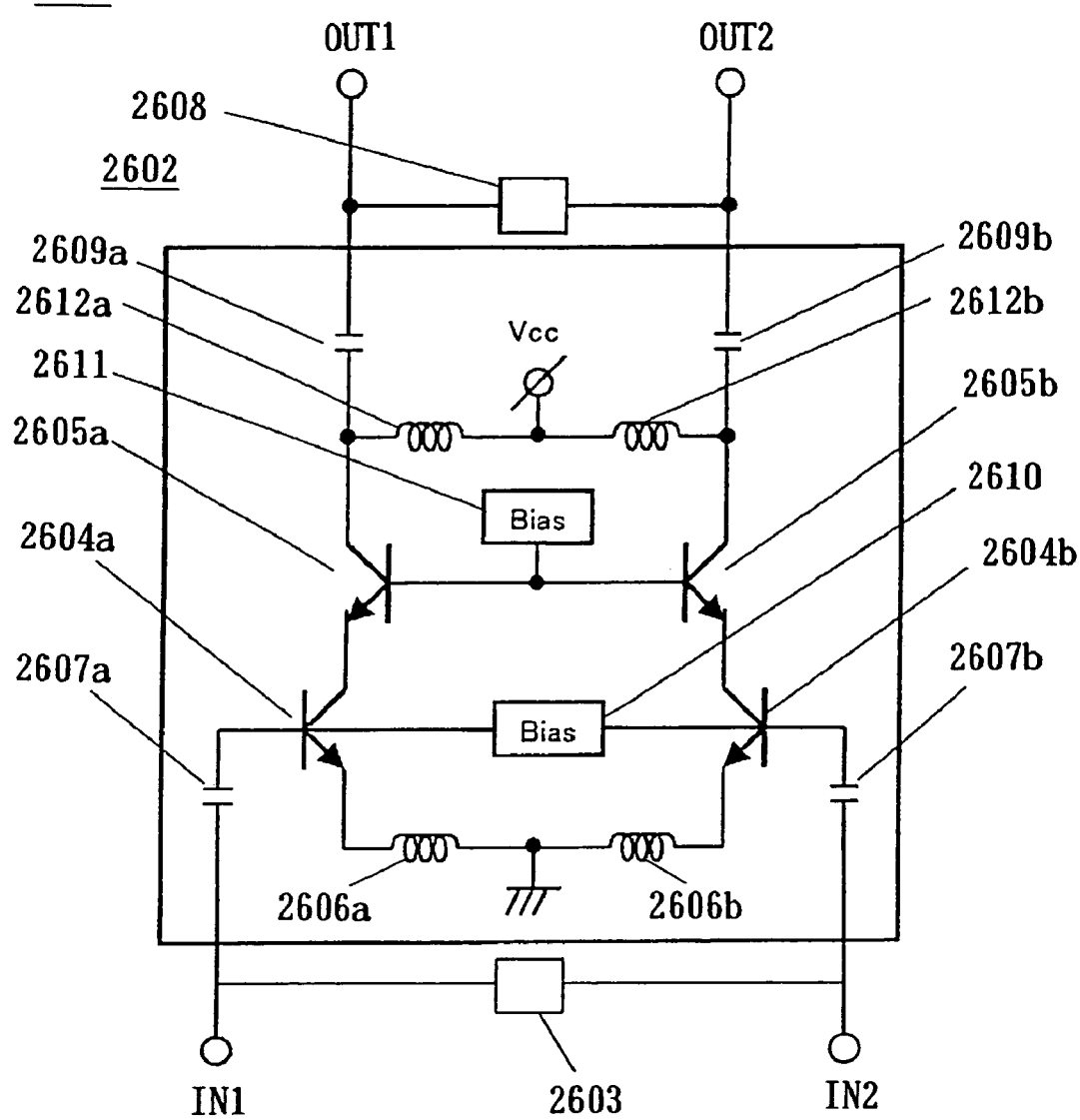
FIG. 26 is a block diagram of a balanced high-frequency device in the embodiment 10 of the present invention.

A balanced high-frequency device of embodiment 10 of the present invention is described below by referring to the accompanying drawings. FIG. 26 shows a configuration of a balanced high-frequency device 2601 of the embodiment 10 of the present invention. For FIG. 26, a specific configuration of the balanced high-frequency device is described on a case of using a semiconductor device as the balanced device. In FIG. 26, the balanced high-frequency device 2601 is constituted by a semiconductor device 2602 serving as a balanced device and phase circuits 2603 and 2608. Moreover, in the case of the semiconductor device 2602, input-side terminals are input terminals IN1 and IN2 serving as balanced input/output terminals and output-side terminals are output terminals OUT1 and OUT2 serving as balanced terminals. Furthermore, the phase circuit 2603 is connected between the input terminals and the phase circuit 2608 is connected between the output terminals.

Then, a configuration of the semiconductor device 2602 is described below. Symbols 2604a, 2604b, 2605a, and 2605b denote bipolar transistors and 2606a and 2606b denote inductors. The input terminal IN1 is connected to the base of the bipolar transistor 2604a through a DC-cut capacitor 2607a and the input terminal IN2 is connected to the base of the bipolar transistor 2604b through a DC-cut capacitor 2607b. Collectors of the bipolar transistors 2604a and 2604b are connected to emitters of the bipolar transistors 2605a and 2605b respectively and collectors of the bipolar transistors 2605a and 2605b are connected to the output terminals OUT1 and OUT2 through DC-cut capacitors 2609a and 2609b respectively. Emitters of the bipolar transistors 2604a and 2604b are grounded through the inductors 2606a and 2606b respectively. A bias circuit 2610 supplies a bias current to bases of the bipolar transistors 2604a and 2604b. A bias circuit 2611 supplies a bias current to bases of the bipolar transistors 2605a and 2605b. A power-source voltage Vcc is supplied to collectors of the bipolar transistors 2605a and 2605b through choke inductors 2912a and 2912b respectively. By using the above configuration, a balanced semiconductor device operates as an amplifier.

Also in the case of the balanced high-frequency device 2601 of the embodiment 10 of the present invention, it is possible to reduce common-mode signal components by using the phase circuits 2603 and 2608 and therefore, realize a balanced high-frequency device excellent in balance-characteristic.

In this embodiment, a phase circuit may be formed by using a transmission line or three impedance elements. Moreover, a configuration of the phase circuit is not restricted to the above case. By using a configuration operating as a phase circuit, the same advantage as the present invention is obtained. Furthermore, the numbers of and configurations of inductors and capacitors serving as impedance elements are not restricted to the above case. By using a configuration operating as a phase circuit, the same advantage as the present invention is obtained.

A phase circuit on a circuit may be formed on a circuit substrate by using a transmission line or a chip component or integrate the phase circuit on a substrate with a balanced device mounted or in a package. Moreover, a part of the phase circuit may be formed in a laminated device by forming electrode patterns on a plurality of dielectric layers and laminating the dielectric layers.

Furthermore, by forming the laminated device so as to have another circuit function and integrating a balanced high-frequency device of the present invention with the laminated device as a composite device, it is possible to realize a multifunctional compact balanced high-frequency device.

Furthermore, in the case of this embodiment, it is described that input and output terminals are the balanced type. However, either of the input and output terminals may be the unbalanced type and the other of them is the balanced type.

Furthermore, in the case of this embodiment, a semiconductor device is formed by four bipolar transistors. However, a configuration of the semiconductor device is not restricted to the above case.

Furthermore, for this embodiment, a case is described in which the semiconductor device 2602 is an amplifier. However, the semiconductor device 2602 is not restricted to an amplifier. The semiconductor device 2602 may be a mixer or oscillator. In short, the semiconductor device 2602 is permitted as long as it is a semiconductor device having a balanced terminal.

(Embodiment 11)

Figure 27:
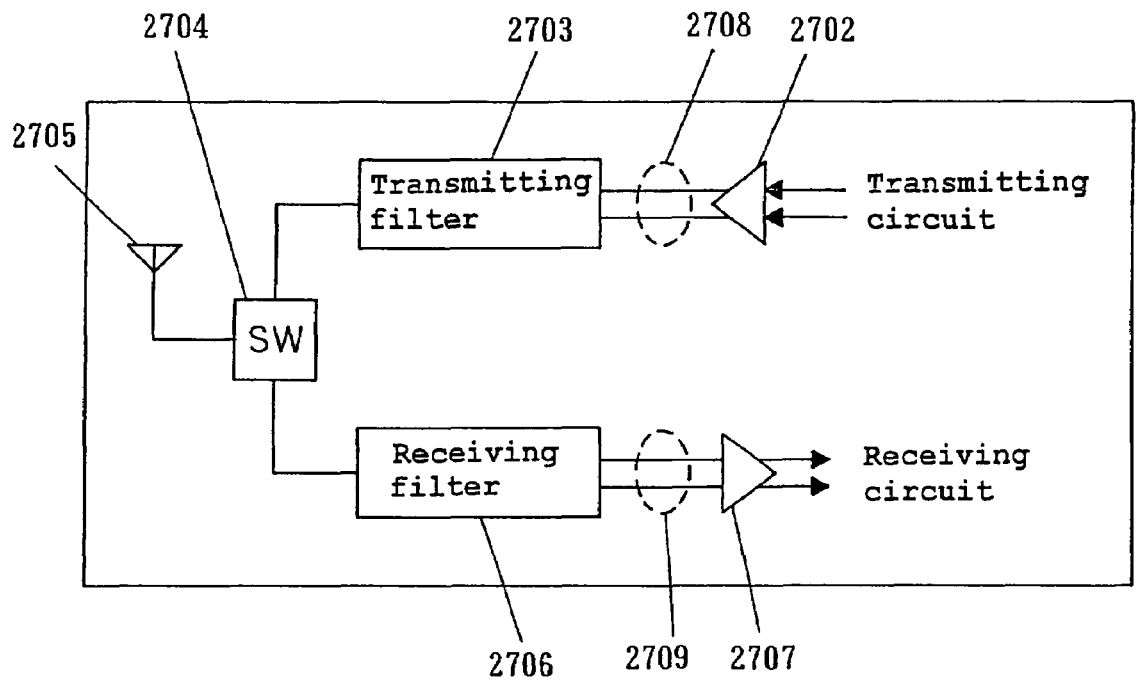
FIG. 27 is a block diagram of a balanced high-frequency circuit in the embodiment 11 of the present invention.
Figure 28:
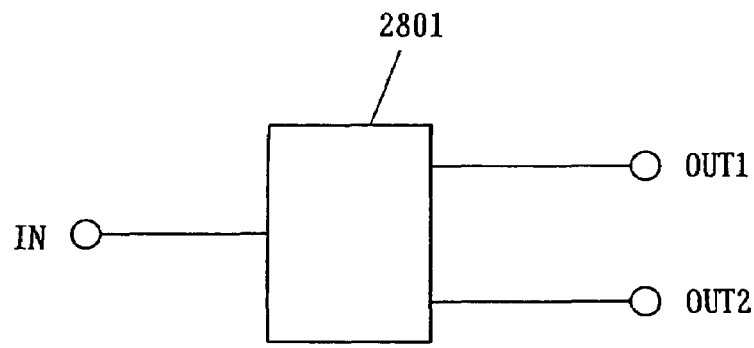
FIG. 28 is a block diagram of a conventional balanced high-frequency device.

A balanced high-frequency circuit of embodiment 11 of the present invention is described below by referring to the accompanying drawings. FIG. 27 is a block diagram of a balanced high-frequency circuit 2701 using a balanced device of the present invention. In FIG. 27, an output signal output from a transmitting circuit is transmitted from an antenna 2705 through a transmitting amplifier 2702, a transmitting filter 2703 and a switch 2704. Moreover, an input signal received through the antenna 2705 is input to a receiving circuit through the switch 2704, a receiving filter 2706, and a receiving amplifier 2707. In this case, because the transmitting amplifier 2702 is the balanced type and the switch 2704 is the unbalanced type, the transmitting filter 2703 is constituted so as to have an unbalanced-balanced input/output terminal. Furthermore, because the receiving amplifier 2707 is the balanced type and the switch 2704 is the unbalanced type, the receiving filter 2706 is constituted so as to have an unbalanced-balanced input/output terminal.

By applying a balanced device of the present invention to the transmitting filter 2703 or receiving filter 2706 of the balanced high-frequency circuit 2701 and a balanced high-frequency device of the present invention to the transmitting amplifier 2702 or receiving amplifier 2707, it is possible to prevent modulation accuracy deterioration at the time of transmission due to deterioration of a balance-characteristic and sensitivity deterioration at the time of reception due to deterioration of a balance-characteristic and realize a high-performance balanced high-frequency circuit.

Moreover, when the switch 2704 is the balanced type and the transmitting amplifier 2702 or receiving amplifier 2707 is the unbalanced type, the same advantage is obtained by replacing balanced-type and unbalanced-type input/output terminals of the transmitting filter 2703 or receiving filter 1006 with each other.

Though means of switching transmission and reception is described by using the switch 2704 in the case of the balanced high-frequency circuit 2701, the means may use a duplexer.

Moreover, a phase circuit of the present invention may be formed on a circuit substrate in the case of the balanced high-frequency circuit of this embodiment. For example, in FIG. 27, by forming the phase circuit between balanced transmission lines 2708 and 2709 on the circuit substrate, it is possible to prevent balance-characteristic deterioration due to the crosstalk of common-mode signal components and realize an excellent balanced high-frequency circuit.

Furthermore, embodiments of the present invention are described by using surface acoustic wave filter or semiconductor device as a balanced high-frequency device. However, the present invention can be applied not only to the above case but also to another device which balance-operates.

Furthermore, on a device for handling a high-frequency signal, parasitic components increase as a frequency rises, common-mode signal component increase due to crosstalk, and deterioration of balance-characteristics increases. Therefore, advantages of a balanced high-frequency device of the present invention increase as a frequency rises and it is possible to downsize a transmission line and an impedance element for forming a phase circuit.

As described above, the present invention makes it possible to provide a balanced high-frequency device having preferable balance-characteristics, balanced high-frequency circuit, phase circuit, and balance-characteristics improving method.

(Embodiment 12)

Figure 33:
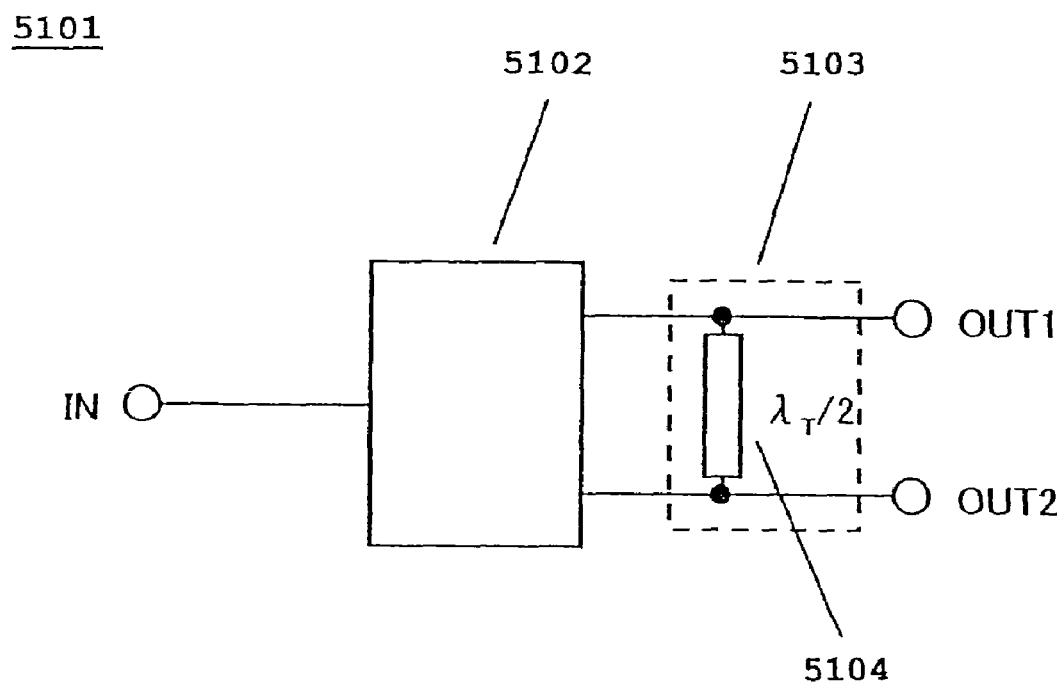
FIG. 33 is a diagram showing the configuration of a balanced high-frequency filter in embodiment 12 of the present invention.

FIG. 33 is a diagram showing the configuration of a balanced high-frequency filter in embodiment 12 of the present invention. Referring to FIG. 33, the balanced high-frequency filter 5101 is constituted by a balanced high-frequency element 5102 and a phase-shifting circuit 5103. The phase-shifting circuit 5103 is constituted by a transmission line 5104 and placed between output terminals. The length of the transmission line 5104 is $\lambda_T/2$ ($\lambda_T$ is the wavelength at a frequency in a transmission frequency band). In this embodiment, a transmission frequency band (880 to 915 MHz) used in a global system for mobile communication (GSM system) is used.

Figure 30:
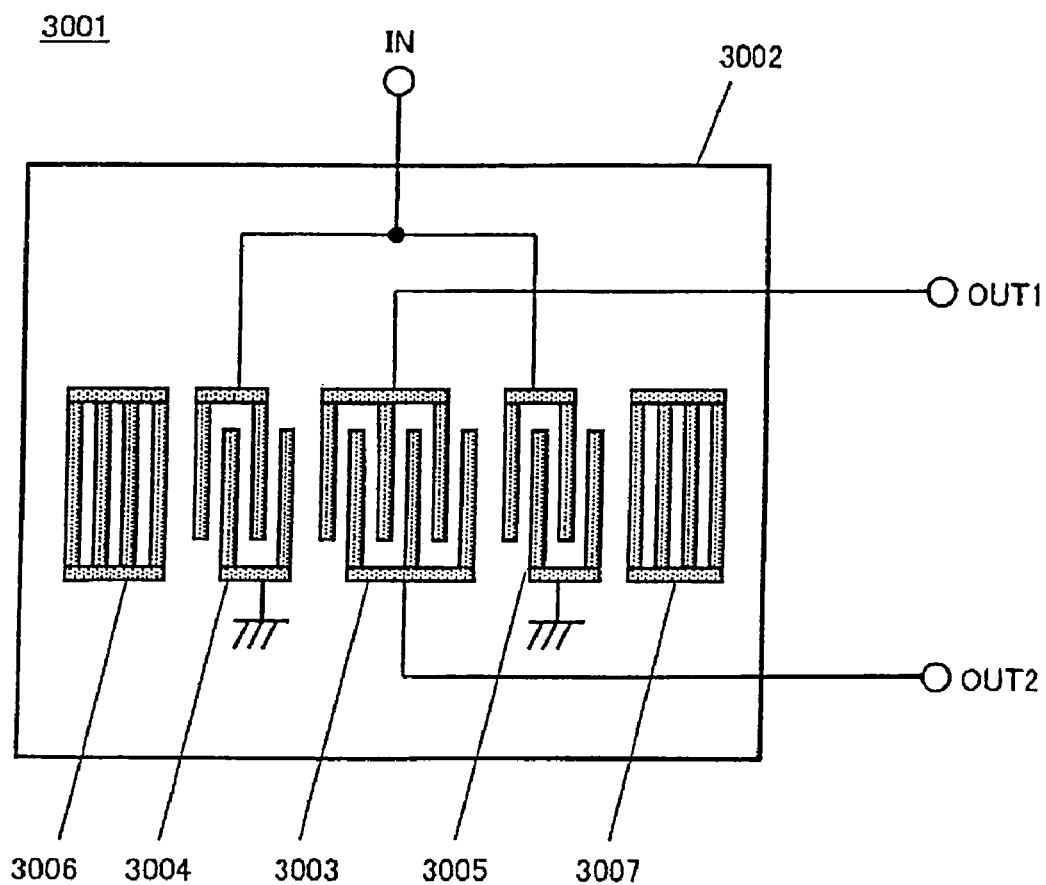
FIG. 30 is a block diagram of a conventional surface acoustic wave filter.
Figure 34A:
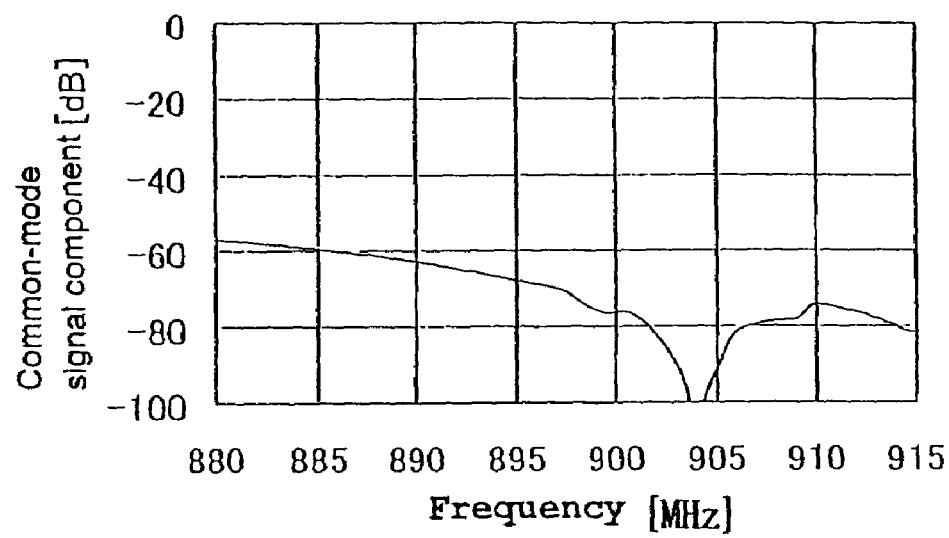
FIG. 34(*a*) is a diagram showing a characteristic of common-mode signal components in the balanced high-frequency filter in embodiment 12 of the present invention.
Figure 34B:
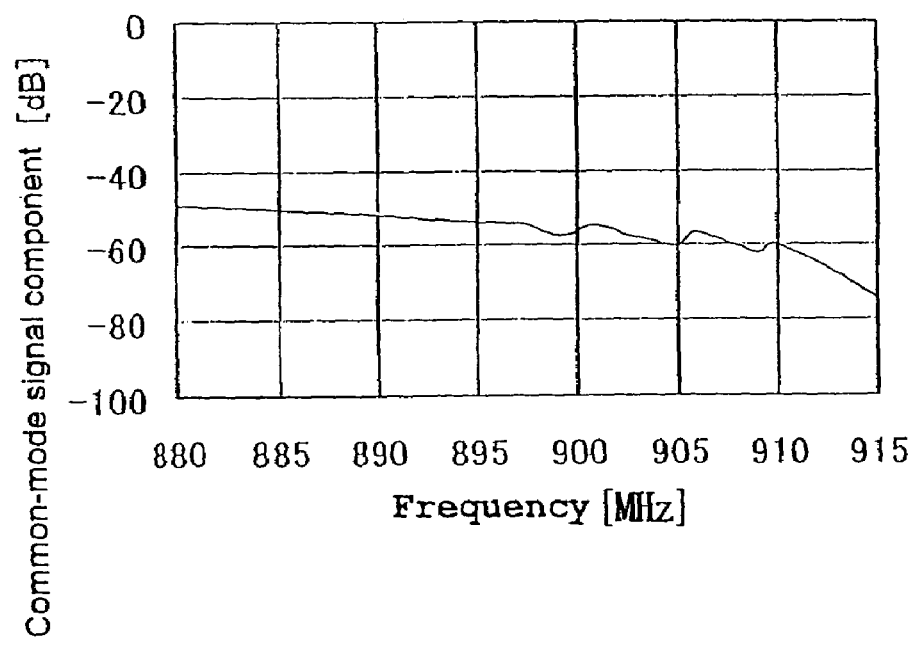

FIGS. 34(*a*) shows a characteristic of common-mode signal components in the transmission frequency band in a case where the length $\lambda_T$ corresponds to 904 MHz and where a surface acoustic wave filter having a characteristic shown in FIG. 30 is used as the balanced high-frequency element. According to FIG. 34(*a*), the common mode signal component characteristic is markedly improved in comparison with a characteristic in the conventional art shown in FIG. 49. FIG. 34(*b*) shows a characteristic of common-mode signal components in the transmission frequency band in a case where the arrangement shown in FIG. 30 is used and where the length of the transmission line is $\lambda_R$ corresponding to 942.5 MHz in a reception frequency band. According to FIG. 34, the characteristic of common-mode signal components is improved in comparison with the conventional art when the length of the transmission line is $\lambda_T/2$.

Figure 35A:
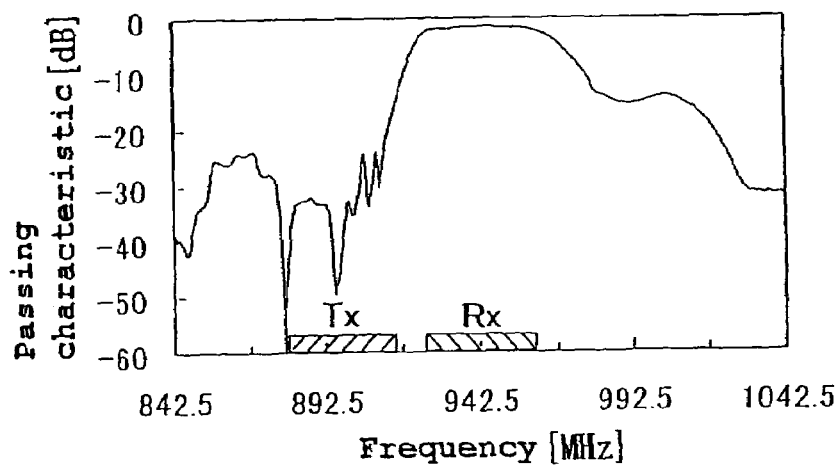
FIG. 35(*a*) is a diagram showing a passing characteristic of the balanced high-frequency filter in embodiment 12 of the present invention.
Figure 35:
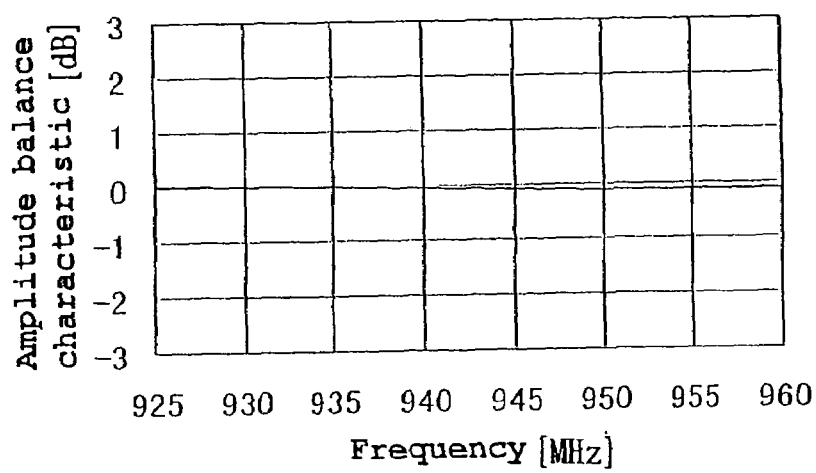
Figure 35:
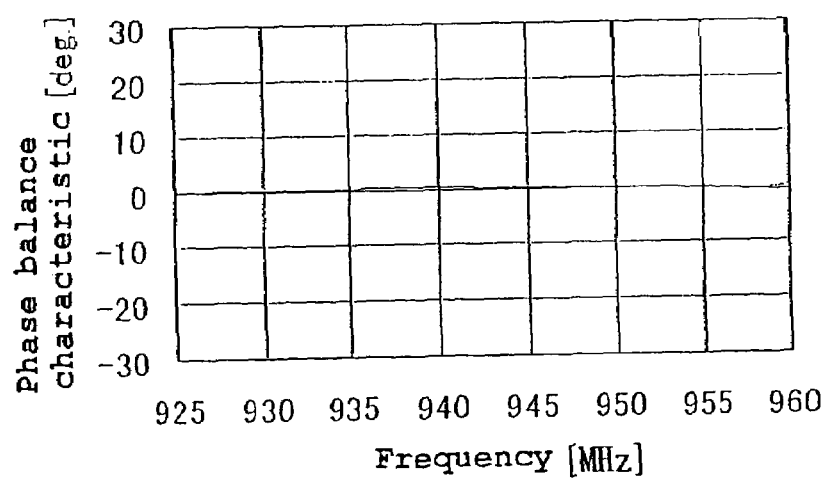

FIGS. 35(*a*), 35(*b*), and 35(*c*) show characteristics of the balanced high-frequency device 5101. FIG. 35(*a*) shows a passing characteristic, FIG. 35(*b*) an amplitude balance characteristic in a pass band, FIG. 35(*c*) a phase balance characteristic in the pass band. In FIG. 35(*a*), Tx is the transmission frequency band used in the GSM system and Rx is the reception frequency band used in the GSM system. The passing characteristic is a characteristic of differential-mode signal components in a balanced terminal, and the pass band is the reception frequency band Rx. According to FIGS. 35(*b*) and 35(*c*), the balance characteristics are markedly improved in comparison with the characteristics in the case of the conventional art shown in FIG. 32(*a*) to 32(*c*). In the balanced high-frequency filter of the present invention arranged as described above, the length of the transmission line provided as a phase-shifting circuit is $\lambda_T/2$ and the corresponding frequency is set in a transmission frequency band, thereby reducing common-mode signal components in the transmission frequency band without deteriorating the passing characteristics and the balance characteristics in the reception frequency band. Thus, a balanced high-frequency filter having improved characteristics in a pass band and outside the pass band can be realized.

While this embodiment has been described by way of example with respect to a case where the balanced high-frequency element constituting the balanced high-frequency filter is a surface acoustic wave filter, this arrangement is not exclusively used. According to the present invention, the same effect can also be obtained by using any balanced high-frequency element if common-mode signal components in a transmission frequency band output from a balanced high-frequency element are reduced by a phase-shifting circuit, and if the balanced high-frequency element has balanced terminals.

Figure 36:
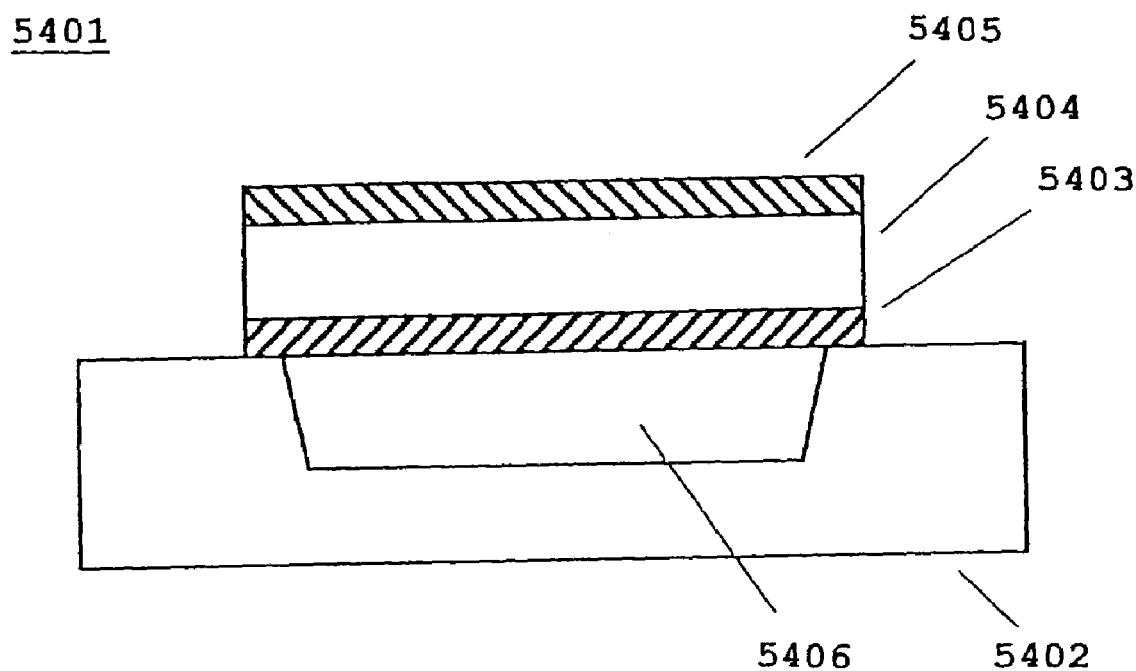
FIG. 36 is a diagram showing the configuration of FBAR in embodiment 12 of the present invention.

The balanced high-frequency element may be a filter using an FBAR. FIG. 36 shows the configuration of an FBAR. Referring to FIG. 36, the FBAR 5401 includes a lower electrode 5403, a piezoelectric thin film 5404 and an upper electrode 5405 formed on a substrate 5402. A cavity 5406 is provided in the substrate 5402 below the lower electrode, thereby realizing an energy confinement type of resonator. The lower electrode 5403 and the upper electrode 5405 correspond to the input and output electrode of the FBAR single unit. Si, sapphire or the like is used for the substrate 5402. Al, Mo, Au, Cu, Ti or the like is used for the lower electrode 5403 and the upper electrode 5405. In addition, AlN, ZnO or the like is used for the piezoelectric thin film 5404. The FBAR is thus formed. A balanced high-frequency filter formed by applying a ladder filter or a mode-coupling filter using this FBAR to the balanced high-frequency element of the present invention can have the same advantage of the balanced high-frequency filter of the present invention. The construction of the FBAR is not limited to that described above. For example, an FBAR using an acoustic mirror may be used.

Figure 37:
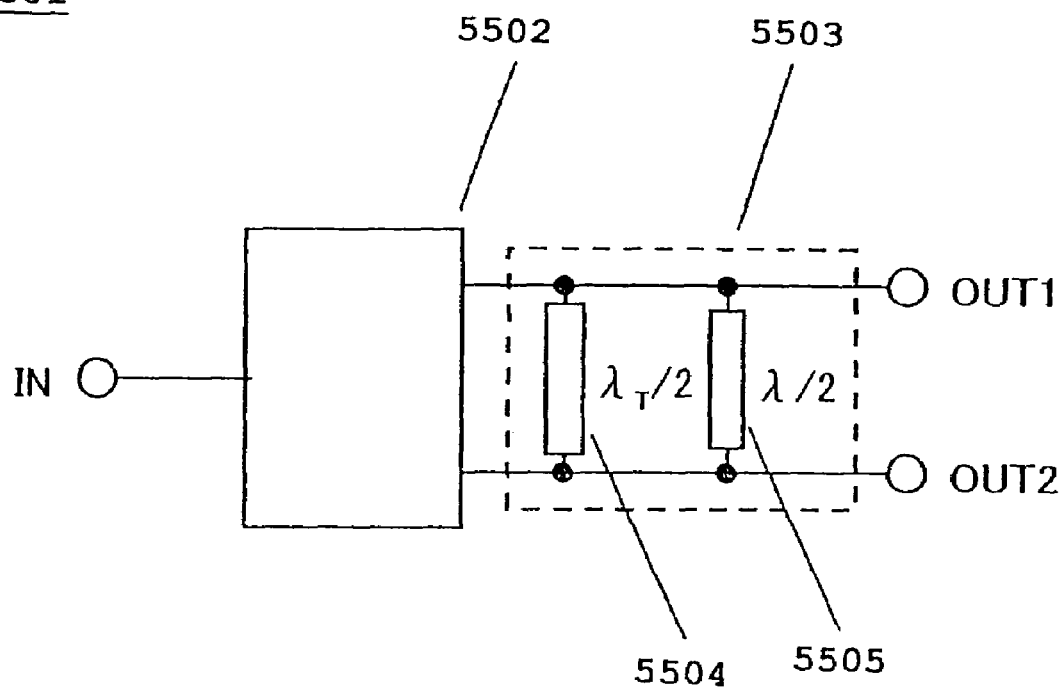
FIG. 37 is a diagram showing another configuration of balanced high-frequency filter in embodiment 12 of the present invention.

While this embodiment has been described with respect to a case where one transmission line is provided as a phase-shifting circuit, a combination of a plurality of transmission lines may be used. FIG. 37 shows another configuration of high-frequency filter in embodiment 12 of the present invention. Referring to FIG. 37, the high-frequency filter 5501 is constituted by a balanced high-frequency element 5502 and a phase-shifting circuit 5503. The phase-shifting circuit 5503 is constituted by transmission lines 5504 and 5505 and placed between output terminals. The length of the transmission line 5504 is $\lambda_T/2$ ($\lambda_T$ is the wavelength at a frequency in a transmission frequency band), while the length of the transmission line 5504 is $\lambda/2$. A length corresponding to a frequency different from the transmission frequency band may be selected as $\lambda$ to improve the characteristics of common-mode signal components at frequencies outside the transmission frequency band. For example, if $\lambda$ corresponds to a frequency in a reception frequency band, i.e., a pass band, the passing characteristic can be further improved. If λ corresponds to a frequency in a transmission frequency band of another system, interference waves of common-mode signal components coming from the another system by crosstalk or the like can be reduced. Thus, common-mode signal components of a plurality of systems can be reduced by selecting settings of the number of lengths λ and frequencies.

Figure 38A:
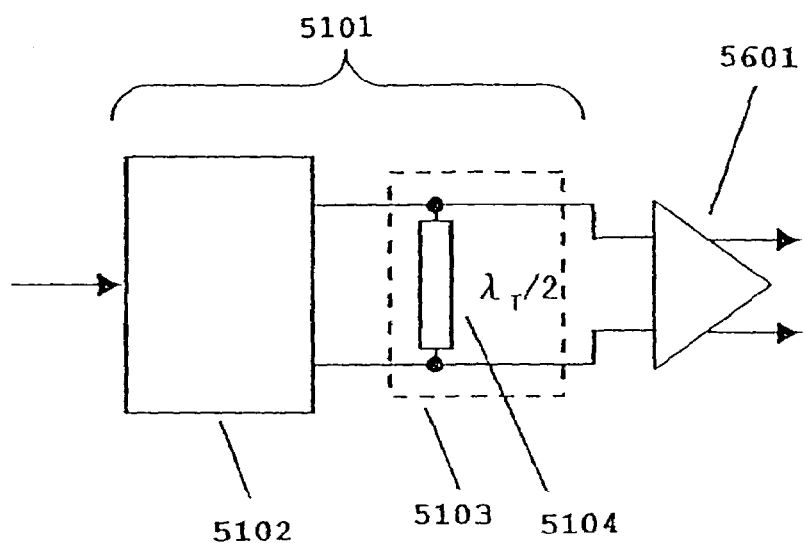
FIG. 38(*a*) is a diagram showing the configuration of connections in the balanced high-frequency filter in embodiment 12 of the present invention.
Figure 38B:
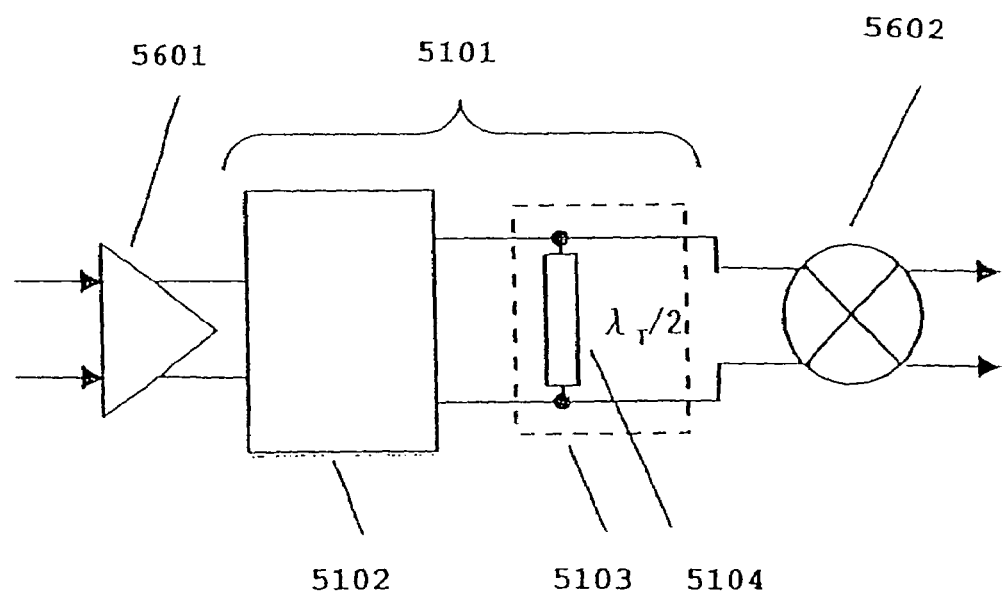

The balanced high-frequency filter of the present invention is used by being connected to a low-noise amplifier or a mixer. FIG. 38(a) is a diagram showing the configuration of a balanced high-frequency filter 5101 and a low-noise amplifier 5601. A phase-shifting circuit 5103 is connected between balanced terminals through which the balanced high-frequency filter 5101 and the low-noise amplifier 5601 are connected to each other. This arrangement ensures that common-mode signal components in a transmission frequency band can be reduced; saturation and distortion in the low-noise amplifier can be reduced; and a communication apparatus having higher sensitivity can be implemented. FIG. 38(b) is a diagram showing the configuration of a balanced high-frequency filter 5101, a low-noise amplifier 5601 and a mixer 5602. A phase-shifting circuit 5103 is connected between balanced terminals through which the low-noise amplifier 5601 and the mixer 5602 are connected to each other. This arrangement ensures that common-mode signal components in a transmission frequency band can be reduced; distortion in the mixer can be reduced; and a communication apparatus having higher sensitivity can be implemented.

The first frequency band of the present invention corresponds to the reception frequency band in this embodiment, and the second frequency band of the present invention corresponds to the transmission frequency band in this embodiment. Also, in this embodiment, the first frequency band is a pass band, while the second frequency band is an attenuation band.

(Embodiment 13)

The configuration of a balanced high-frequency filter of the present invention is described below with reference to the drawings.

Figure 39:
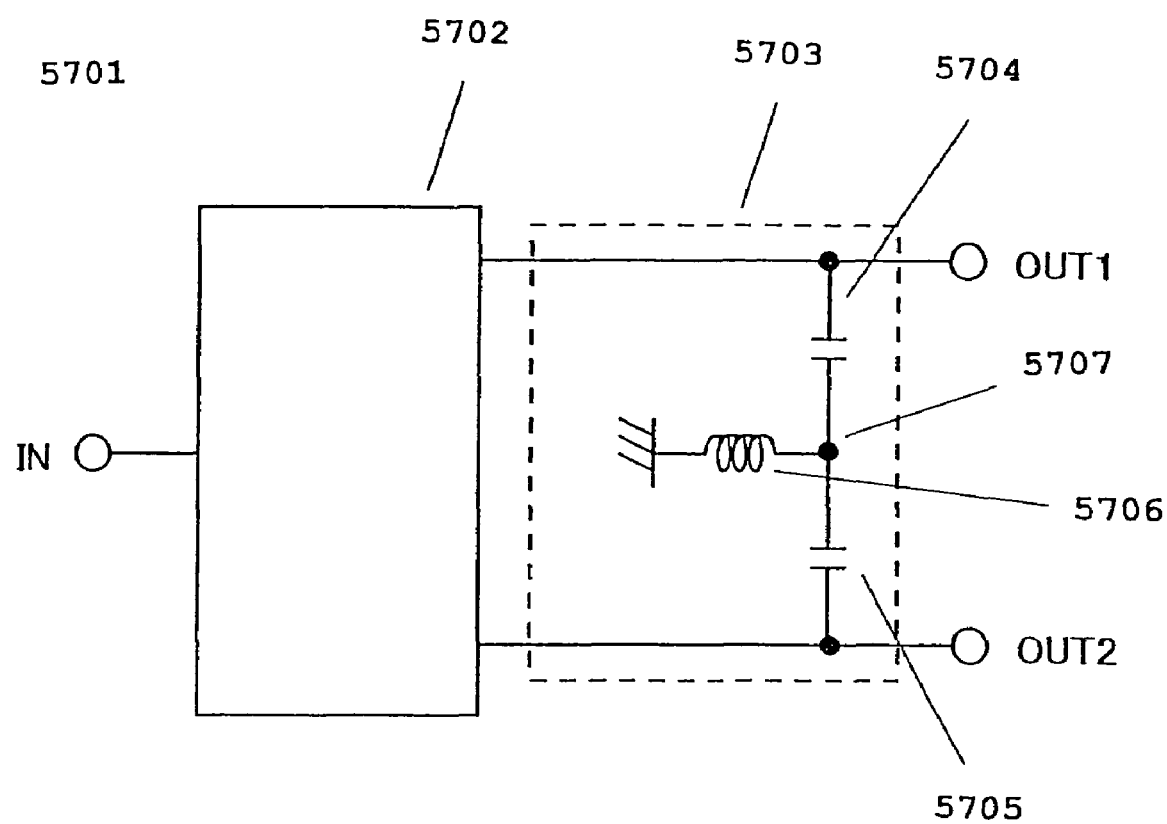
FIG. 39 is a diagram showing the configuration of a balanced high-frequency filter in embodiment 13 of the present invention.

FIG. 39 is a diagram showing the configuration of a balanced high-frequency filter 5701 in embodiment 13 of the present invention. Referring to FIG. 39, the balanced high-frequency filter 5701 is constituted by a balanced high-frequency element 5702 and a phase-shifting circuit 5703. In the balanced high-frequency element 5702, a terminal on the input side is an input terminal IN serving as an unbalanced input/output terminal, and terminals on the output side are output terminals OUT1 and OUT2 serving as balanced terminals.

The phase-shifting circuit 5703 is constituted by capacitors 5704 and 5705 and an inductor 5706 provided as impedance elements. The capacitors 5704 and 5705 are connected in series between the output terminals, and a connection point 5707 between the capacitors 5704 and 5705 is grounded through the inductor 5706. Thus, the phase-shifting circuit 5703 is connected between the output terminals.

In the phase-shifting circuit shown in FIG. 39, the connection point 5707 between the capacitors 5704 and 5705 is a virtual ground point with respect to differential-mode signal components corresponding to the passing characteristic of the balanced high-frequency filter. Therefore, the impedance to the ground plane can be increased by setting the value of the capacitors 5702 and 5703 sufficiently small to enable the differential-mode signal components to be transferred to the output terminals OUT1 and OUT2 without being grounded. The connection point 5707 between the capacitors 5704 and 5705 is not a virtual ground point with respect to common-mode signal components. The capacitor 5704 and part of the inductor 5706 and the capacitor 5705 and part of the inductor 5706 form series resonance circuits at a predetermined frequency. In the phase-shifting circuit 5703, if the capacitance of the capacitors is C and the inductance of the inductor is L/2, the resonance frequency of the series resonance circuits with respect to common-mode signal components is $f_T=1/(2\pi \times (LC)^{1/2})$. The common-mode signal components in this frequency band are shorted to the ground plane.

Figure 40A:
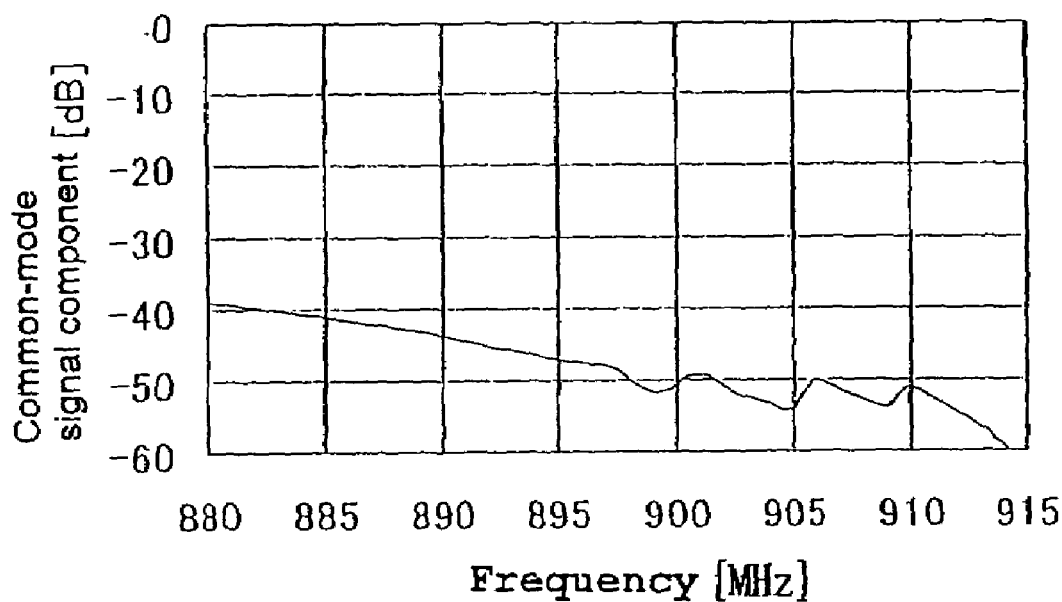
FIG. 40(*a*) is a diagram showing a characteristic of common-mode signal components in the balanced high-frequency filter in embodiment 13 of the present invention.
Figure 40B:
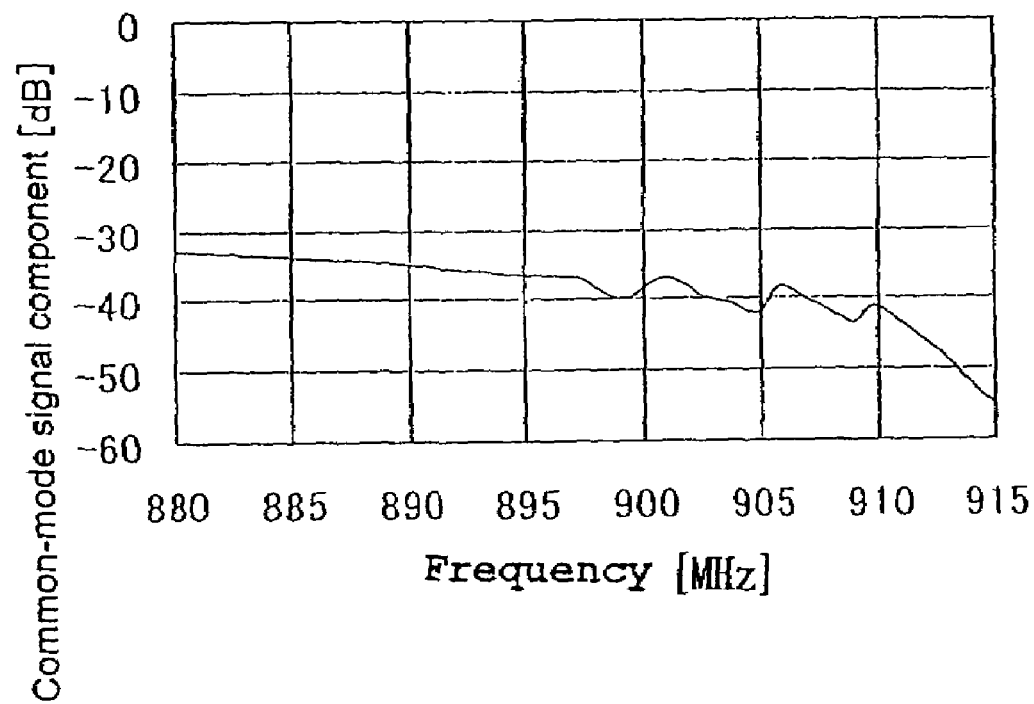
Figure 49:
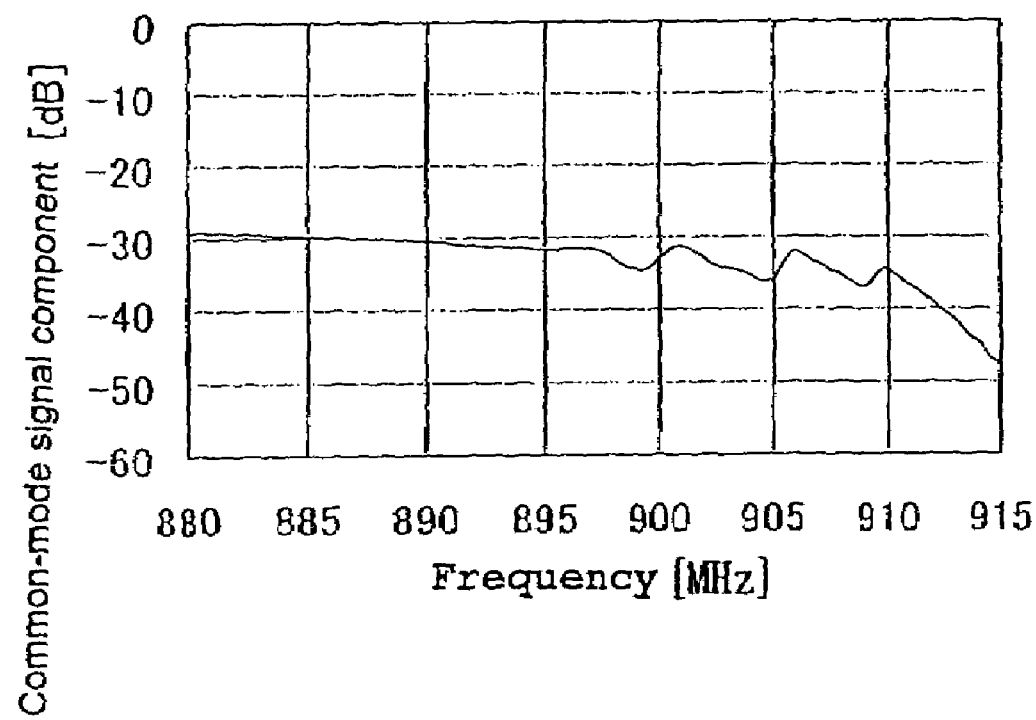
FIG. 49 is a diagram showing a characteristic of common-mode signal components in the balanced high-frequency device shown in FIG. 30.

FIG. 40(a) shows a characteristic of common-mode signal components in a transmission frequency band in a case where the resonance frequency $f_T$ of the series resonance circuits is set to 904 MHz in the transmission frequency band, and where the surface acoustic wave filter 3001 having the configuration shown in FIG. 30 is used as the balanced high-frequency element. FIG. 49 shows a characteristic of common-mode signal components in the transmission frequency band (880 to 915 MHz) in the surface acoustic wave filter 3001. The characteristic of common-mode signal components is referred to herein as leakage of common-mode signal components from the input side to the output side of the balanced high-frequency element. According to FIG. 40(a), the characteristic of common-mode signal components is markedly reduced relative to the characteristic shown in FIG. 49. FIG. 40(b) shows a characteristic of common-mode signal components in a transmission frequency band in a case where the resonance frequency of the series resonance circuits is set to 951 MHz in a reception frequency band. Thus, the resonance frequency of the series resonance circuits is set within a transmission frequency band to improve the characteristic of common-mode signal components in comparison with that in the conventional art.

Figure 41A:
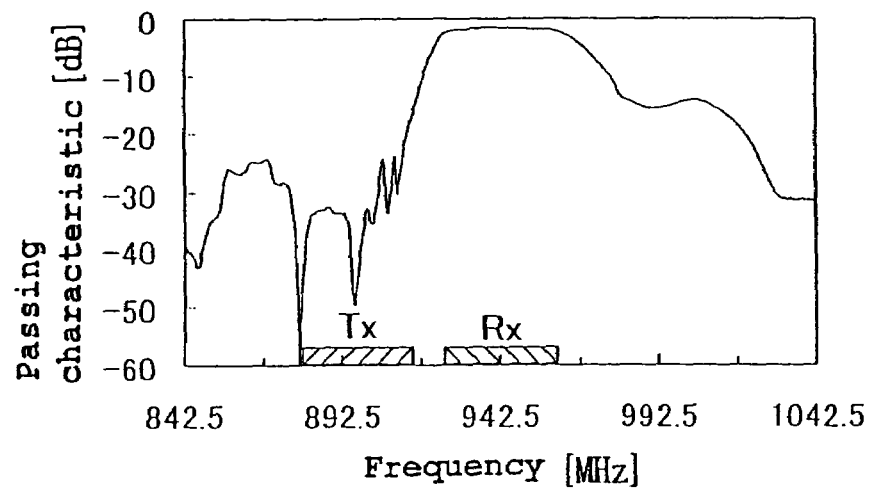
FIG. 41(*a*) is a diagram showing a passing characteristic of the balanced high-frequency filter in embodiment 13 of the present invention.
Figure 41B:
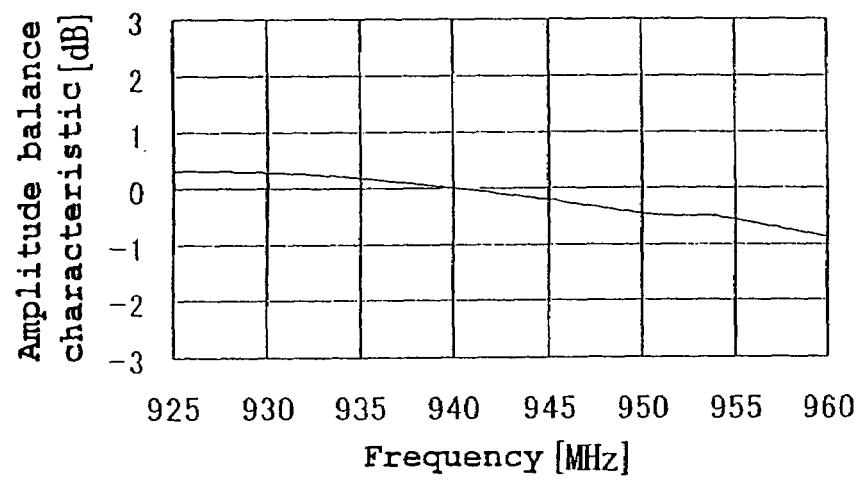
Figure 41C:
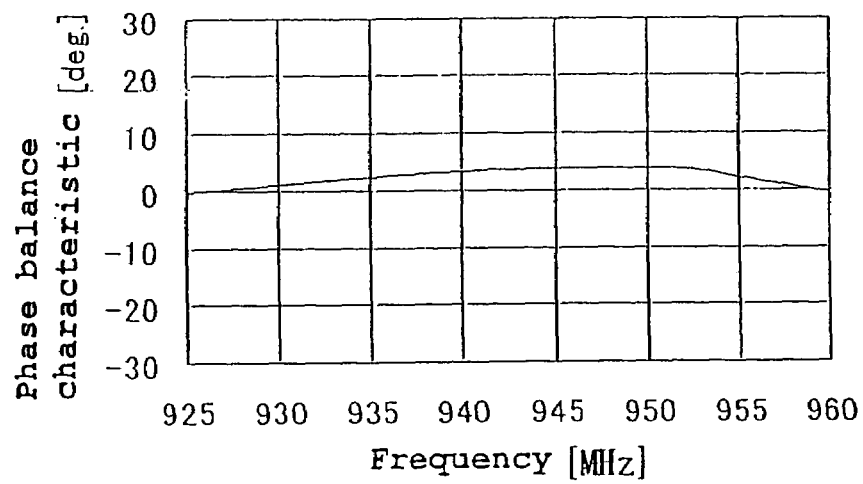

FIGS. 41(a), 41(b), and 41(c) show characteristics of the balanced high-frequency filter 5701. FIG. 41(a) shows a passing characteristic, FIG. 41(b) an amplitude balance characteristic in a pass band, FIG. 41(c) a phase balance characteristic in the pass band. In FIG. 41(a), Tx is the transmission frequency band used in the GSM system and Rx is the reception frequency band used in the GSM system. The passing characteristic is a characteristic of differential-mode signal components in a balanced terminal, and the pass band is the reception frequency band Rx. According to FIGS. 41(b) and 41(c), the balance characteristics are markedly improved in comparison with the characteristics in the case of the conventional art shown in FIG. 32(a) to 32(c).

In the balanced high-frequency filter of the present invention arranged as described above, the phase-shifting circuit is constituted by three impedance elements and the frequency of the series resonance circuits formed with respect to common-mode signal components is set within a transmission frequency band, thereby reducing common-mode signal components in the transmission frequency band. Thus, a balanced high-frequency filter having improved characteristics in a pass band and outside the pass band can be realized.

Figure 42:
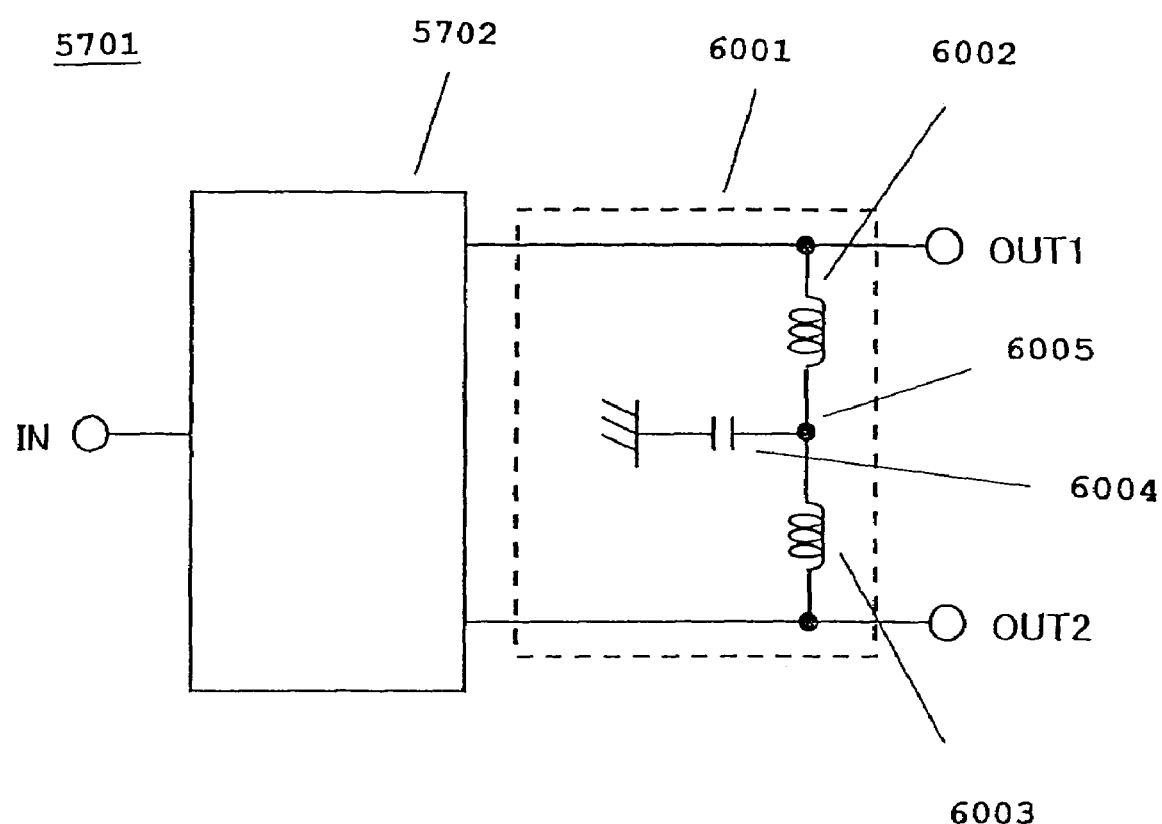
FIG. 42 is a diagram showing another configuration of phase-shifting circuit in embodiment 13 of the present invention.

The phase-shifting circuit in this embodiment may alternatively have a circuit configuration such as shown in FIG. 42. Referring to FIG. 42, a phase-shifting circuit 6001 is constituted by inductors 6002 and 6003 and a capacitor 6004 provided as impedance elements. The inductors 6002 and 6003 are connected in series between the output terminals. A connection point 6005 between the inductors 6002 and 6003 is grounded through the capacitor 6004. Thus, the phase-shifting circuit 6001 is connected between the output terminals.

In the phase-shifting circuit shown in FIG. 42, the connection point 6005 between the inductors 6002 and 6003 is a virtual ground point with respect to differential-mode signal components corresponding to the passing characteristic of the balanced high-frequency filter. Therefore, the impedance to the ground plane can be increased by setting the value of the inductors 6002 and 6003 sufficiently large to enable the differential-mode signal components to be transferred to the output terminals OUT1 and OUT2 without being grounded. The connection point 6005 between the inductors 6002 and 6003 is not a virtual ground point with respect to common-mode signal components. The inductor 6002 and part of the capacitor 6004 and the inductor 6002 and part of the capacitor 6004 form series resonance circuits at a predetermined frequency. In the phase-shifting circuit 6001, if the inductance of the inductors is L and the capacitance of the capacitor is 2×C, the resonance frequency of the series resonance circuits with respect to common-mode signal components is $f_r 32\ 1/(2\pi \times (LC)^{1/2})$. The common-mode signal components in this frequency band are shorted to the ground plane.

Figure 43A:
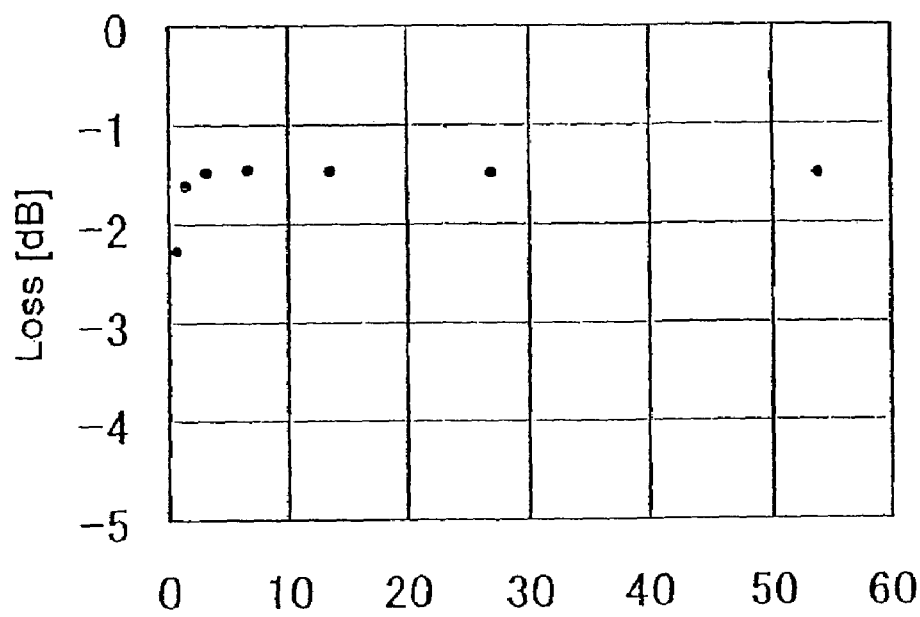
FIG. 43(*a*) is a diagram showing the relationship between loss and a normalized impedance in the case of use of the phase-shifting circuit shown in FIG. 39.

If in the phase-shifting circuit 5703 the capacitance of the capacitors is increased, the impedance with respect to differential-mode signal components is reduced and the differential-mode signal components are shorted. A filter loss results in such a case. The passing characteristic of the filter when the impedance of the capacitors 5704 and 5705 was changed was evaluated. FIG. 43(a) shows the value of loss with respect to a normalized impedance, obtained by dividing the impedance of the capacitors 5702 and 5703 in the reception frequency band by the characteristic impedance at the terminal. In this embodiment, the characteristic impedance of the balanced output terminals is 50Ω. Therefore the characteristic impedance of each terminal is 25Ω. As shown in FIG. 43(a), the loss is exacerbated in a region where the normalized impedance is lower than 3. The characteristics shown in FIGS. 40 and 41 are characteristics when the normalized impedance is 6.8.

Figure 43B:
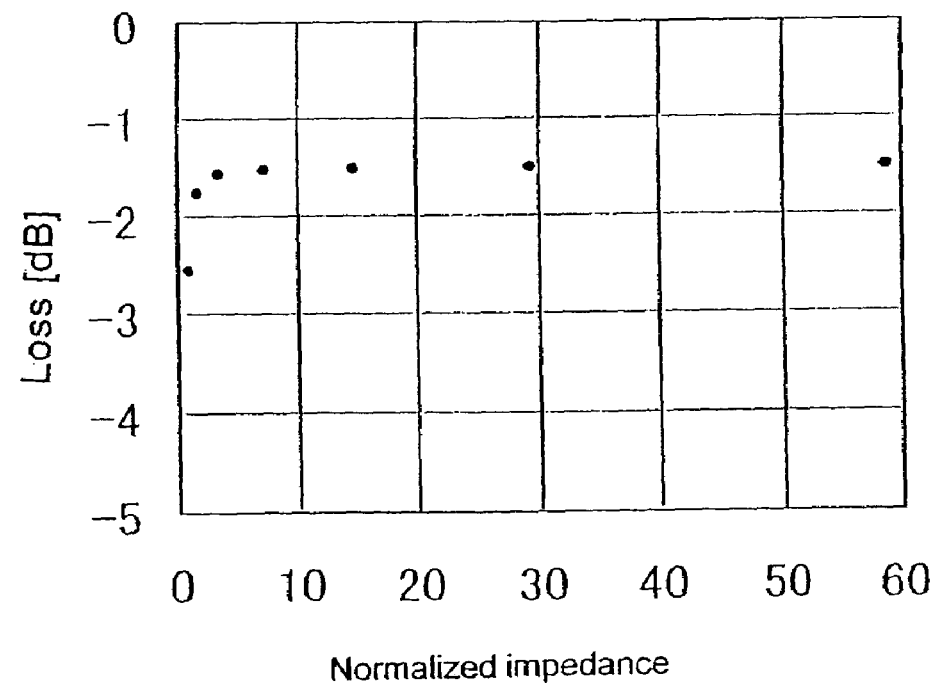

If in the phase-shifting circuit 6001 the inductance of the inductors is decreased, the impedance with respect to differential-mode signal components is reduced and the differential-mode signal components are shorted. A filter loss results in such a case. The passing characteristic of the filter when the impedance of the inductors 6002 and 6003 was changed was evaluated. FIG. 43(b) shows the value of loss with respect to a normalized impedance, obtained by dividing the impedance of the inductors 6002 and 6003 in the reception frequency band by the characteristic impedance at the terminal. In this embodiment, the characteristic impedance of the balanced output terminals is 50Ω. Therefore the characteristic impedance of each terminal is 25Ω. As shown in FIG. 43(b), the loss is exacerbated in a region where the normalized impedance is lower than 3.

From the above, it is preferable to set the normalized impedance in the pass band to 3 or higher.

While this embodiment has been described by way of example with respect to a case where the balanced high-frequency element constituting the balanced high-frequency filter is a surface acoustic filter, this arrangement is not exclusively used. According to the present invention, the same effect can also be obtained by using any balanced high-frequency element if common-mode signal components in a transmission frequency band output from a balanced high-frequency element are reduced by a phase-shifting circuit, and if the balanced high-frequency element has balanced terminals. For example, the balanced high-frequency element may be a filter using an FBAR.

The phase-shifting circuit in this embodiment may also include a matching circuit with respect to differential-mode signal components.

Also, the phase-shifting circuit in this embodiment may be applied to an arrangement such as shown in FIG. 38. Also in such a case, the same effect of reducing common-mode signal components to improve the characteristics of a low-noise amplifier or a mixer is obtained and a communication apparatus having improved sensitivity can be implemented.

The first frequency band of the present invention corresponds to the reception frequency band in this embodiment, and the second frequency band of the present invention corresponds to the transmission frequency band in this embodiment. Also, in this embodiment, the first frequency band is a pass band, while the second frequency band is an attenuation band.

(Embodiment 14)

The configuration of an antenna duplexer is described below with reference to the drawings.

Figure 44:
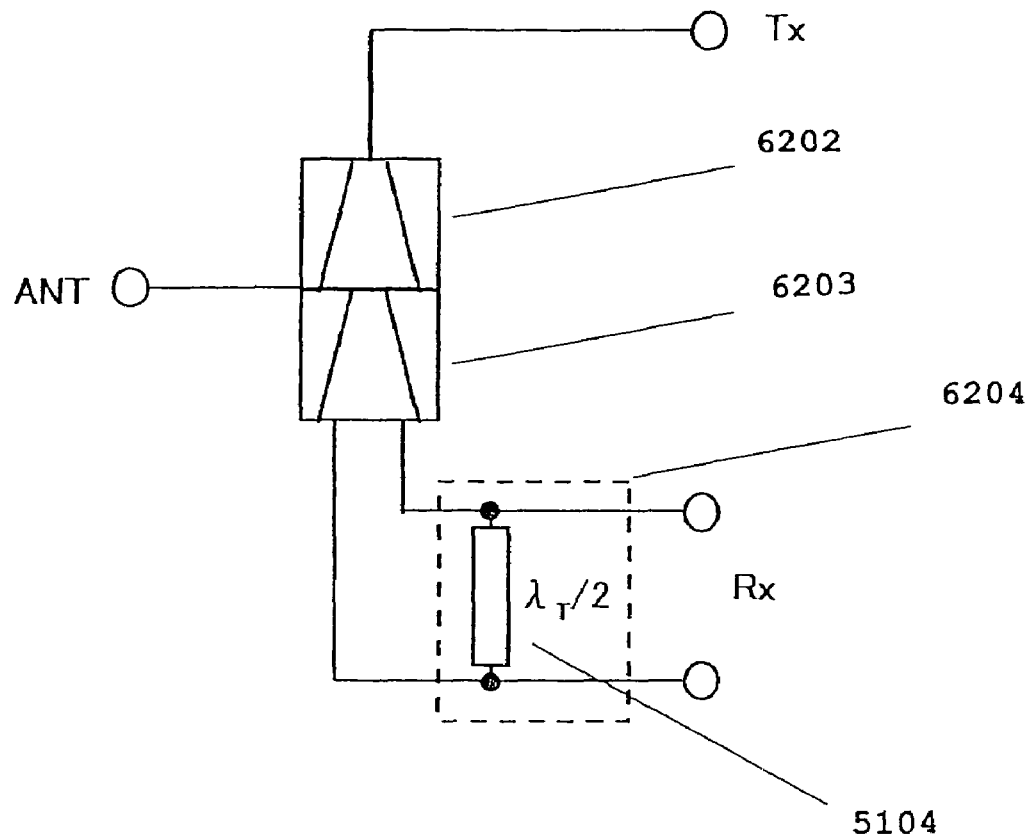
FIG. 44 is a diagram showing the configuration of an antenna duplexer in embodiment 14 of the present invention.

FIG. 44 is a diagram showing the configuration of an antenna duplexer in embodiment 14 of the present invention. Referring to FIG. 44, the antenna duplexer 6201 is constituted by a transmitting filter 6202, a receiving filter 6203 and a phase-shifting circuit 6204. The receiving filter 6203 has balanced terminals on the output side. The phase-shifting circuit 6204 is connected between the balanced terminals. The phase-shifting circuit 6204 has the same configuration as that shown in FIG. 33. The phase-shifting circuit 6204 is constituted by a transmission line 5104 and placed between the output terminals. The length of the transmission line 5104 is $\lambda_T/2$ ($\lambda_T$ is the wavelength at a frequency in a transmission frequency band).

The antenna duplexer of the present invention arranged as described above is capable of reducing the amount of leakage of common-mode signal components in a transmission frequency band from the receiving filter 6203.

While this embodiment has been described with respect to a case where one transmission line is provided as a phase-shifting circuit, a combination of a plurality of transmission lines may be used.

Figure 45:
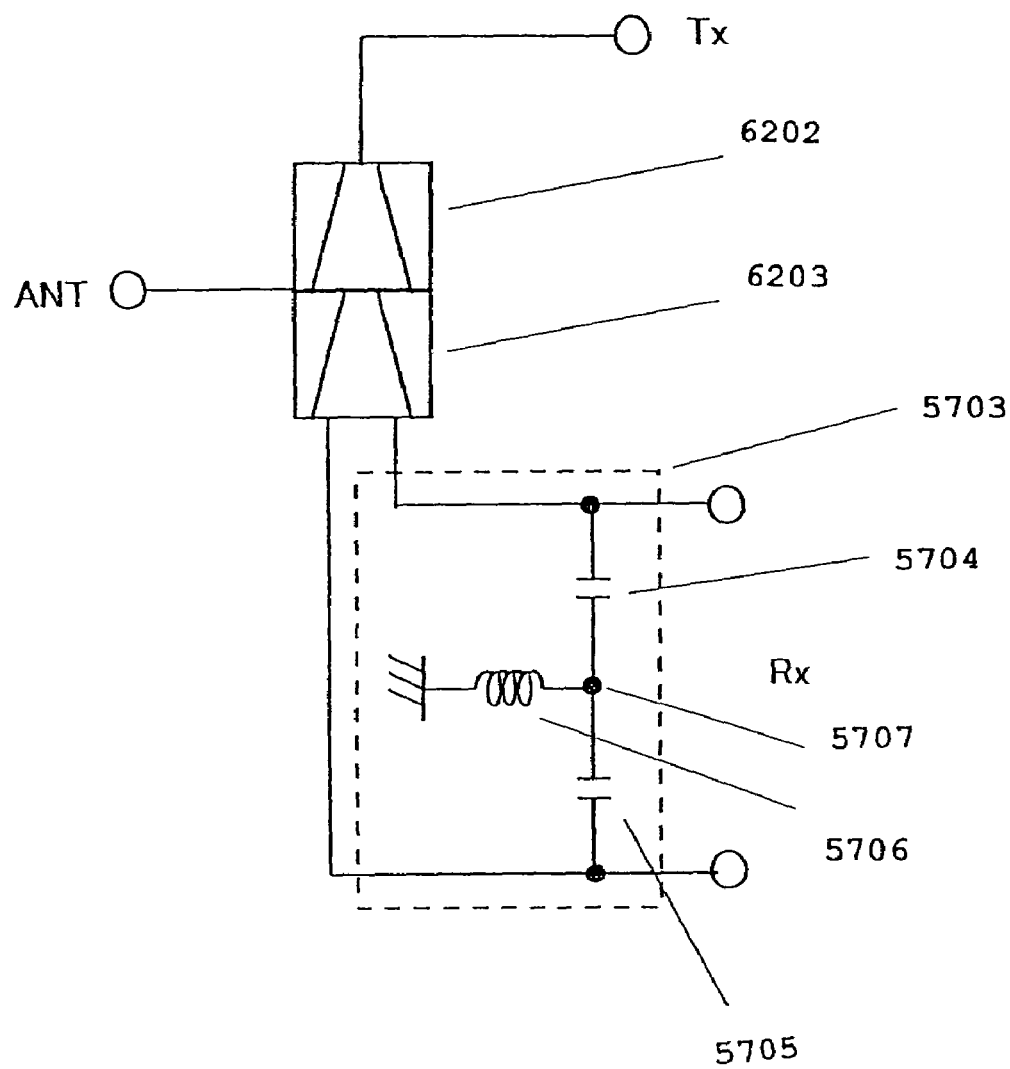
FIG. 45 is a diagram showing another configuration of antenna duplexer in embodiment 14 of the present invention.

A phase-shifting circuit 5703 having the same configuration as that shown in FIG. 39 may be used as the phase-shifting circuit 6204, as shown in FIG. 45. Also in such a case, the amount of leakage of common-mode signal components in a transmission frequency band from the receiving filter 6203 can be reduced by setting within the transmission frequency band the resonance frequency of the series resonance circuits formed in the phase-shifting circuit 5703. The phase-shifting circuit 6001 shown in FIG. 42 may also be used as the phase-shifting circuit 6204. In a case where the phase-shifting circuit is formed by using impedance elements as in the phase-shifting circuit 6001, it is preferable to set the normalized impedance to the virtual ground plane with respect to differential-mode signal components to 3 or higher.

In this embodiment, the configurations of the transmitting filter 6202 and the receiving filter 6203 are not particularly specified. A surface acoustic wave filter or an FBAR may be used for these filters.

The phase-shifting circuit in this embodiment may include a matching circuit with respect to differential-mode signal components.

The first frequency band of the present invention corresponds to the reception frequency band in this embodiment, and the second frequency band of the present invention corresponds to the transmission frequency band in this embodiment. Also, in this embodiment, the first frequency band is a desired frequency band, while the second frequency band is the frequency band of interference waves.

If the antenna duplexer is connected to a low-noise amplifier, saturation and distortion in the low-noise amplifier due to common-mode signal components in a transmission frequency band can be limited and a communication apparatus having higher sensitivity can be implemented.

(Embodiment 15)

The configuration of a balanced high-frequency circuit of the present invention is described below with reference to the drawings.

Figure 46A:
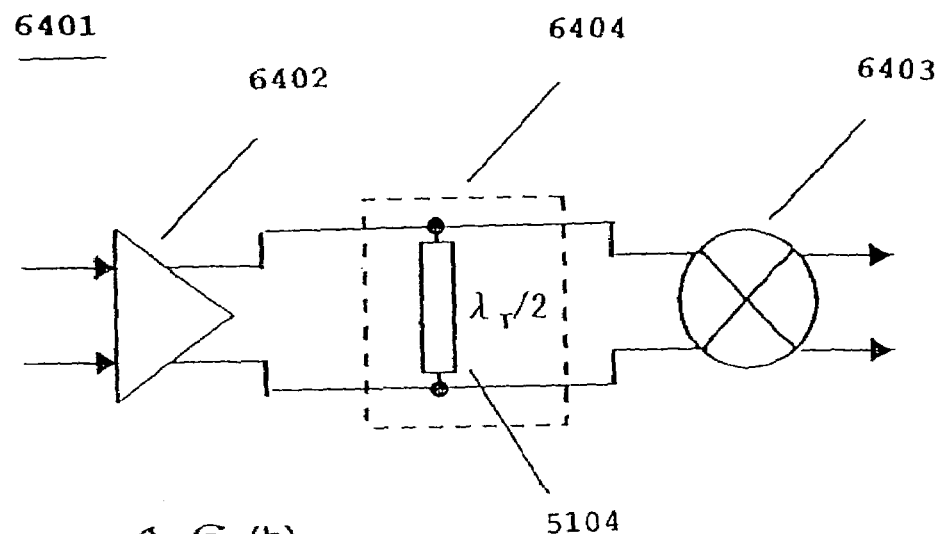
FIG. 46(*a*) is a diagram showing the configuration of a balanced high-frequency circuit in embodiment 15 of the present invention.

FIG. 46 is a diagram showing the configuration of a balanced high-frequency circuit in embodiment 15 of the present invention. Referring to FIG. 46, the balanced high-frequency circuit 6401 is constituted by a low-noise amplifier 6402, a mixer 6403 and a phase-shifting circuit 6404. The low-noise amplifier 6402 has balanced terminals on the output side. The mixer 6403 connected to the low-noise amplifier 6402 has balanced terminals on the input side. The phase-shifting circuit 6404 is connected between these balanced terminals. The phase-shifting circuit 6404 has the same configuration as that shown in FIG. 33. The phase-shifting circuit 6404 is constituted by a transmission line 5104 and placed between the output terminals. The length of the transmission line 5104 is $\lambda_T/2$ ($\lambda_T$ is the wavelength at a frequency in a transmission frequency band).

The balanced high-frequency circuit of the present invention arranged as described above is capable of reducing the amount of leakage of common-mode signal components in a transmission frequency band from the low-noise amplifier 6402 and limiting saturation of common-mode signal components in the transmission frequency band in the mixer 6403, and a communication apparatus having higher sensitivity can be implemented.

While this embodiment has been described with respect to a case where one transmission line is provided as a phase-shifting circuit, a combination of a plurality of transmission lines may be used.

Figure 46B:
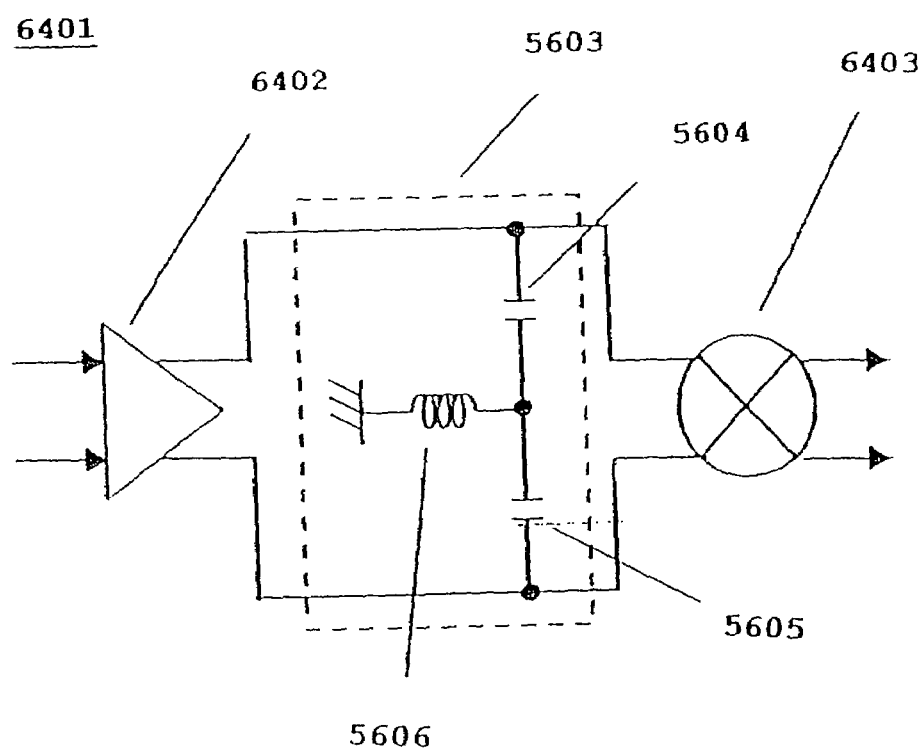

A phase-shifting circuit 5703 having the same configuration as that shown in FIG. 39 may be used as the phase-shifting circuit 6402, as shown in FIG. 46(b). Also in such a case, the amount of leakage of common-mode signal components in a transmission frequency band from the low-noise amplifier 6402 can be reduced by setting within the transmission frequency band the resonance frequency of the series resonance circuits formed in the phase-shifting circuit 5703. The phase-shifting circuit 6001 shown in FIG. 42 may also be used as the phase-shifting circuit 6402. In a case where the phase-shifting circuit is formed by using impedance elements as in the phase-shifting circuit 6001, it is preferable to set the normalized impedance to the virtual ground plane with respect to differential-mode signal components to 3 or higher.

The phase-shifting circuit in this embodiment may include a matching circuit for matching with the low-noise amplifier and the mixer with respect to differential-mode signal components.

The first frequency band of the present invention corresponds to the reception frequency band in this embodiment, and the second frequency band of the present invention corresponds to the transmission frequency band in this embodiment. Also, in this embodiment, the first frequency band is a desired frequency band, while the second frequency band is the frequency band of interference waves.

(Embodiment 16)

The configuration of a balanced high-frequency circuit of the present invention is described below with reference to the drawings.

Figure 47:
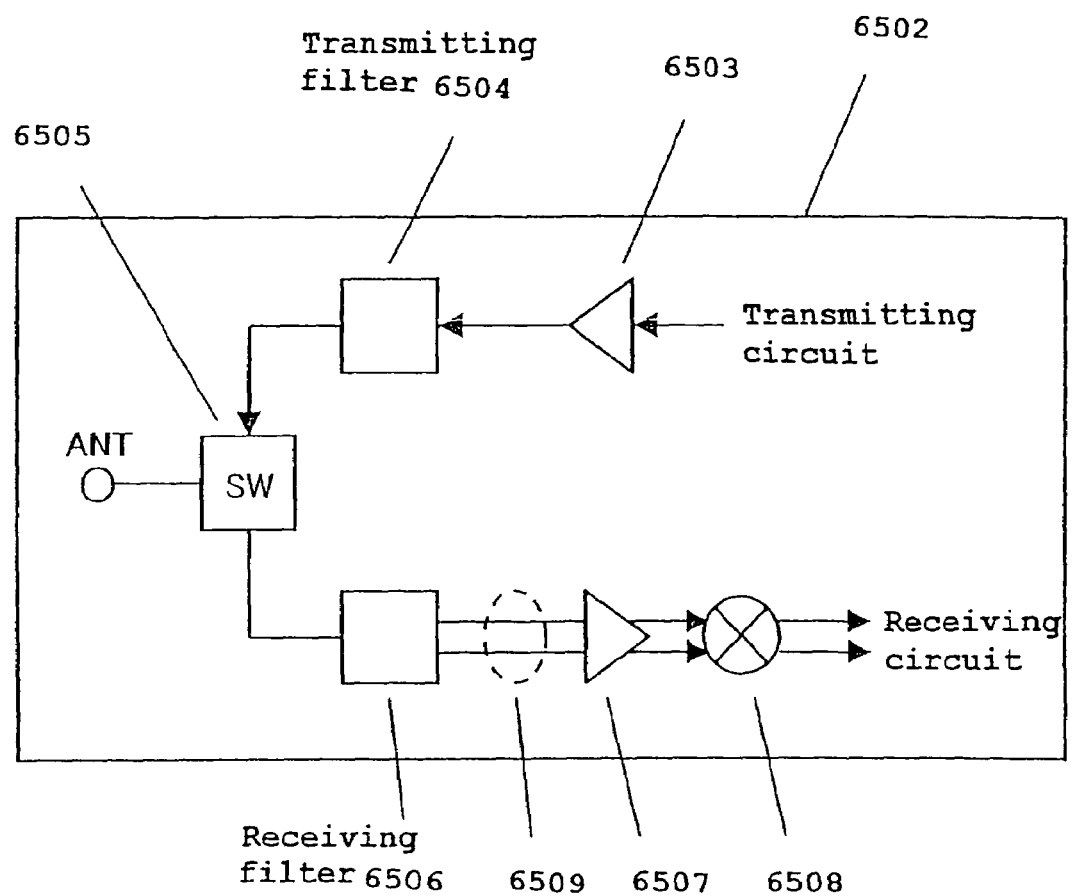
FIG. 47 is a diagram showing the configuration of a balanced high-frequency circuit in embodiment 16 of the present invention.

FIG. 47 is a diagram showing the configuration of a balanced high-frequency circuit in embodiment 16 of the present invention. Referring to FIG. 47, the balanced high-frequency circuit 6501 is constituted by a transmitting amplifier 6503, a transmitting filter 6504, a switch 6505, a receiving filter 6506, a low-noise amplifier 6507, a mixer 6508 and a phase-shifting circuit 6509, implemented on a circuit board 6502. A signal output from the transmitting circuit to be transmitted is output to an antenna terminal ANT via the transmitting amplifier 6502, the transmitting filter 6503 and the switch 6504. The balanced high-frequency circuit 6501 thus arranged is used mainly for a communication device in a time division transmitting and receiving system. A received signal input through the antenna terminal ANT is input to the receiving circuit via the switch 6504, the receiving filter 6506, the receiving amplifier 6507 and the mixer 6508. The receiving amplifier 6507 is of a balanced type while the switch 6504 is of an unbalanced type. Therefore the receiving filter 6506 is arranged to have unbalanced-balanced input/output terminals. The phase-shifting circuit 6509 has the same configuration as that shown in FIG. 33. The phase-shifting circuit 6509 is constituted by a transmission line 5104 and placed between the output terminals. The length of the transmission line 5104 is $\lambda_T/2$ ($\lambda_T$ is the wavelength at a frequency in a transmission frequency band).

The balanced high-frequency circuit of the present invention arranged as described above is capable of reducing the amount of leakage of common-mode signal components in a transmission frequency band from the low-noise amplifier 6402 and limiting saturation of common-mode signal components in the transmission frequency band in the low-noise amplifier 6507.

While this embodiment has been described with respect to a case where one transmission line is provided as a phase-shifting circuit, a combination of a plurality of transmission lines may be used.

A phase-shifting circuit 5703 having the same configuration as that shown in FIG. 39 may be used as the phase-shifting circuit 6509. Also in such a case, the amount of leakage of common-mode signal components in a transmission frequency band from the low-noise amplifier 6502 can be reduced by setting within the transmission frequency band the resonance frequency of the series resonance circuits formed in the phase-shifting circuit 5703. The phase-shifting circuit 6001 shown in FIG. 42 may also be used as the phase-shifting circuit 6509. In a case where the phase-shifting circuit is formed by using impedance elements as in the phase-shifting circuit 6001, it is preferable to set the normalized impedance to the virtual ground plane with respect to differential-mode signal components to 3 or higher.

While the phase-shifting circuit is placed on the input side of the low-noise amplifier 6506 in this embodiment, it may alternatively be placed between the low-noise amplifier 6506 and the mixer 6507 to further reduce the amount of leakage of common-mode signal components in the transmission frequency band and limit saturation of the mixer.

The phase-shifting circuit in this embodiment may include a matching circuit with respect to differential-mode signal components.

Figure 48:
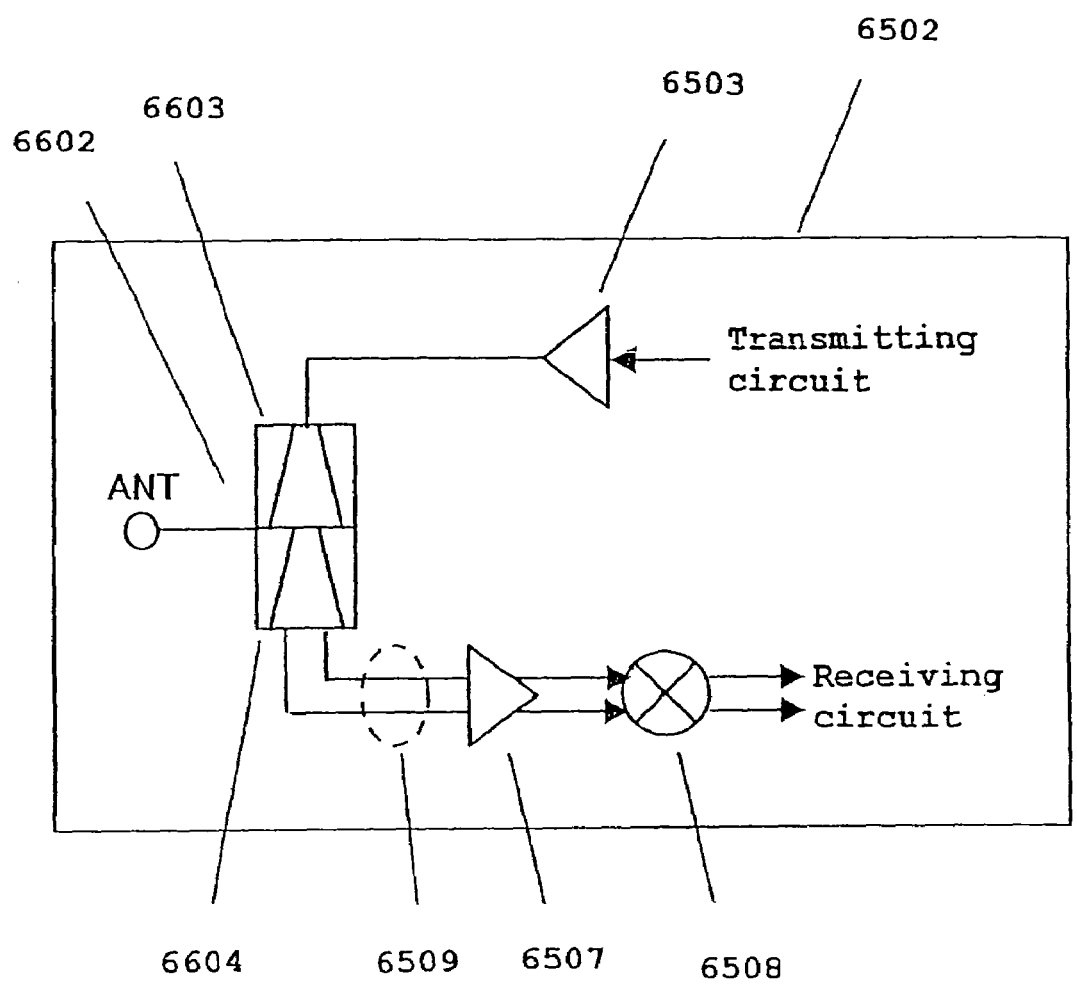
FIG. 48 is a diagram showing another configuration of balanced high-frequency circuit in embodiment 16 of the present invention.

While the balanced high-frequency circuit 6501 using the switch 6505 as a means of switching between transmission and reception has been described, a balanced high-frequency circuit 6601 using an antenna duplexer 6602 as shown in FIG. 48 may be provided. The balanced high-frequency circuit 6601 using the antenna duplexer 6602 constituted by a transmitting filter 6603 and a receiving filter 6604 is used mainly for a communication apparatus in a system capable of simultaneously performing transmitting and receiving.

While the phase-shifting circuit of the present invention is formed on the circuit board for the balanced high-frequency circuit, it may alternatively be incorporated in the receiving filter 6506, the low-noise amplifier 6507, the mixer 6508 or the antenna duplexer 6602.

The configurations of the transmitting filter 6504 and the receiving filter 6506 and the configurations of the transmitting filter 6603 and the receiving filter 6604 constituting the antenna duplexer 6602 are not particularly specified. A surface acoustic wave filter or an FBAR may be used for each of these filters.

The phase-shifting circuit in this embodiment may include a matching circuit with respect to differential-mode signal components.

The first frequency band of the present invention corresponds to the reception frequency band in this embodiment, and the second frequency band of the present invention corresponds to the transmission frequency band in this embodiment. Also, in this embodiment, the first frequency band is a desired frequency band, while the second frequency band is the frequency band of interference waves.

In this embodiment, if the balanced high-frequency circuit is applied to a communication apparatus, the communication apparatus can be implemented so as to be capable of suppressing transmission interference waves due to common-mode signal components and have higher sensitivity.

While in this embodiment the length of the transmission line provided as a phase-shifting circuit is $\lambda_T/2$ ($\lambda_T$ is the wavelength at a frequency in a transmission frequency band), a setting of a resonance frequency in a transmission frequency band may suffice and a slight error in setting the length of the transmission line may be tolerated.

Each of the balanced high-frequency filter, the antenna duplexer and the balanced high-frequency circuit in accordance with the present invention is useful as a high-frequency device capable of reducing common-mode signal components, and can be applied to use in a high-frequency module or a communication device.

According to the present invention, a balanced high-frequency filter and an antenna duplexer in which common-mode signal components in a transmission frequency band are reduced can be implemented. Also, a balanced high-frequency circuit and a communication apparatus using such a balanced high-frequency filter or antenna duplexer can be provided. A balanced high-frequency circuit in which common-mode signal components in a transmission frequency band are reduced can be provided.

What is claimed is:

1. A balanced high-frequency filter comprising:
   a balanced high-frequency element having at least one balanced terminal; and
   a phase-shifting circuit,
   wherein the phase-shifting circuit is a series resonance circuit which is electrically connected between the balanced terminals and which resonates with common-mode signal components at a predetermined frequency;
   a resonance frequency of the series resonance circuit is set in a second frequency band;
   a first frequency band is a pass band of the balanced high-frequency element; and
   the second frequency band is an attenuation band of the balanced high-frequency element.

2. The balanced high-frequency filter according to claim 1, wherein the first frequency band is a reception frequency band, and the second frequency band is a transmission frequency band.

3. The balanced high-frequency filter according to claim 1 or 2, wherein the phase-shifting circuit has a transmission line which has a length equal to about ½ of a wavelength in the second frequency band; and
   the phase-shifting circuit is connected between the balanced terminals.

4. The balanced high-frequency filter according to claim 3, wherein the phase-shifting circuit has at least two transmission lines;
   one of the transmission lines has a length equal to about ½ of a wavelength in the second frequency band;
   the other of the transmission lines differs in length from said one of the transmission lines; and
   the phase-shifting circuit is connected between the balanced terminals.

5. The balanced high-frequency filter according to claim 1 or 2, wherein the phase-shifting circuit has at least first, second and third impedance elements;
   the first impedance element and the second impedance element are connected in series between the balanced terminals;
   a connection point between the first impedance element and the second impedance element is grounded through the third impedance element;
   the first impedance element and the third impedance element form a series resonance circuit; and
   the second impedance element and the third impedance element form a series resonance circuit.

6. The balanced high-frequency filter according to claim 5, wherein each of the first and second impedance elements is a capacitor, and the third impedance element is an inductor.

7. The balanced high-frequency filter according to claim 5, wherein each of the first and second impedance elements is an inductor, and the third impedance element is a capacitor.

8. The balanced high-frequency filter according to claim 6, wherein the impedance of each of the first and second impedance elements in the first frequency band is set so that a value of the first or second impedance element normalized on a characteristic impedance value of one of the balanced terminals is equal to or larger than 3.

9. The balanced high-frequency filter according to claim 1 or 2, wherein the balanced high-frequency element is constituted by a surface acoustic wave filter.

10. The balanced high-frequency filter according to claim 1 or 2, wherein the balanced high-frequency element is constituted by a filter using an FBAR.

11. The balanced high-frequency filter according to claim 1 or 2, wherein the balanced high-frequency filter is connected to an input side of a low-noise amplifier having balanced terminals.

12. The balanced high-frequency filter according to claim 1 or 2, wherein the balanced high-frequency filter is connected to an input side of a mixer having balanced terminals.

13. An antenna duplexer comprising the balanced high-frequency filter according to claim 1 or 2.

14. An antenna duplexer according to claim 13, wherein the balanced high-frequency filter is a receiving filter in the antenna duplexer;
the first frequency band is a reception frequency band in the antenna duplexer; and
the second frequency band is a transmission frequency band in the antenna duplexer.

15. An antenna duplexer according to claim 14, wherein the antenna duplexer is connected to an input side of a low-noise amplifier having balanced terminals.

16. A balanced high-frequency circuit comprising:
a low-noise amplifier having balanced terminals;
a mixer having balanced terminals; and
a phase-shifting circuit,
wherein the phase-shifting circuit is a series resonance circuit which is electrically connected between the balanced terminals connecting the low-noise amplifier and the mixer to each other, and which resonates with common-mode signal components at a predetermined frequency;
a resonance frequency of the series resonance circuit is set in a second frequency band;
a first frequency band is the frequency band of desired waves; and
the second frequency band is the frequency band of interference waves.

17. The balanced high-frequency circuit according to claim 16, wherein the first frequency band is a reception frequency band, and the second frequency band is a transmission frequency band.

18. The balanced high-frequency circuit according to claim 16 or 17, wherein the phase-shifting circuit has a transmission line which has a length equal to about ½ of a wavelength in the second frequency band; and
the phase-shifting circuit is connected between the balanced terminals.

19. The balanced high-frequency circuit according to claim 16 or 17, wherein the phase-shifting circuit has at least first, second and third impedance elements;
the first impedance element and the second impedance element are connected in series between the balanced terminals;
a connection point between the first impedance element and the second impedance element is grounded through the third impedance element;
the first impedance element and the third impedance element form a series resonance circuit; and
the second impedance element and the third impedance element form a series resonance circuit.

20. The balanced high-frequency circuit according to claim 19, wherein each of the first and second impedance elements is a capacitor, and the third impedance element is an inductor.

21. The balanced high-frequency circuit according to claim 19, wherein each of the first and second impedance elements is an inductor, and the third impedance element is a capacitor.

22. The balanced high-frequency circuit according to claim 20, wherein the impedance of each of the first and second impedance elements in the first frequency band is set so that a value of the first or second impedance element normalized on a characteristic impedance value of one of the balanced terminals is equal to or larger than 3.

23. A balanced high-frequency circuit comprising:
a circuit board having balanced lines; and
a phase-shifting circuit,
wherein the phase-shifting circuit is mounted on the circuit board;
the phase-shifting circuit is a series resonance circuit which is electrically connected between the balanced terminals, and which resonates with common-mode signal components at a predetermined frequency;
a resonance frequency of the series resonance circuit is set in a second frequency band;
a first frequency band is the frequency band of desired waves; and
the second frequency band is the frequency band of interference waves.

24. The balanced high-frequency circuit according to claim 23, wherein the first frequency band is a reception frequency band, and the second frequency band is a transmission frequency band.

25. The balanced high-frequency circuit according to claim 23 or 24, wherein the phase-shifting circuit has a transmission line, the transmission line has a length equal to about ½ of a wavelength in the first frequency band; and
the phase-shifting circuit is connected between the balanced terminals.

26. The balanced high-frequency circuit according to claim 23 or 24, wherein the phase-shifting circuit has at least first, second and third impedance elements;
the first impedance element and the second impedance element are connected in series between the balanced terminals;
a connection point between the first impedance element and the second impedance element is grounded through the third impedance element;
the first impedance element and the third impedance element form a series resonance circuit; and
the second impedance element and the third impedance element form a series resonance circuit.

27. The balanced high-frequency circuit according to claim 26, wherein each of the first and second impedance elements is a capacitor, and the third impedance element is an inductor.

28. The balanced high-frequency circuit according to claim 26, wherein each of the first and second impedance elements is an inductor, and the third impedance element is a capacitor.

29. The balanced high-frequency circuit according to claim 27, wherein the impedance of each of the first and second impedance elements in the first frequency band is set so that a value of the first or second impedance element normalized on a characteristic impedance value of one of the balanced terminals is equal to or larger than 3.

30. A communication apparatus using the balanced high-frequency filter according to claim 1 or 2.

31. A communication apparatus using the antenna duplexer according to claim 13.

32. A communication apparatus using the antenna duplexer according to claim 14.

33. A communication apparatus using the balanced high-frequency circuit according to claim 16 or 17.

34. A communication apparatus using the balanced high-frequency circuit according to claim 23 or 24.

* * * * *